United States Patent
Ramm et al.

(10) Patent No.: US 6,998,285 B2
(45) Date of Patent: Feb. 14, 2006

(54) CHARGE SEPARATION TYPE HETEROJUNCTION STRUCTURE AND MANUFACTURING METHOD THEREFOR

(75) Inventors: Matthias Ramm, Kanagawa (JP); Masafumi Ata, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/439,359

(22) Filed: May 16, 2003

(65) Prior Publication Data

US 2003/0207573 A1 Nov. 6, 2003

Related U.S. Application Data

(62) Division of application No. 09/597,247, filed on Jun. 20, 2000, now abandoned.

(30) Foreign Application Priority Data

Jun. 25, 1999 (JP) ......................................... P11-179289
Jan. 14, 2000 (JP) ..................................... P2000-005116

(51) Int. Cl.
    *H01L 21/00* (2006.01)

(52) U.S. Cl. .............................. 438/48; 438/75; 257/85
(58) Field of Classification Search .................. 438/48, 438/75, 172
    See application file for complete search history.

(56) References Cited

U.S. PATENT DOCUMENTS

| | | | | |
|---|---|---|---|---|
| 5,331,183 A | * | 7/1994 | Sariciftci et al. | 257/40 |
| 5,454,880 A | * | 10/1995 | Sariciftci et al. | 136/263 |
| 5,919,429 A | | 7/1999 | Tanaka et al. | 423/445 |
| 5,976,477 A | | 11/1999 | Isoda et al. | 423/239.1 |
| 6,017,630 A | | 1/2000 | Tanaka et al. | 428/402 |
| 6,117,617 A | | 9/2000 | Kanayama et al. | 430/296 |

FOREIGN PATENT DOCUMENTS

| | | |
|---|---|---|
| EP | 0829765 | 3/1998 |
| JP | 08-295505 | 11/1996 |
| JP | 09-309712 | 12/1997 |
| JP | 11-157819 | 6/1999 |

OTHER PUBLICATIONS

Rao A. M. et al., Photoinduced Polymerization of Solid C70 Films, *Chemical Physics Letter*, vol. 224, No. ½, pp. 106–112, (Jul. 8, 1994).

Eklund, P.C. et al., Photochemical Transformation of C60 and C70 Films, *Thin Solid Films*, vol. 257, No. 2, pp. 185–203, (Mar. 1, 1995).

Sariciftci N. S. et al., Semiconducting Polymer–Buckminsterfullerene Heterojunctions: Diodes, Photodiodes, and Photovoltaic Cells, *Applied Physics Letters; American Institute of Physics*, vol. 62, No. 6, pp. 585–587, (Feb. 8, 1993).

Sariciftci N. S. et al., Photovoltaic Cells Using Molecular Photoeffect at the Semiconducting Polymer/Buckminsterfullerene Heterojunctions, *Extended Abstracts of the International Conference on Solid State Devices and Materials*, pp. 781–783, (1993).

* cited by examiner

*Primary Examiner*—Thao P. Le
(74) *Attorney, Agent, or Firm*—Sonnenschein, Nath & Rosenthal LLP

(57) ABSTRACT

A charge separation heterojunction structure which uses a fullerene polymer film as a part of its constituent materials and which may be used to produce a solar cellor a light emitting diode superior in durability, physical properties of electrons and economic merits. The heterojunction structure is such a structure in which an electron-donating electrically conductive high-polymer film and an electron-accepting fullerene polymer film are layered between a pair of electrodes at least one of which is light transmitting. In forming the layers, the fullerene polymer film is identified using in particular the Raman and Nexafs methods in combination so that upper layers are formed after identifying the polymer film.

20 Claims, 83 Drawing Sheets

MOLECULAR STRUCTURE OF $C_{60}$

MOLECULAR STRUCTUR OF $C_{60}$

MOLECULAR STRUCTUR OF $C_{70}$ $D_{2h}$- SYMMETRICAL $C_{116}$

[2+2] 1, 2-$(C_{60})_2$ BY CYCLE ADDITION REACTION $C_{120}(b)$ $C_{120}$ (c)

$C_{120}$ (d)

$C_{118}$ $C_{116}$

MOST STABLE INITIAL POLYMER $C_{70}$
STRUCTURE BY [2+2] CYCLOADDITION REACTION

MORE STABLE $C_{136}$ MOLECULAR
STRUCTURE GENERATED IN
STRUCTURE RELAXATION PROCESS

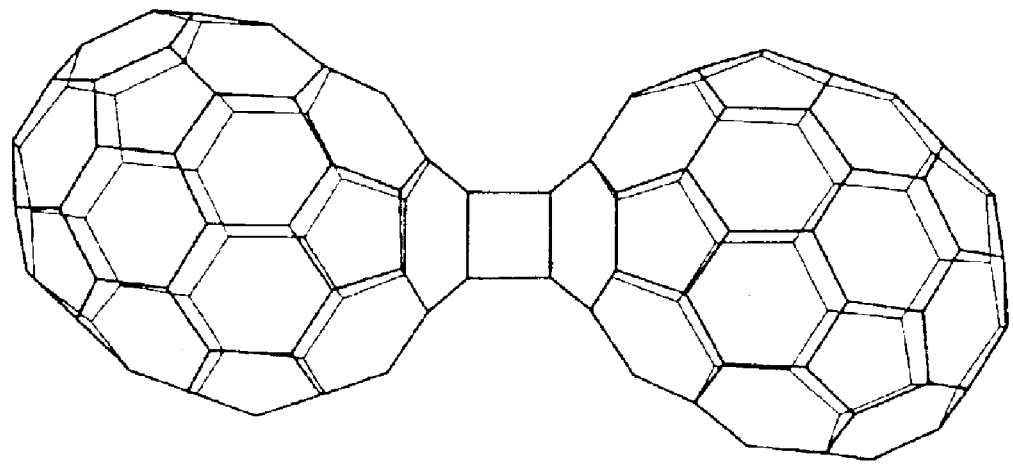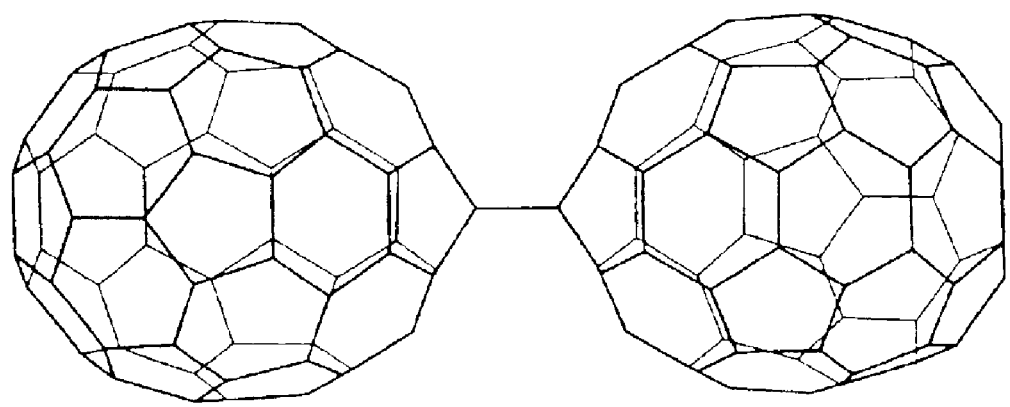
C_{140} (a)
FIG.15

C_140 (b)

C_140 (c)

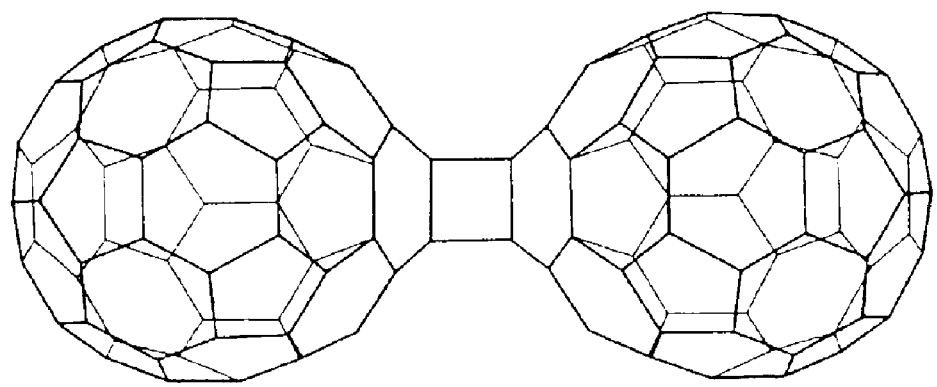
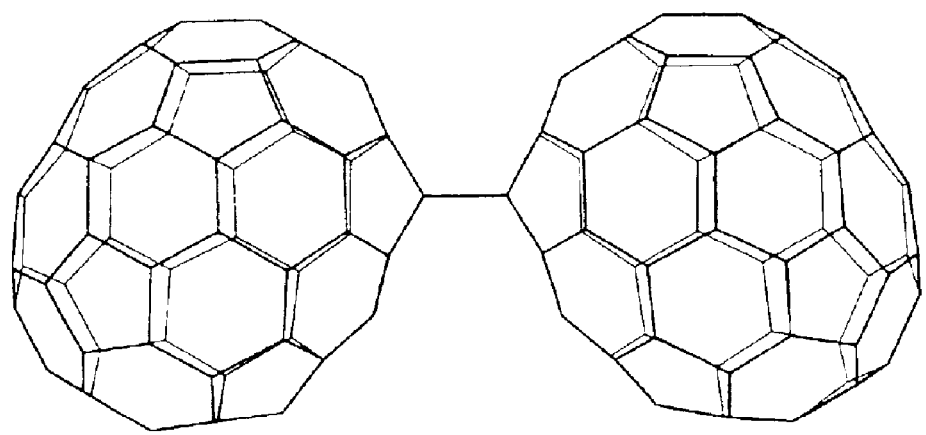
C_{140} (d)
FIG.18

C₁₄₀ (e)

$C_{140}$ (f)

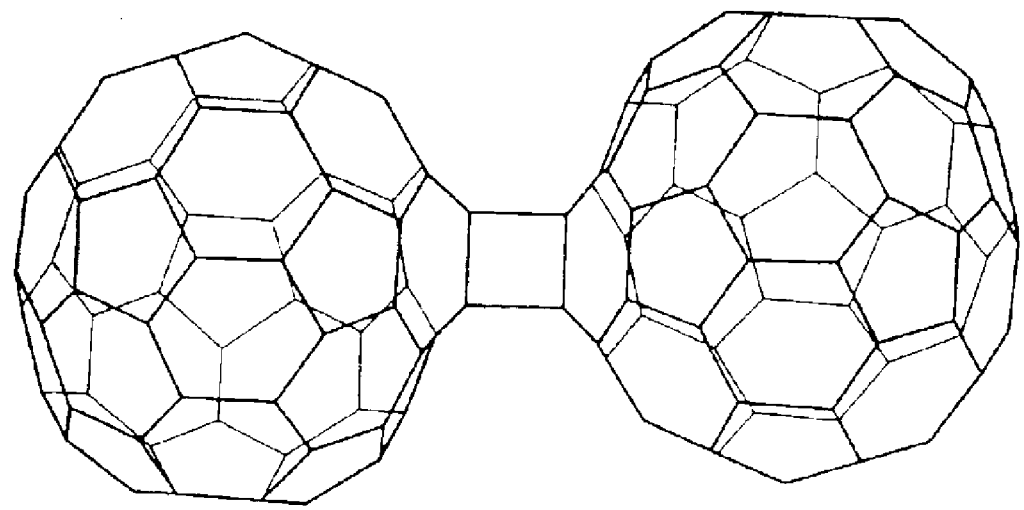
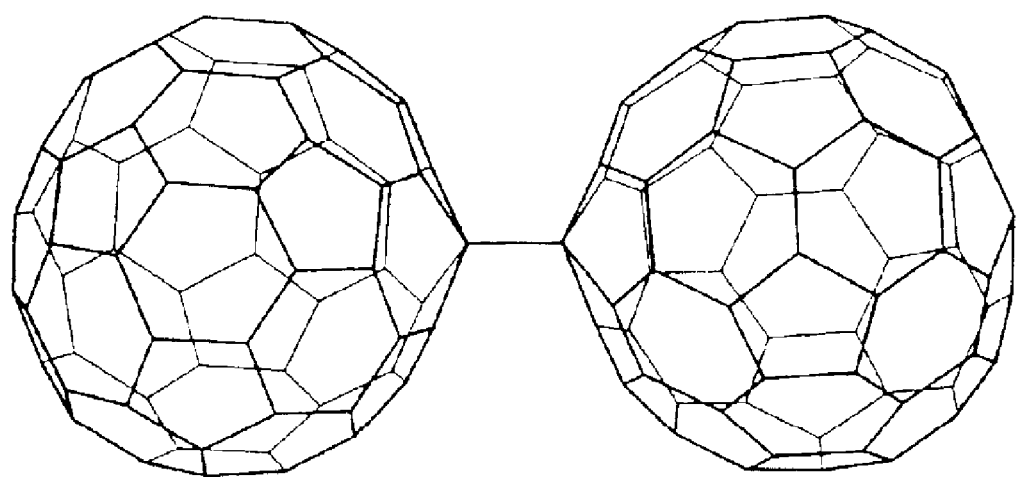
$C_{140}$ (g)
FIG.21

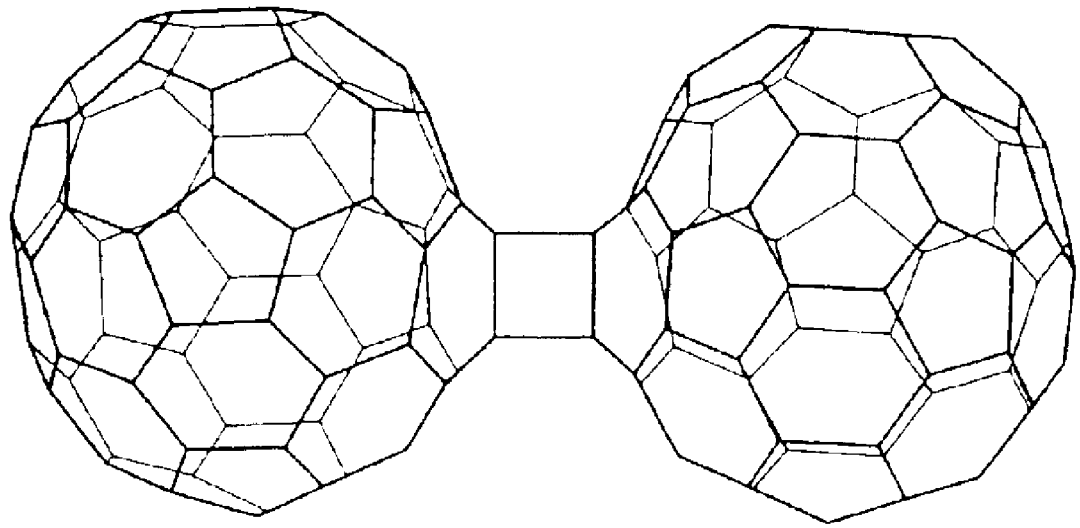
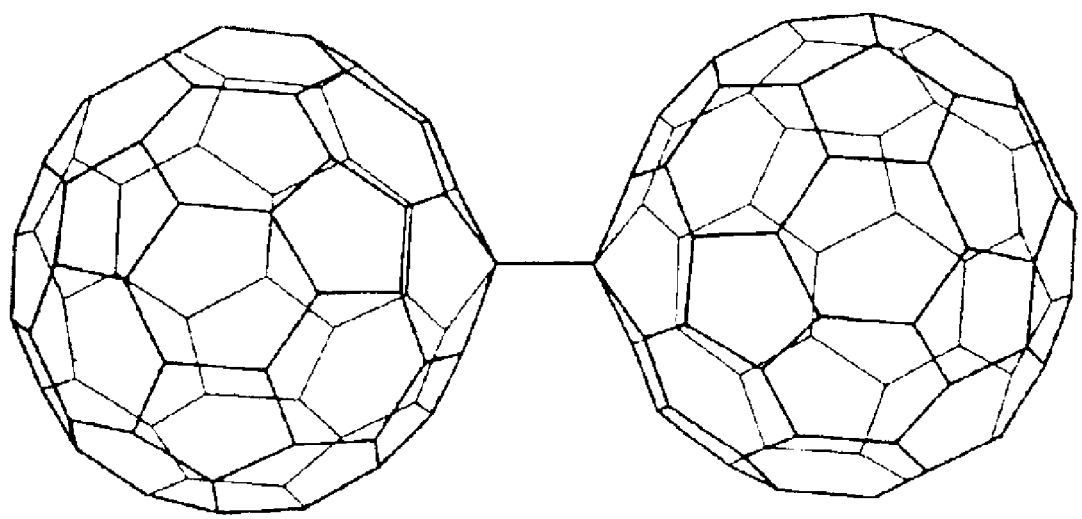
C_140 (h)
FIG.22

C₁₄₀ (i) (D2h SYM)

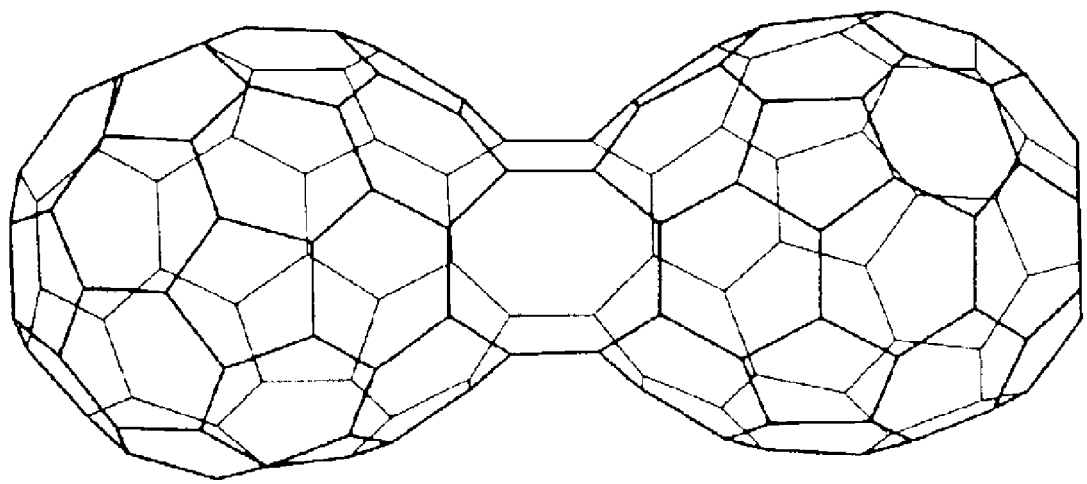
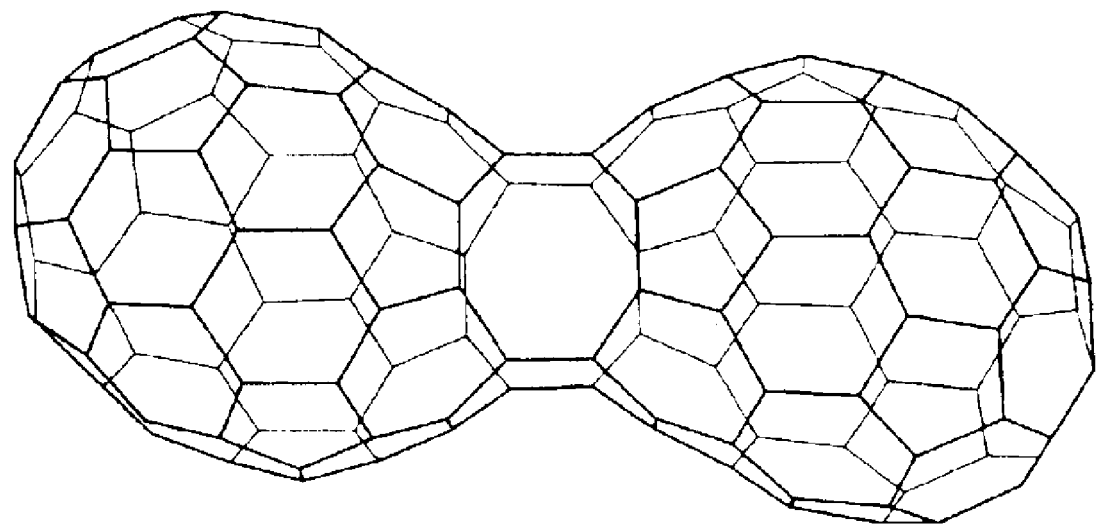
C₁₃₆ (a)
FIG.24

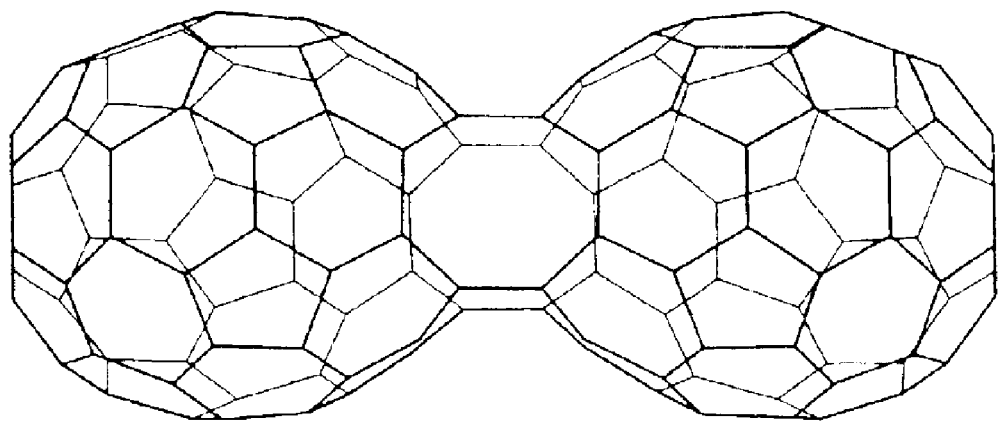
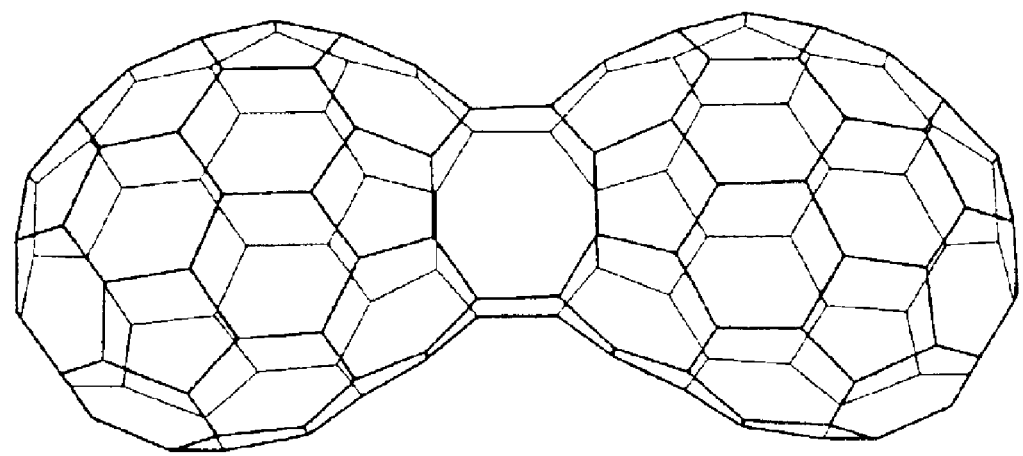
C_{136} (b)
FIG.25

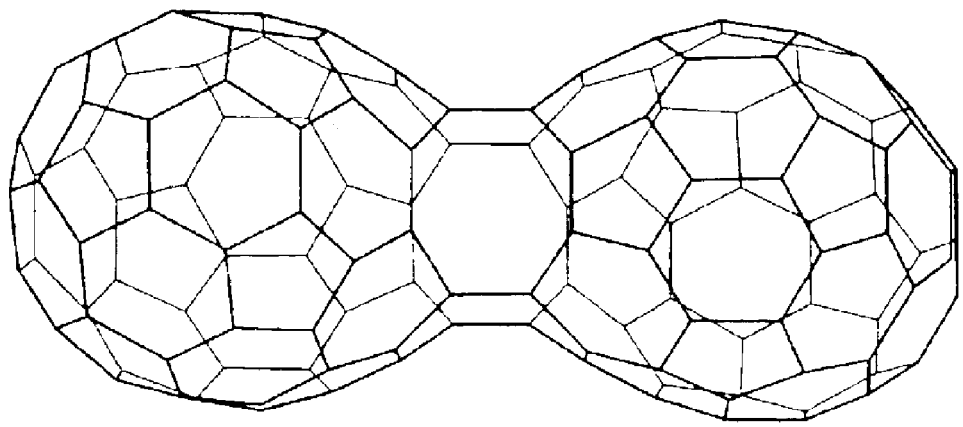
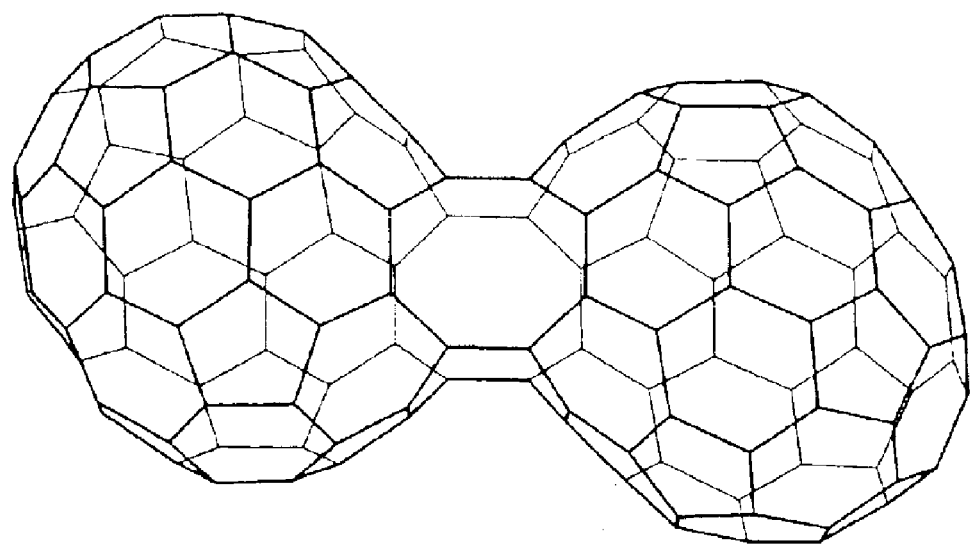
C_{136} (c)
FIG.26

C_{136} (d)

$C_{136}$ (e)

C_{136} (f)

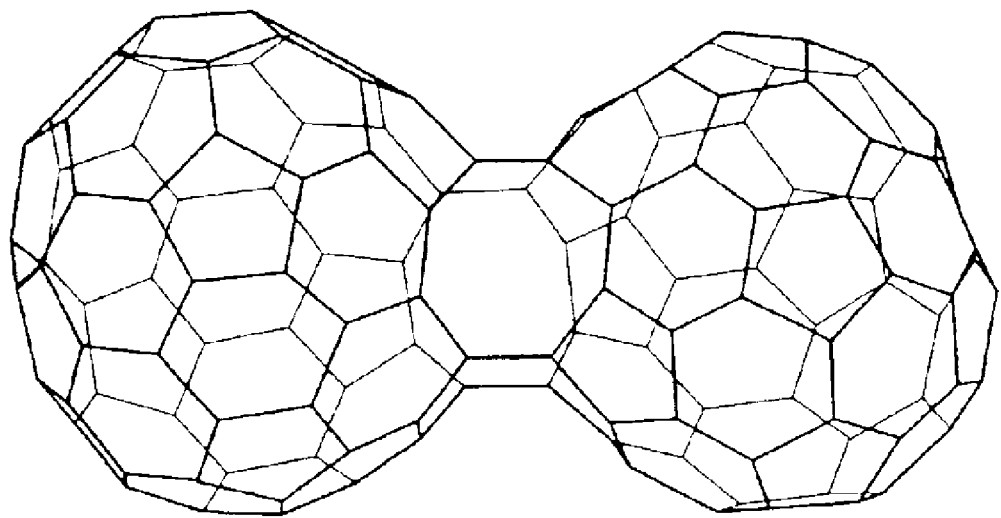
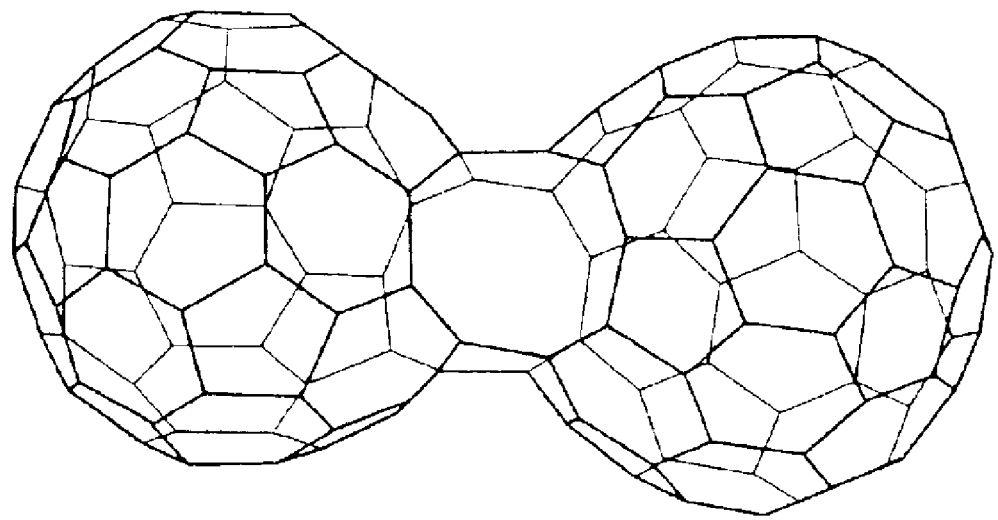
$C_{136}$ (g)
FIG. 30

C_{136} (h)

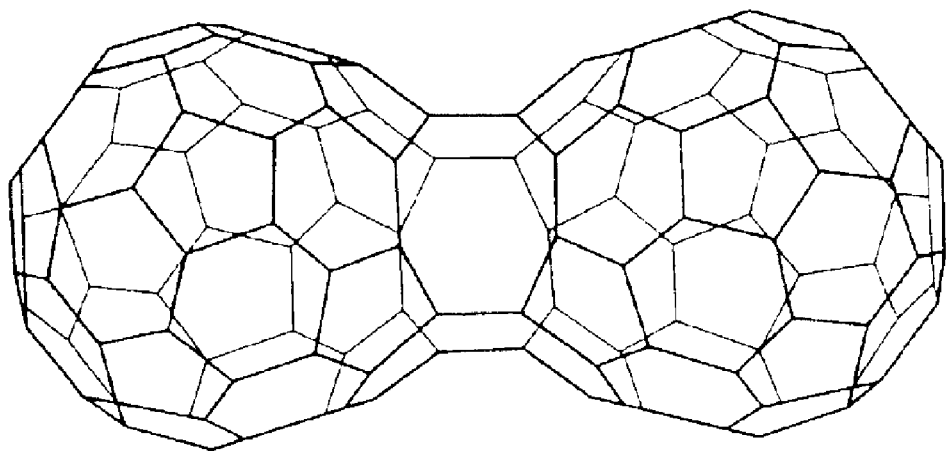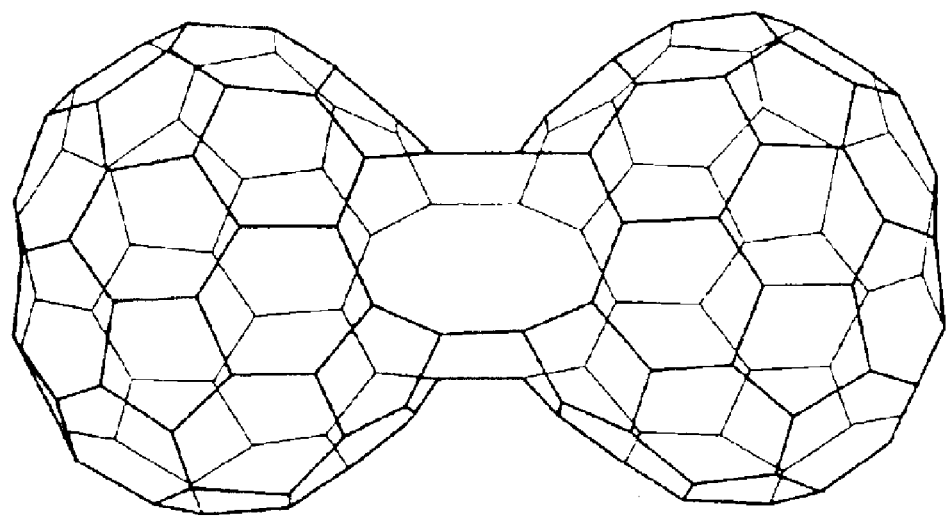
C₁₃₆ (i)
FIG.32

APPARATUS FOR YIELDING
FULLERENE MOLECULES BASED
ON ARC DISCHARGE METHOD

VACUUM DEPOSITION HIGH FREQUENCY
PLASMA POLYMERIZATION APPARATUS

VACUUM DEPOSITION APPARATUS

HIGH FREQUENCY PLASMA
POLYMERIZATION APPARATUS

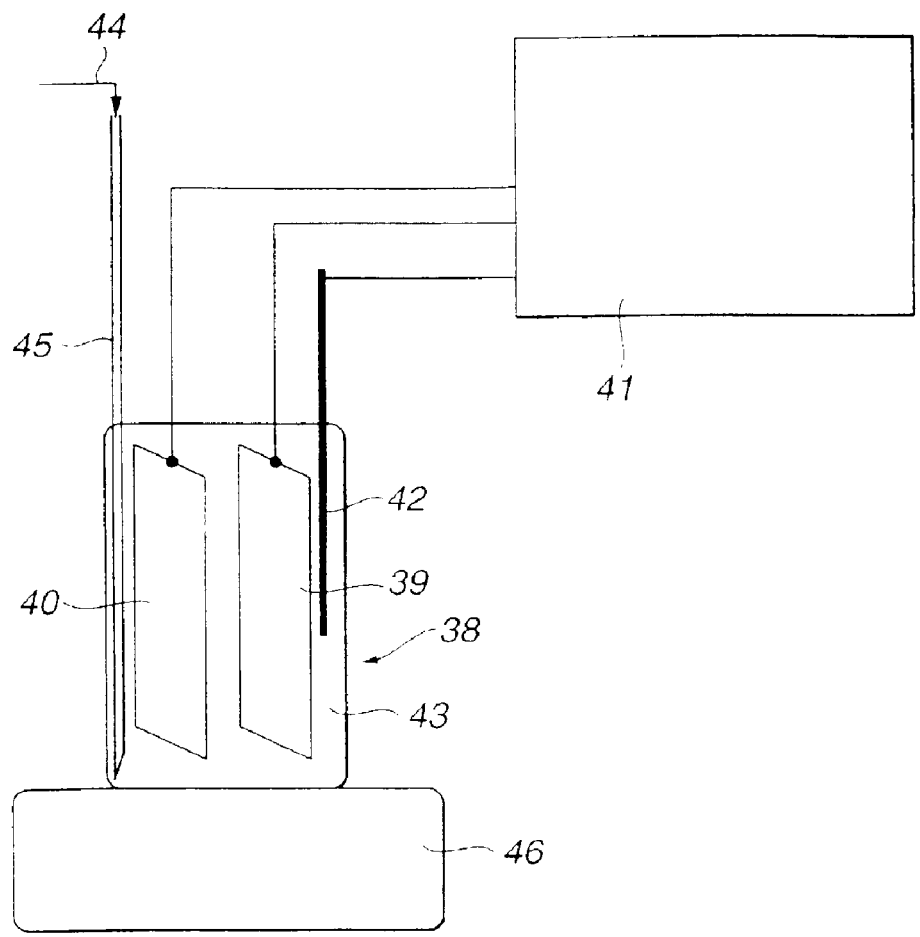
ELECTROLYTIC POLYMERIZATION APPARATUS
FIG.41
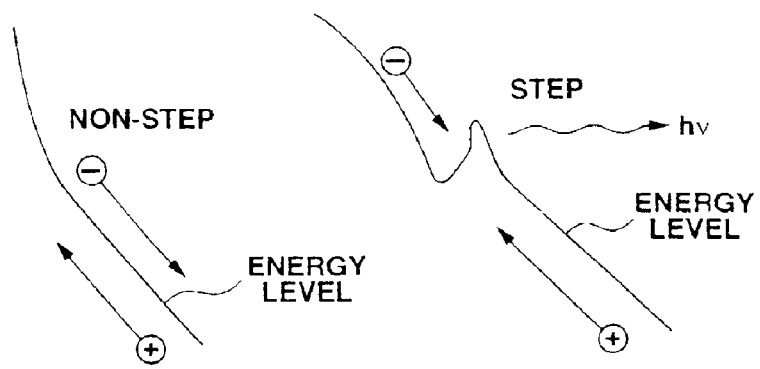
FIG.42A   FIG.42B

CHARGE SEPARATION TYPE HETEROJUNCTION STRUCTURE AND MANUFACTURING METHOD THEREFOR

RELATED APPLICATION DATA

This application is a divisional of application Ser. No. 09/597,247 filed Jun. 20, 2000 now abandoned. The present and foregoing applications claim priority to Japanese Application Nos. P11-179289 filed Jun. 25, 1999 and P2000-005116 filed Jan. 14, 2000.

BACKGROUND OF THE INVENTION

1. Field of the Invention

This invention relates to a charge separation type heterojunction structure used in e.g., a solar cell or a light emitting diode and which has fullerene as a portion of a constituting material thereof. This invention also relates to a manufacturing method for the charge separation type heterojunction structure.

2. Description of Prior Art

Up to now, a silicon pn junction semiconductor etc has been extensively used in e.g., a solar cell or a light emitting diode. Of late, the energy conversion efficiency of the silicon pn junction semiconductor has been improved appreciably in comparison with that when the silicon pn junction semiconductor was initially devised.

Among the materials for the solar cell, there is e.g., titania in addition to silicon. Recently, however, fullerene, as a carbon compound, has attracted attention. The features of fullerene is hereinafter explained in connection with the discovery and the history of development thereof.

Fullerene is a series of carbon compounds composed only of carbon atoms, as is diamond or graphite. The existence of fullerene was confirmed in eighties. That is, it was found in 1985 in a mass analysis spectrum of a cluster beam by laser ablation of carbon. It was, however, five years later that the manufacturing method in reality was established. Specifically, a manufacturing method for fullerene ($C_{60}$) by arc discharge of a carbon electrode was first found in 1990. Since then, fullerene is attracting notice as a carbonaceous semiconductor material (see Kratschmer, W., Fostiropoulos, K, Huffman D. R. Chem. Phys. Lett. 1990, 170, 167. Kratschmer, W. Lamb L. D., Fostiropoulod. K, Huffman, D. R. Nature 1990, 347,354).

Fullerene is a spherical carbon $C_n$ (n=60, 70, 76, 78, 80, 82, 84, . . . ) which is a molecular aggregate resulting from spherical aggregation of an even number not less than 60 of carbon atoms. Representatives of the fullerenes are $C_{60}$ with 60 carbon atoms and $C_{70}$ with 70 carbon atoms. Of these, the $C_{60}$ fullerene is of a polyhedral structure termed truncated-icosahedron obtained from an icosahedron by truncating each of the twelve vertices. Hence, each vertex is replaced by a pentagon. Thus, the $C_{60}$ fullerene has a molecular structure of what may be termed a soccer ball type in which its 60 apices are all occupied by carbon atoms. On the other hand, $C_{70}$ has what may be termed a rugby ball type molecular structure.

In a $C_{60}$ crystal, $C_{60}$ molecules are arranged in a face-centered cubic structure. It has a band gap of approximately 1.6 eV and may be deemed as a semiconductor. In an intrinsic state, it has an electrical resistivity of approximately $10^7$ $\Omega$cm. It has a vapor pressure of approximately 1 m Torr at 500° C. and, on sublimation, is capable of vapor depositing a thin film. Not only $C_{60}$ but other forms of the fullerene are readily vaporized in vacuum or under reduced pressure and hence are able to yield an evaporated film easily.

However, the molecules of fullerene forms, such as $C_{60}$ or $C_{70}$, the most mass-producible, are of zero dipole moment, such that evaporated films produced therefrom are fragile in strength, because only the van der Waal's force acts between its molecules. Thus, if the evaporated film is exposed to air, molecules of oxygen or water tend to be diffused and intruded into the gap between the fullerene molecules (FIG. 2), as a result of which the evaporated film is not only deteriorated in structure but adverse effects may be occasionally produced in its electronic properties. This fragility of the fullerene poses a problem in reference to device stability when applying the fullerene to fabrication of a thin-film electronic device.

For overcoming the weak points the fullerene polymer film, described above, the method of producing a so-called fullerene polymer consisting in polymerizing fullerene molecules has been proposed. Typical of these methods is a method of forming a fullerene polymer film by light excitation [see (a) Rao, A. M., Zhou, P, Wang., K. A, Hager., G. T., Holden, J. M., Wang, Y., Lee, W. T., Bi, X, X., Eklund, P. C., Cornet, D. S., Duncan, M. A., Amster, J. J. Science 1993, 256995, (b) Cornet, D. C., Amster I. J.,Duncan, M. A., Rao A. M., Eklund P. C., J. Phys. Chem. 1993, 97,5036, (c) Li. J., Ozawa, M., Kino, N, Yoshizawa, T., Mitsuki, T., Horiuchi, H., Tachikawa, O; Kishio, K., Kitazawa, K., Chem. Phys. Lett. 1994, 227, 572].

In these methods, in which light is illuminated on a previously formed evaporated fullerene film, numerous cracks tend to be formed in the film surface due to volumetric contraction produced on polymerization, so that produced films are problematic in strength. Moreover, it is extremely difficult to form a uniform thin film of a large surface area.

It has also been known to apply pressure or heat to fullerene molecules or to cause collision of fullerene molecules against one another. It is however difficult to produce a thin film, even though it is possible to form a film (see, for a molecule collision method, (a) Yeretzian, C., Hansen, K., Diedrich, F., Whetten, R. L., Nature 1992, 359,44, (b) Wheten, R. L., Yeretzian, C., Int. J. Multi-layered optical disc. Phys. 1992, B6,3801, (c) Hansen, K., Yeretzian, C., Whetten, R. L., Chem. Phys. Lett. 1994, 218,462, and (d) Seifert, G., Schmidt, R., Int. J. Multi-layered optical disc. Phys. 1992, B6,3845; for an ion beam method, (a) Seraphin, S., Zhou, D., Jiao, J. J. Master. Res. 1993, 8,1995, (b) Gaber, H., Busmann, H. G., Hiss, R., Hertel, I. V., Romberg, H., Fink, J., Bruder, F., Brenn, R. J. Phys. Chem., 1993, 97,8244; for a pressure method, (a) Duclos, S. J., Brister, K., Haddon, R. C., Kortan, A. R., Thiel, F. A. Nature 1991,351, 380, (b) Snoke, D. W., Raptis, Y. S., Syassen, K. 1 Phys. Rev. 1992, B45, 14419, (c) Yamazaki, H., Yoshida, M., Kakudate, Y., Usuda, S., Yokoi, H., Fujiwara, S., Aoki, K., Ruoff, R., Malhotra, R., Lorents, D. J., Phys. Chem. 1993, 97,11161, and (d) Rao, C. N. R., Govindaraj, A., Aiyer, H. N., Seshadri, R. J. Phys. Chem. 1995, 99,16814).

Noteworthy as a fullerene polymerization method or film-forming method, which should take the place of the above-enumerated fullerene polymerization methods, is the plasma polymerization method or the micro-wave (plasma) polymerization method, previously proposed by the present inventors in e.g., Takahashi, N., Dock, H. or in Matsuzawa, N., Ata M. J., Appl. Phys. 1993, 74,5790. The fullerene polymer film, obtained by these methods (see FIGS. 3 and 4), are thin films produced by polymerization of the fullerene molecules through an electronic excited state. It is appreciably increased in strength in comparison with the evaporated thin fullerene film, dense and high in pliability.

Since the fullerene polymer film is scarcely changed in its electronic properties in vacuum or in air, it may be premeditated that its dense thin-film properties effectively suppress diffusion or intrusion of oxygen molecules into the inside of the film. In reality, generation of fullerene polymer consisting the thin film by these methods may be demonstrated by the time-of-flight mass spectrometry.

Irrespective of the type of the plasma method, electron properties of a fullerene polymer film possibly depend appreciably on its polymerization configuration. In reality, the results of mass spectrometry of the $C_{60}$ polymer film, obtained by the micro-wave plasma method, bear strong resemblance to those of the $C_{60}$ argon plasma polymer thin film, previously reported by the present inventors [see Ata, M., Takahashi, N., Nojima, K., J. Phys. Chem. 1994, 98, 9960, Ata, M., Kurihara, K., Takahashi, J. Phys., Chem., B., 1996, 101,5].

The structure of the fullerene polymer may be estimated by the pulse laser excited time-of-flight mass spectrometry (TOF-MS). In general, there is known a matrix assist method as a method for non-destructive measurement the high molecular polymer. However, lacking the solvent capable of dissolving the fullerene polymer, it is difficult to directly evaluate the actual molecular weight distribution of the polymer. Even with the mass evaluation by Laser Desorption Ionization Time-of-Fight Mass Spectroscopy (LDITOF-MS), it is difficult to make correct evaluation of the mass distribution of an actual fullerene polymer due to the absence of suitable solvents or to the reaction taking place between $C_{60}$ and the matrix molecule.

The structure of the $C_{60}$ polymer can be inferred from the profile of a dimer or the peak of the polymer of LDITOF-MS, as observed in the ablation of such a laser power as not to cause polymerization of $C_{60}$. For example, LDITOF-MS of a $C_{60}$ polymer film, obtained with a plasma power of e.g., 50 W, indicates that the polymerization of $C_{60}$ molecules is most likely to take place through a process accompanied by loss of four carbon atoms. That is, in the mass range of a dimer, $C_{120}$ is a minor product, whilst $C_{116}$ is produced with the highest probability.

According to semi-empiric $C_{60}$ dimer calculations, this $C_{116}$ may be presumed to be D2h symmetrical $C_{116}$ shown in FIG. 10. This may be obtained by $C_{58}$ recombination. It is reported that this $C_{58}$ is yielded on desorption of $C_2$ from the high electronic excited state including the ionized state of $C_{60}$ [(a) Fieber-Erdmann, M., et al., Phys. D. 1993, 26,308 (b) Petrie, S. et al., Nature 1993,356,426 and (c) Eckhoff, W. C., Scuseria, G. E., Chem. Phys. Lett. 1993, 216,399].

If, before transition to a structure comprised of two neighboring five-membered rings, this open-shell $C_{58}$ molecules are combined with two molecules, $C_{116}$ shown in FIG. 10 is produced. However, according to the notion of the present inventors, it is after all the [2+2] cycloaddition reaction by the excitation triplex mechanism in the initial process of the $C_{60}$ plasma polymerization. The reaction product is shown in FIG. 9. On the other hand, the yielding of $C_{116}$ with the highest probability as mentioned above is possibly ascribable to desorption of four $sp^3$ carbons constituting a cyclobutane of $(C_{60})^2$ yielded by the [2+2] cycloaddition from the excited triplet electronic state of $C_{60}$ and to recombination of two $C_{58}$ open-shell molecules, as shown in FIG. 6.

If a powerful pulsed laser light beam is illuminated on a $C_{60}$ fine crystal on an ionization target of TOF-Ms, as an example, polymerization of fullerene molecules occurs through the excited electronic state, as in the case of the micro-wave plasma polymerization method. At this time, ions of $C_{58}$, $C_{56}$ etc are also observed along with peaks of the $C_{60}$ photopolymer.

However, since no fragment ions, such as $C_{58}^{2+}$ or $C^{2+}$ are observed, direct fragmentation from $C_{60}^{3+}$ to $C_{58}^{2+}$ and to $C^{2+}$, such as is discussed in the literature of Fieber-Erdmann, cannot be thought to occur in this case. Also, if $C_{60}$ is vaporized in a $C_2F_4$ gas plasma to form a film, only addition products of fragment ions of F or $C_2F_4$ of $C_{60}$ are observed in the LDITOF-MS, while no $C_{60}$ polymer is observed. Thus, the LDITOF-MS, for which no $C_{60}$ polymer is observed, has a feature that no $C_{58}$ nor $C_{56}$ ions are observed. These results of observation support the fact that $C_2$ loss occurs through a $C_{60}$ polymer.

The next problem posed is whether or not the $C_2$ loss is directly caused from 1, 2-$(C_{60})_2$ produced by the [2+2] cycloaddition reaction shown in FIG. 6. Murry and Osawa et al proposed and explained the process of structure relaxation of 1, 2-$(C_{60})$ 2 as follows [(a) Murry, R. L. et al, Nature 1993, 366,665, (b) Strout, D. L. et al., Chem. Phys. Lett. 1993, 214,576, Osawa, E, private letter].

Both Murry and Osawa state that, in the initial process of structure relaxation of 1, 2-$(C_{60})_2$, $C_{120}$(d) of FIG. 13 is produced through $C_{120}$(b) of FIG. 11, resulting from cleavage of the 1, 2-C bond, having the maximum pinch of the cross-linked site, from $C_{120}$(c) of FIG. 12 having the ladder-like cross-linking by Stone-Wales transition (Stone, A. J., Wales, D. J., Chem. Phys. Lett. 1986, 128, 501, (b) Saito, R. Chem. Phys. Lett. 1992, 195,537). On transition from $C_{120}$ (c) of FIG. 12 to $C_{120}$(b) of FIG. 11, energy instability occurs. However, on further transition from $C_{120}$(c) of FIG. 12 to $C_{120}$(d) of FIG. 13, the stabilized state is restored.

Although it is not clear whether the $nC_2$ loss observed in the polymerization of C60 by plasma excitation directly occurs from 1, 2-$(C_{60})$ thought to be its initial process or after certain structure relaxation thereof, it may be premeditated that the observed $C_{118}$ assumes the structure shown in FIG. 14 by desorption of $C_2$ from $C_{120}$(d) of FIG. 13 and recombination of dangling bonds. Also, $C_{116}$ shown in FIG. 15 is obtained by desorption of two carbon atoms of the ladder-like cross-linking of $C_{118}$ of FIG. 14 and recombination of bonds. Judging from the fact that there are scarcely observed odd-numbered clusters in the dimeric TOF-MS, and from the structural stability, it may be presumed that the loss in $C_2$ is not produced directly from 1, 2-$(C_{60})$ 2, but rather that it is produced through $C_{120}$(d) of FIG. 13.

Also, Osawa et al states in the above-mentioned literature that D5d symmetrical $C_{120}$ structure is obtained from $C_{120}$ (a) through structure relaxation by multi-stage Stone-Wales transition. However, insofar as the TOF-MS of the $C_{60}$ polymer is concerned, it is not the structure relaxation by the multi-stage transition reaction but rather the process of structure relaxation accompanied by $C_2$ loss that governs the formation of the polymer by plasma irradiation.

In a planar covalent compound in general, in which a π-orbital crosses the σ-orbital, spin transition between 1(π–π*)–3(π–π*) is a taboo, while it is allowed if, by vibration-electric interaction, there is mixed the a-orbital. In the case of $C_{60}$, since the π-orbital is mixed with the σ-orbital due to non-planarity of the π covalent system, inter-state crossing by spin-orbital interaction between 1(π–π*) and 3(π–π*) becomes possible, thus producing the high photochemical reactivity of $C_{60}$.

The plasma polymerization method is applicable to polymerization of $C_{70}$ molecules. However, the polymerization between $C_{70}$ molecules is more difficult to understand than in that between $C_{60}$. Thus, the polymerization is hereinafter explained in as plain terms as possible with the aid of numbering of carbon atoms making up $C_{70}$.

The 105 C—C bonds of $C_{70}$ are classified into eight sorts of bonds represented by C(1)–C(2), C(2)–C(4), C(4)–C(5), C(5)–C(6), C(5)–C(10), C(9–C(10), C(10)–C(11) and C(11)–C(12). Of these, C(2)–C(4) and C(5)–C(6) are of the same order of double bond performance as the C=C in $C_{60}$. The π-electrons of the six members of this molecule including C(9), C(10), C(11), C(14) and C(15) are non-localized such that the C(9)–C(10) of the five-membered ring exhibit the performance of the double bond, while the C(11)–C(12) bond exhibits single bond performance. The polymerization of $C_{70}$ is scrutinized as to C(2)–C(4), C(5)–C(6), C(9)–C(10) and C(10)–C(11) exhibiting the double-bond performance. Meanwhile, although the C(11)–C(12) is substantially a single bond, it is a bond across two six-membered rings (6, 6-ring fusion). Therefore, the addition reaction performance of this bond is also scrutinized.

First, the [2+2] cycloaddition reaction of $C_{70}$ is scrutinized. From the [2+2] cycloaddition reaction of these five sorts of the C—C bonds, 25 sorts of dimers of $C_{70}$ are produced. For convenience of calculations, only nine sorts of the addition reactions between the same C—C bonds are scrutinized. Table 1 shows heat of the reaction (ΔHf0(r)) in the course of the process of yielding $C_{140}$ from $C_{70}$ of two molecules of the MNDO/AN-1 and PM-3 levels.

In the table, ΔHf0(r)AM-1 and ΔHf° (r)PM-3 means calculated values of the beat of reaction in case of using parameterization of the MNDO method which is a semi-empirical molecular starting method by J. J. Stewart.

TABLE 1

| luster (reference drawing) | ΔHf0(r) (kcal/mol) AM-1 | ΔHf0(r) (kcal/mol) PM-3 | cross-linking | bond length (Å) |
|---|---|---|---|---|
| C140(a) (FIG. 15) | −34.63 | −38.01 | C(2)–C(2'), C(4)–C(4') C(2)–C(4), C(2)–C(4') | 1544 1607 |
| C140(b) (FIG. 16) | −34.33 | −38.00 | C(2)–C(4'), C(4)–C(2') C(2)–C(4), C(2')–C(4') | 1544 1607 |
| C140(c) (FIG. 17) | −33.94 | −38.12 | C(5)–C(5'), C(6)–C(6') C(5)–C(6), C(5')–C(6') | 1550 1613 |
| C140(d) (FIG. 18) | −33.92 | −38.08 | C(5)–C(6'), C(6)–C(5') C(5)–C(6), C(5')–C(6') | 1551 1624 |
| C140(e) (FIG. 19) | −19.05 | −20.28 | C(9)–C(9'), C(10)–C(10') C(9)–C(10), C(9')–C(10') | 1553 1655 |
| C140(f) (FIG. 20) | −18.54 | −19.72 | C(9)–C(10'), C(10)–C(9') C(9)–C(10), C(9')–C(10') | 1555 1655 |
| C140(g) (FIG. 21) | +3.19 | −3.72 | C(10)–C(10'), C(11)–C(11') C(10)–C(11), C(10')–C(11') | 1559 1613 |
| C140(h) (FIG. 22) | +3.27 | −3.23 | C(10)–C(11'), C(11)–C(10') C(10)–C(11), C(10')–C(11') | 1560 1613 |
| C140(i) (FIG. 23) | +64.30 | +56.38 | C(11)–C(11'), C(12)–C(12') C(11)–C(12), C(11')–C(12') | 1560 1683 |

In the above Table, $C_{140}$(a) and (b), $C_{140}$(c) and (d), $C_{140}$(e) and (f) and $C_{140}$(g) and (h) are anti-syn isomer pairs of the C(2)–C(4), C(5)–C(6), C(9)–C(10) and C(10)–C(11) bonds, respectively. In the addition reaction between C(11) and C(12), only D2h symmetrical $C_{140}$(i) is obtained. These structures are shown in FIGS. 15 to 23. Meanwhile, an initial structure of a $C_{70}$ polymer by the most stable [2+2] cycloaddition is shown in FIG. 14.

From this Table 1, no energy difference is seen to exist between the anti-syn isomers. The addition reaction between the C(2)–C(4) and C(5)–C(6) bonds is as exothermic as the addition reaction of $C_{60}$, whereas that between the C(11)–C(12) is appreciably endothermic. Meanwhile, the C(1)–C(2) bond is evidently a single bond. The heat of reaction of the cycloaddition reaction in this bond is +0.19 and −1.88 kcal/mol at the AM-1 and PM-3 level, respectively, which are approximately equal to the heat of reaction in $C_{140}$(g) and (h). This suggests that the cycloaddition reaction across the C(10) and C(11) cannot occur thermodynamically. Therefore, the addition polymerization reaction across the $C_{70}$ molecules occurs predominantly across the C(2)–C(4) and C(5)–C(6), whereas the polymerization across the C(9)–C(10) bonds is only of low probability, if such polymerization takes place. It may be premeditated that the heat of reaction across the C(11)–C(12), exhibiting single-bond performance, becomes larger than that across the bond C(1)–C(2) due to the appreciably large pinch of the cyclobutane structure of $C_{140}$(i), in particular the C(11)–C(12) bond. For evaluating the effect of superposition of the 2p2 lobe of sp2 carbon neighboring to the cross-1 inking bondage at the time of [2+2] cycloaddition, the values of heat generated in the $C_{70}$ dimer, $C_{70}$—$C_{60}$ polymer and $C_{70}H_2$ were compared. Although detailed numerical data are not shown, it may be premeditated that the effect of superposition can be safely disregarded across $C_{140}$(a) to (h), insofar as calculations of the MNDO approximate level are concerned.

The mass distribution in the vicinity of the dimer by the LDITOF-MS of the $C_{70}$ polymer film indicates that dimers of $C_{116}$, $C_{118}$ etc are main products. Then, scrutiny is made into the structure of $C_{136}$ produced on desorbing four carbon atoms making up cyclobutane of a dimer ($C_{70}$) 2, as in the process of obtaining D2h-symmetrical $C_{116}$ from $C_{60}$ and recombining remaining $C_{68}$. These structures are shown in FIGS. 28 to 36. Table 2 shows comparative values of the generated heat (ΔHf0) of $C_{136}$.

In Table 2, ΔHf0 AM-1, ΔHf0 PM-3, cross-linking and the binding length are the same as those of Table 1.

TABLE 2

| luster (reference drawing) | ΔHf0(r) (kcal/mol) AN-1 | ΔHf0(r) (kcal/mol) PM-3 | cross-linking | bond length (Å) |
|---|---|---|---|---|
| C136(a) (FIG. 24) | −65.50 | −61.60 | C(1)–C(8'), C(3)–C(5') C(5)–C(3'), C(8)–C(1') | 1.351 1.351 |
| C136(b) (FIG. 25) | −64.44 | −61.54 | C(1)–C(3'), C(3)–C(1') C(5)–C(8'), C(8)–C(5') | 1.351 1.351 |
| C136(c) (FIG. 26) | 0 | 0 | C(4)–C(13'), C(7)–C(10') C(10)–C(7'), C(13)–C(4') | 1.352 1.352 |
| C136(d) (FIG. 27) | +0.09 | +0.11 | C(4)–C(7'), C(7)–C(4') C(10)–C(13'), C(13)–C(10') | 1.351 1.354 |
| C136(e) (FIG. 28) | +112.98 | +102.89 | C(5)–C(8'), C(8)–C(5') C(11)–C(14'), C(14)–C(11') | 1.353 1.372 |
| C136(f) (FIG. 29) | +69.47 | +59.44 | C(5)–C(14'), C(14)–C(5') C(11)–C(8'), C(8)–C(11') | 1.358 1.352 |
| C136(g) (FIG. 30) | −3.74 | −9.20 | C(5)–C(15'), C(15)–C(5') C(12)–C(9'), C(9)–C(12') | 1.344 1.352 |
| C136(h) (FIG. 31) | +2.82 | −5.30 | C(5)–C(9'), C(9)–C(5') C(12)–C(15'), C(15)–C(12') | 1.372 1.334 |
| C136(i) (FIG. 32) | +98.50 | +84.36 | C(13)–C(10'), C(15)–C(16') C(10)–C(13'), C(16)–C(15') | 1.376 1.376 |

It is noted that $C_{136}$(a) to (i) are associated with $C_{140}$(a) to (i), such that C(2) and C(4), which formed a cross-link at $C_{140}$(a), have been desorbed at $C_{136}$(a). It is noted that carbon atoms taking part in the four cross-links of $C_{136}$(a) are C(1), C(3), C(5) and C(8), these being SP2 carbon atoms. Among the dimers shown in Table 1, that estimated to be of the most stable structure at the PM-3 level is $C_{140}$(c). Therefore, in Table 2, ΔHf0 of $C_{136}$(c), obtained from $C_{140}$(c), is set as the reference for comparison. It may be seen from Table 2 that the structures of $C_{136}$(a) and $C_{136}$(b)

are appreciably stabilized and that $C_{136}(e)$, $C_{136}(f)$ and $C_{136}(i)$ are unstable. If the calculated values of $\Delta Hf0$ of per a unit carbon atom of the totality of $C_{140}$ and $C_{136}$ structures are evaluated, structure relaxation in the process from $C_{140}$ to $C_{136}$ only take place in the process from $C_{140}(a)$ and (b) to $C_{136}(a)$ and (b). Thus, the calculations of the MNDO approximation level suggest that, in the $C_{70}$ cross-link, not only are the sites of the [2+2] cycloaddition of the initial process limited to the vicinity of both end five-membered rings traversed by the main molecular axis, but also is the cross-link structure of the π-covalent system, such as $C_{136}$, limited to $C_{136}$ obtained from the dimer of $C_{70}$ by the cycloaddition reaction across C(2)–C(4) bond. The molecular structure of more stable $C_{136}$, yielded in the process of relaxation of the structure shown in FIG. 13, is shown in FIG. 14.

The polymer film of $C_{60}$ shows semiconducting properties with band gap evaluated from temperature dependency of the dark current being of the order of 1.5 to 2 eV. The dark conductivity of the $C_{60}$ polymer film obtained with the micro-wave power of 200 W is on the order of $10^{-7}$ to $10^{-8}$ S/cm, whereas that of the $C_{70}$ polymer film obtained for the same micro-wave power is not higher than $10^{-13}$ S/cm, which is approximate to a value of an insulator. This difference in the electrical conductivity of the polymer films is possibly attributable to the structures of the polymer films. Similarly to the sole cross-link bond in which two-molecular $C_{60}$ is in the state of open-shell radical state, the cross-link of a dimer of 1, 2-C(60) due to [2+2] cycloaddition reaction of FIG. 1 is thought not to contribute to improved electricaly conductivity. Conversely, the inter-molecular cross-link, such as $C_{116}$, forms the π-covalent system, and hence is felt to contribute to improved electrically conductivity. The cross-link structures of $C_{118}$, $C_{114}$ and $C_{112}$, now under investigations, are thought to be a π-covalent cross-link contributing to electrically conductivity.

It may be contemplated that the electrical conductivity usually is not increased linearly relative to the number of electrically conductive cross-links between fullerene molecules, but is changed significantly beyond the permeation limit at a certain fixed number. In the case of $C_{70}$, the probability of the [2+2] cycloaddition reaction is presumably lower than that in the case of $C_{60}$, while the structure relaxation to the electrically conductive cross-linked structure such as that from $C_{140}$ to $C_{136}$ can occur only on specified sites. In light of the above, the significant difference in electrically conductivity between the two may possibly be attributable to the fact that, in the $C_{60}$ polymer film, the number of cross-links contributing to electrically conductivity is large and exceeds the permeation limit, whereas, in the case of $C_{70}$, the permeation limit is not exceeded because of the low probability of polymerization and limitation of formation of electrically conductive cross-links.

Taking into account the discovery of the fullerene molecule, its evaporated film and fullerene polymer film and the mechanism of polymerization thereof, discussed in the foregoing, we return to the discussion of the solar cell referred to in the beginning part of the present specification.

The material fullerene has latent possibility of yielding a solar cell improved both economically and as to physical characteristics. As a matter of fact, several solar cells having fullerene as its constituent material have so far been proposed (see JP Patents Nos.9656473, 95230248 and 99325116, U.S. Pat. No. 5,171,373 and WO 9405045).

However, the solar cells, hitherto proposed, are common in exploiting the fullerene evaporated film, so that the above-mentioned problem attributable to the fragility of the evaporated film, in particular the durability or physical properties of electrons, as yet remains unsolved.

Meanwhile, the fullerene polymer film, belonging to the fullerene system as does the above-mentioned evaporated film, exhibits sufficient durability due to its superior physical properties such as freeness from oxygen diffusion into the polymer bulk material. However, it has scarcely been attempted up to now to use the material as a constituent material for fabrication of the solar cells.

This may possibly be attributable to the circumstances that the industrial fullerene polymerization technique has been developed only recently. In addition, the fact that the method of definitely identifying the fullerene polymer film by a non-destructive technique has not been established possibly needs to be taken into consideration.

As means for clarifying the interconnection of carbon skeletons in a carbonaceous compound, there is also known a method such as a nuclear magnetic resonance method. However, insofar as carbonaceous thin film, such as a fullerene polymer film, is concerned, difficulties are encountered in measurement due to failure in definite observation of the pattern of free induction attenuation depending on electrical conductivity and to transverse relaxation to nuclear spin by dangling unpaired spin.

Moreover, the nuclear magnetic resonance method is not suited as means for monitoring structural changes in the carbonaceous thin film material due to difficulties encountered in magic angle spin of an individual sample.

OBJECT AND SUMMARY OF THE INVENTION

It is therefore an object of the present invention to provide a charge separation type heterojunction structure in which, by establishing a method for non-destructively identifying a fullerene polymer film and by applying the polymer film to a layered structure, it is possible to produce a solar cell etc which is improved not only in durability and electronic physical properties but also in various physical properties.

In one aspect, the present invention provides a fullerene polymer obtained on polymerizing a vapor-deposited film of fullerene molecules by irradiation of electromagnetic waves.

In another aspect, the present invention provides a method for manufacturing a charge separation heterojunction structure including the steps of forming a light-transmitting electrode, forming an electrically conductive organic film, forming a fullerene polymer film and forming a counter-electrode, wherein the steps of forming constituent layers other than the fullerene polymer film is carried out after first identifying the fullerene polymer film.

In the heterojunction structure of the present invention, in which an electrically conductive organic film as an electron donor, and a fullerene polymer film, as an electron acceptor, are layered between a pair of electrodes, at least one of which is light transmitting. Therefore, the heterojunction structure of the present invention finds application in solar cells or light emitting diodes. Since the fullerene polymer film is used as a part of the constituent material, the heterojunction structure of the present invention is particularly superior in durability and electronic physical properties as compared to the case of employing a fullerene deposited film. A vapor-deposited film tends to lose its desirable characteristics in about one day in the evaluation in atmosphere. Conversely, a polymerized vapor-deposited film is scarcely changed in characteristics even after one month.

Moreover, if the heterojunction structure is applied to a solar cell, it is possible to produce a thin film which is lower in cost, more light weight and flexible than a film used in a conventional silicon pn junction solar cell.

In the manufacturing method of the present invention, in which the respective constituent layers of the charge separation heterojunction structure can be formed without difficulties, and the fullerene polymer film can be identified by using the Raman and Nexafs methods in combination, the variable evaluation including that on the structure and the polymerization degree of the fullerene polymer film, amorphization, oxidation and dielectric breakdown by application of a high voltage, can be realized precisely non-destructively. The fullerene polymer film can be accurately identified based on the results of evaluation on the fullerene polymer film, so that the targeted heterojunction structure can be fabricated reliably. Moreover, the results of the evaluation can be used for controlling its physical properties.

BRIEF DESCRIPTION OF THE DRAWINGS

FIG. 1A shows the molecular structure of $C_{60}$ and FIG. 1B shows that of $C_{70}$.

FIG. 15 shows still another dimeric structure of a $C_{70}$ molecule.

FIG. 18 shows still another dimeric structure of a $C_{70}$ molecule.

FIG. 21 shows still another dimeric structure of a $C_{70}$ molecule.

FIG. 22 shows still another dimeric structure of a $C_{70}$ molecule.

FIG. 24 shows still another dimeric structure of a $C_{70}$ molecule [$C_{136}$(a)].

FIG. 25 shows still another dimeric structure of a $C_{70}$ molecule [$C_{136}$(b)].

FIG. 26 shows still another dimeric structure of a $C_{70}$ molecule[$C_{136}$(c)].

FIG. 30 shows still another dimeric structure of a $C_{70}$ molecule [$C_{136}$(g)].

FIG. 32 shows still another dimeric structure of a $C_{70}$ molecule [$C_{136}$(i)].

FIG. 33A is a schematic cross-sectional view showing a simple hetero structure and FIG. 33B is a schematic cross-sectional view showing a simple hetero structure.

FIG. 34C shows a simple heterojunction structure and FIG. 34D shows a double hetero structure.

FIG. 41 shows an apparatus for producing a fullerene polymer film by the electrolytic polymerization method.

FIGS. 42A and 42B show the state of separation of electrons and holes in a heterojunction of the heterojunction structure according to the present invention, where FIG. 42A shows the state in the absence of a step and FIG. 42B shows the state in the presence of a step.

DESCRIPTION OF THE PREFERRED EMBODIMENTS

A charge separation heterojunction structure of the present invention is preferably of the above-described layered structure in which the fullerene polymer film contacts with the counter-electrode.

Also, inclusive of this case, an active layer is preferably interposed as a carrier generating layer between the fullerene polymer film and the electrically conductive organic film.

According to the present invention, a substrate may preferably be provided on an outer surface side, that is a surface exposed to atmosphere, of each electrode.

Figure 33A:
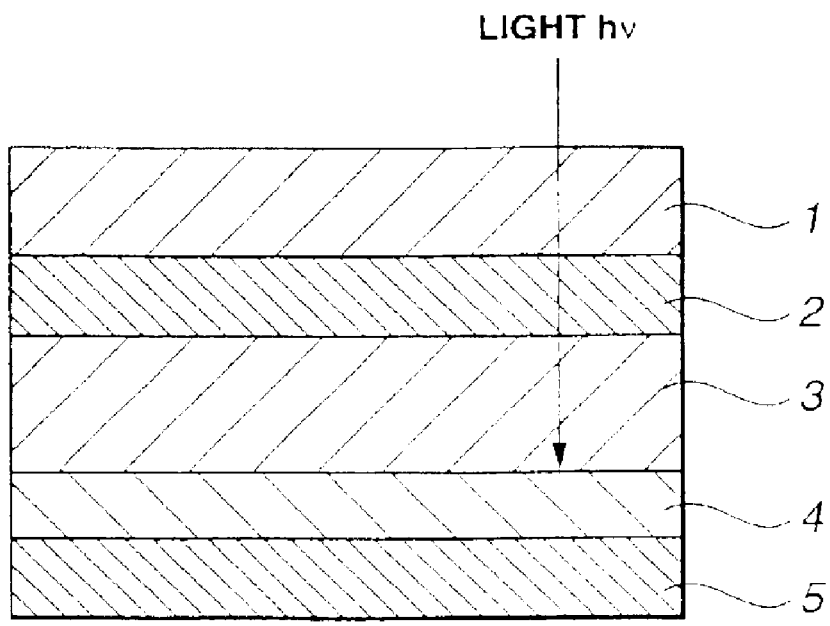
FIGS. 33A and 33B show an illustrative heterojunction structure of the present invention, where
Figure 33B:
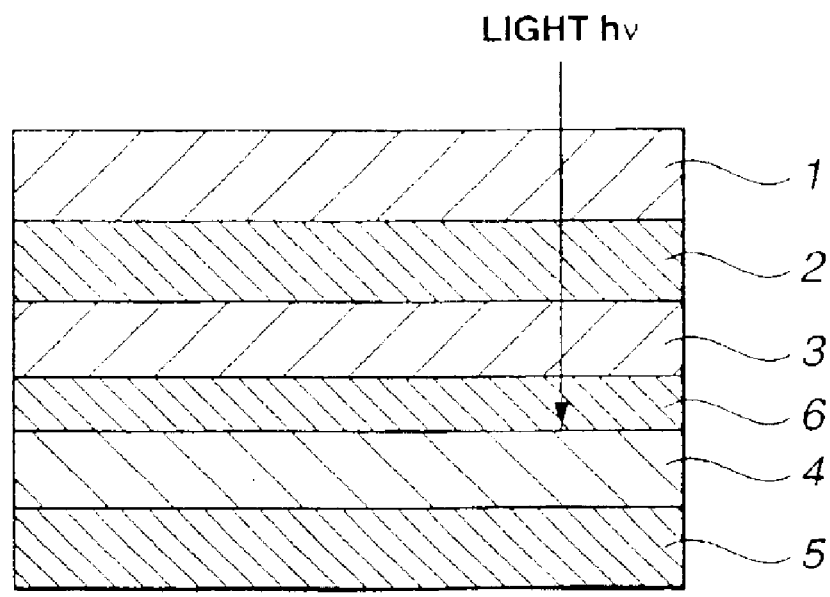

As a typical heterojunction structure of the present invention, it is preferably of such a structure in which a light-transmitting electrode 2, such as ITO (indium tin oxide) comprised of a transparent substrate 1 of silicon or glass, an electrically conductive high polymer film 3 of e.g., polythiophene, a fullerene polymer film 4 forming a heterojunction with the electrically conductive high polymer film, and a counter-electrode 5 of, for example, aluminum, are layered in this order on the transparent substrate 1, as shown in FIG. 33A. An active layer 6 of, for example, carbon nanotube or phthalocyanine, is preferably interposed as a carrier generating layer between the electrically conductive high polymer film 3 and the fullerene polymer film 4, as shown in FIG. 33B. The film thicknesses of the electrically conductive high polymer film 3, active layer 6 and the fullerene polymer film 4 are preferably 0.1 to 50 nm and more preferably 5 to 20 nm, hereinafter the same.

Figure 34C:
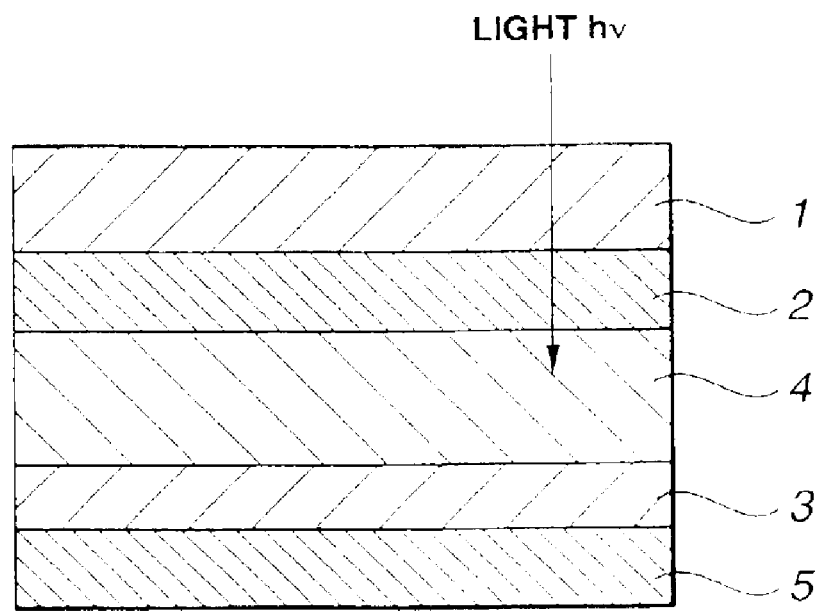
FIGS. 34C and 34D show schematic cross-sectional views of another simple heterojunction structure, where
Figure 34D:
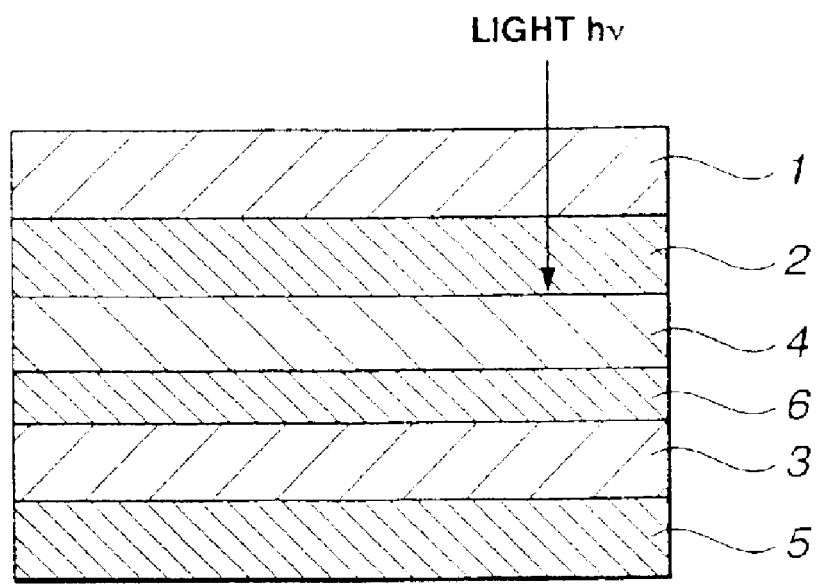

It is noted that charge separation is also possible in a heterojunction structure in which the electrically conductive high polymer film 3 and the fullerene polymer film 4 are interchanged with each other, as shown in FIGS. 34C and 34D, such that this structure is also comprised in the scope of the present invention.

The electrically conductive organic film is electron-donating and is preferably comprised of p-type electrically conductive high molecular material containing a covalent π-electron system. Preferred examples of the polymers include those of polyvinyl carbazole, poly(p-phenylene)-vinylene, polyaniline, polyethylene oxide, polyvinyl pyridine, polyvinyl alcohol, polythiophene, polyfluorene, polyparaphenylene and derivatives of these constituent monomers.

Meanwhile, these electrically conductive organic films may be admixed with known dopants, such as sulfuric acid radicals, for controlling their electrically conductivity.

Figure 1A:
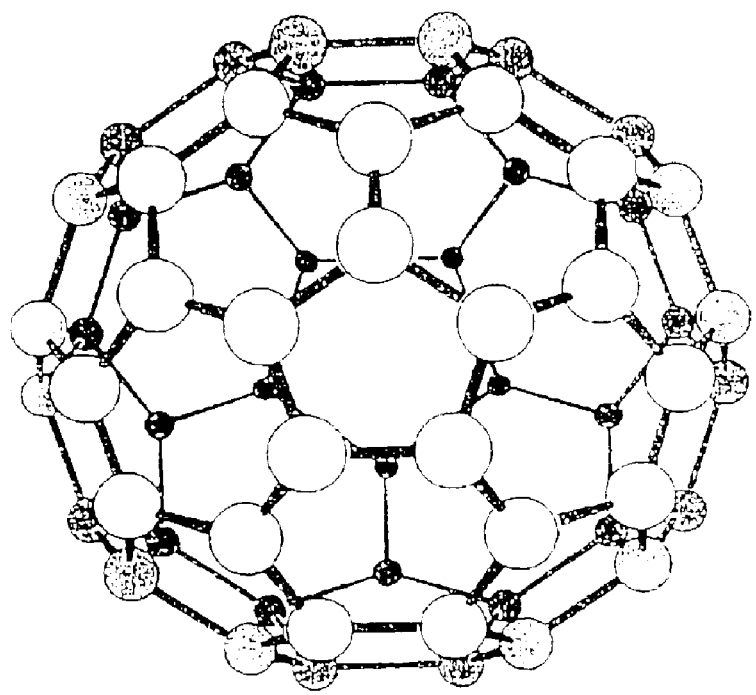
FIGS. 1A and 1B schematic views showing the molecular structure of fullerene, where
Figure 1B:
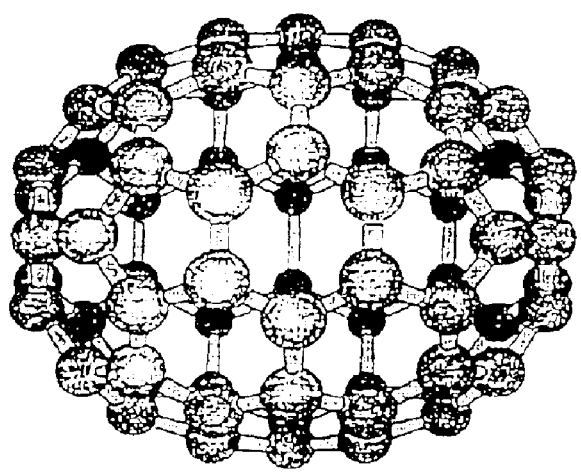
Figure 2:
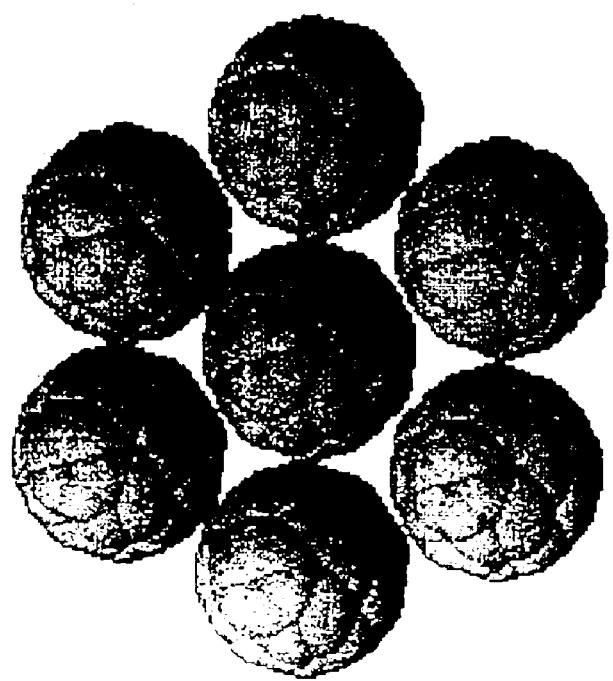
FIG. 2 shows the structure of a $C_{60}$ evaporated film.
Figure 4:
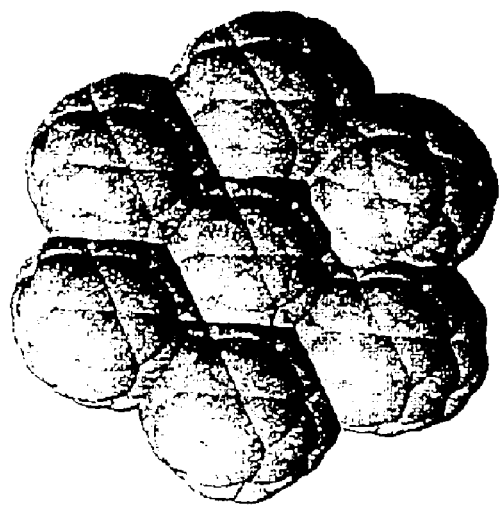
FIG. 4 shows an illustrative structure of a $C_{60}$ polymer.
Figure 3:
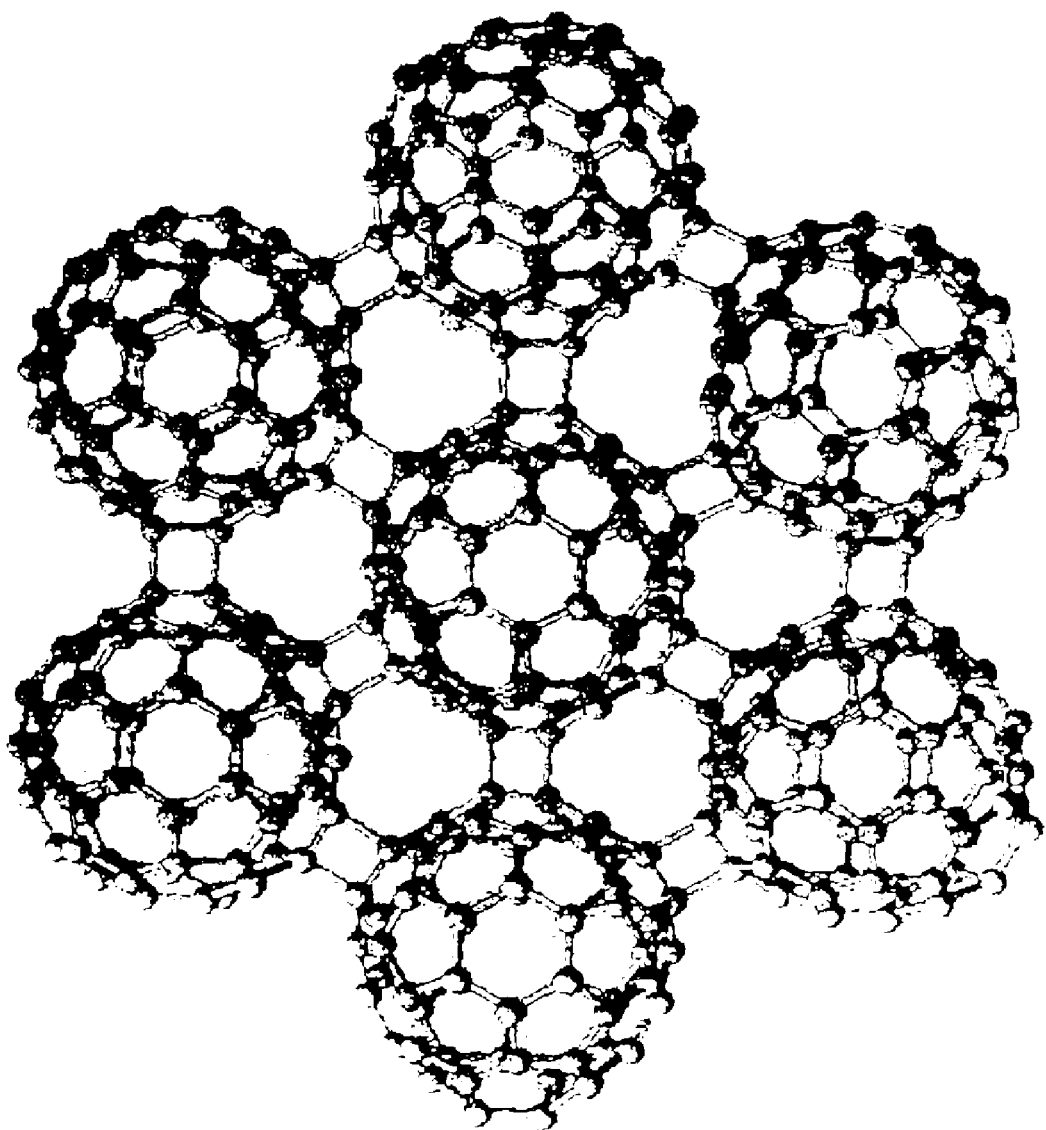
FIG. 3 shows an illustrative structure of a $C_{60}$ polymer.
Figure 5:
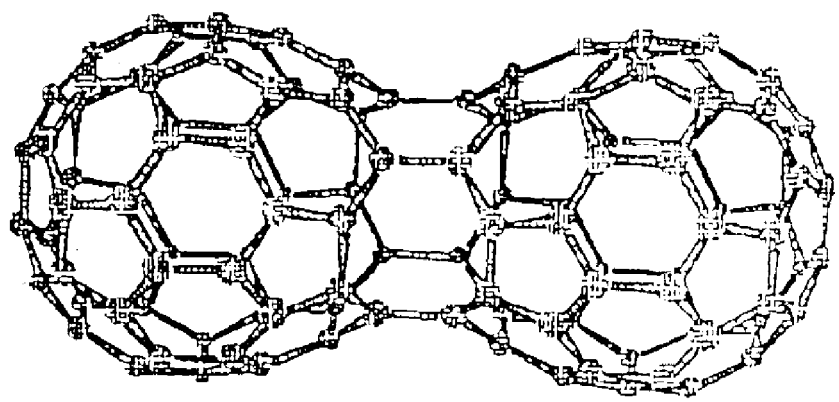
FIG. 5 shows a dimeric structure of a C60 molecule.

The fullerene polymer film operates as an electron accepting thin film and preferably composed of a $C_{60}$ polymer and/or $C_{70}$ polymer, such as those shown for example in FIGS. 5 to 11, in FIGS. 13 to 32 and in FIGS. 3 and 4. However, the polymers are not limited to these examples. In comparison with the vapor-deposited fullerene film, shown in FIG. 2, this fullerene polymer film features tight bonding among fullerene molecules by covalent bonds.

The active layer, as an optionally provided layer, is a carrier generating layer, and is formed of dyes having a π-electron system, metal complexes, electrically conductive high polymer materials, fullerene molecules, chemically modified derivatives thereof, single- or multi-layered carbon nanotubes, either alone or in combination. The dyes may be enumerated by cyanine dyes, phthalocyanine, metal complexes thereof, porphyrin and metal complexes thereof. As the material of the light-transmitting electrode, the ITO (indium oxides doped with tin) is generally preferred. However, thin films of gold, silver, platinum or nickel may also be used.

The materials of the counter-electrode may be enumerated by one or more of metals, such as aluminum, magnesium, indium, alloys thereof, or ITO.

The manufacturing method of the present invention for producing the charge separation heterojunction structure basically includes a step of forming a light-transmitting electrode, a step of forming an electrically conductive organic film, a step of forming a fullerene polymer film and a step of forming a counter-electrode. The sequence of these steps is, however, arbitrary, on the condition that the fullerene polymer film is to be identified first before proceeding to the formation of the remaining constituent layers. The step of mounting a substrate on the light-transmitting electrode or the counter-electrode or the step of interposing an active layer may be added as appropriate.

For this identification, the Raman method and the Nexafs method, both being non-destructive spectroscopic method, are preferably used in combination. If one of these methods is omitted, the identification cannot be executed satisfactorily.

Among items of evaluation of the specified identification operations, there are a fullerene polymer structure, polymerization degree, amorphization, oxidation and insulation destruction by impression of a high voltage. The results of the evaluation may be used not only for identification of the fullerene polymer film but also for controlling physical properties, such as control of polymerization conditions.

In the step of forming the light-transmitting electrode, the routine practice is forming the electrode on a substrate, rather than forming it alone. The electrode material, such as ITO, is formed on the substrate by techniques such as vapor deposition or sputtering.

If thin film of a stable metal, such as gold, is used in place of ITO film, it is crucial to form the thin film to a thin thickness on the substrate to provide light transmittance. The shape or the pattern of the light-transmitting electrode may be freely selected by known means, such as mask.

The electrically conductive organic film or the fullerene polymer film is formed on the light transmitting electrode. Meanwhile, in case the fullerene polymer film is formed on the light-transmitting electrode, the procedure may be simply reversed from. that employing the electrically conductive organic film, the corresponding explanation is omitted for simplicity.

During this forming step, a vapor-deposited film or a plasma polymerization film of an organic low molecular compound, exhibiting electron donating properties, is formed on the light-transmitting electrode.

That is, if a monomer of the high molecular material or an organic low molecular compound containing π-electrons is vaporized and the gas thus yielded is irradiated with a high frequency plasma of a lower energy, UV rays or an electron beam, an electrically conductive organic film can be produced on the light-transmitting electrode.

The vapor-deposited film or the plasma polymerization film of the π-covalent organic low molecular material has electrically conductivity at least of the order of $10^{-9}$ S/cm. Since the fullerene polymer film, as later explained, operates as an electron accepting thin film, the low molecular organic vapor-deposited film or the plasma polymerization film needs to operate as an electron donating thin film.

The low molecular organic compounds may be enumerated by a π covalent low molecular material, such as ethylene or acetylene, cata-condensation organic compounds, such as benzene, naphthalene or anthracene, peri-condensation aromatic compounds, such as perillene or coronene, and derivatives of these compounds as to hetero atoms, such as nitrogen, oxygen or sulfur. It is noted that oxygen, sulfur, selenium or tellurium can be built as hetero atom into an organic skeleton, however, since these atoms normally furnish two electrons to the π-electron system, there are furane or thiophene as a hetero cyclic compound of oxygen or sulfur which proves a π-electron system with e.g., benzene. If one of these elements is built into a six-membered ring or two of the elements are built into a five-membered ring, the π-electron system is present in excess amount in view of the 4n+2 rule so that the resulting compound is strongly electron-donating. Typical of the strong electron-donating compounds is tetrathiafullvalene. The vapor-deposited film or the plasma polymerization film of this strongly electro-donating organic compound forms a heterojunction with an electron-accepting fullerene polymer film as later explained to induce charge separation by light induction more effectively.

The materials for forming the electrically conductive organic film, as polymers, may be enumerated by high molecular materials or derivatives thereof, in addition to the above-mentioned polyvinyl carbazole and polythiophene, these may being used alone or in combination.

These materials are poly(3-alkylthiophene), poly[2-methoxy-5-(2'-ethylhexoxi)-p-phenylene]-vinylene, poly[2-methoxy-5-(2'-ethylhexoxi)-1,4-paraphenylene vinylene, poly(3-alkylthiophene), poly(9,9-dialkylfluorene), polyparaphenylene, poly(2,5-diheptiloxy-1,4-phenylene), polyphenylene, polyaniline, poly(p-phenylene), polyethylene oxide, poly(2-vinyl pyridine and poly(vinyl alcohol). It is also possible to execute polymerization by illumination of a high frequency plasma of a lower energy, or UV-rays, X-rays or electron rays, in a gaseous atmosphere of these high molecular compounds or an organic compound containing the π-electron system, to produce a highly electrically conductive organic thin film.

On the electrically conductive organic film, produced as described above, a fullerene polymer film is formed by the following procedure.

First, the fullerene molecules, as a starling material, those of $C_{60}$, $C_{70}$ and higher-order fullerene may be used, either singly or in combination. Most preferred are the $C_{60}$ fullerene, the $C_{70}$ fullerene or mixtures thereof. In addition, the fullerene of higher orders, such as $C_{70}$, $C_{78}$, $C_{80}$, $C_{82}$, $C_{84}$ and so forth may be contained therein.

Figure 35:
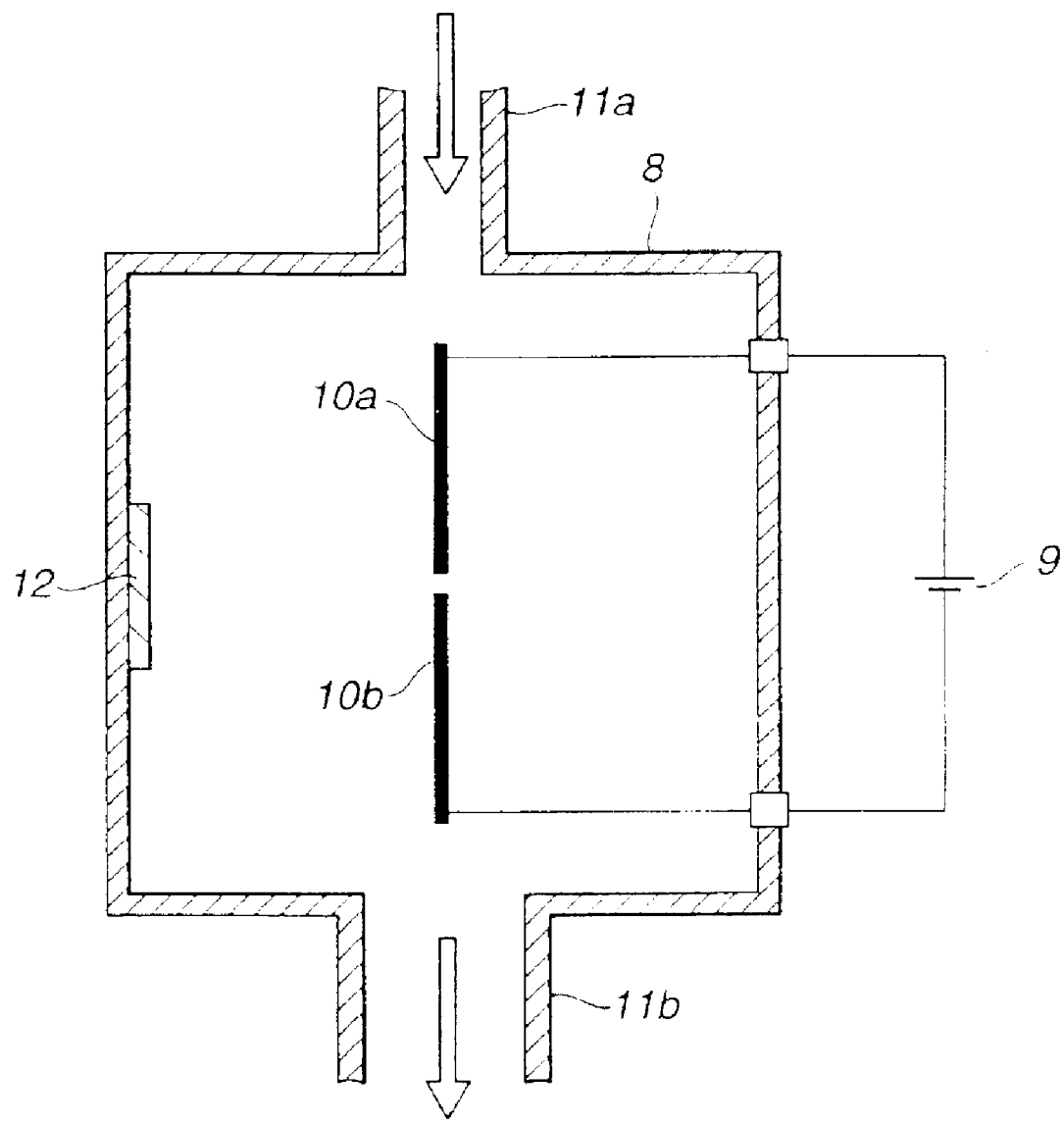
FIG. 35 shows an apparatus for yielding fullerene molecules by arc discharge.

These fullerene molecules may be manufactured by an arc discharge method of a carbon electrode, using an apparatus shown for example in FIG. 35.

In a reaction vessel 8 of the present apparatus, there are mounted a pair of carbon electrodes, connected to an AC or DC source 9, such as counter-electrodes 10a, 10b formed of graphite. After evacuating the reaction vessel 8 by a vacuum pump through an outlet 11b by an exhaust pump, low-pressure inert gas, such as helium or argon, is introduced via an inlet 11a so as to be charged into the reaction vessel 8.

The ends of the counter-electrodes 10a, 10b are arranged facing each other with a small gap in-between, and a predetermined current and voltage are applied from the DC source 9 to maintain the state of arc discharge across the ends of the counter-electrodes 10a, 10b for a predetermined time.

By this arc discharge, the counter-electrodes 10a, 10b are vaporized so that soot is gradually deposited on a substrate 12 mounted on the inner wall surface of the reaction vessel 8. If this amount of soot deposited is increased, the reaction vessel 8 is cooled and the substrate 12 is taken out, or the soot is recovered using a sweeper.

From this soot, the fullerene such as $C_{60}$ or $C_{70}$ may be extracted using a π-electron based solvent, such as toluene, benzene or carbon disulfide. The yielded fullerene, obtained in this stage, is termed crude fullerene, which may be applied to column chromatography to separate $C_{60}$ and $C_{70}$ as purified separate products.

The resulting fullerene molecules are used as a starting material in the film-forming process of the fullerene polymer. Among the polymerization or film-forming methods, there are, for example, a photopolymerization method, an electron beam illumination method, a plasma polymerization method, a micro-wave polymerization method) and an electrolytic polymerization method.

Photo Polymerization Method

In this polymerization method, an apparatus including a reaction chamber capable of being maintained at a reduced pressure or in vacuum, heating means, such as resistance heating means, for vaporizing the fullerene molecules, and illumination means for illuminating the light, such as ultraviolet beam, through the window of the reaction chamber, is used. A fullerene polymer film is formed on the substrate as fullerene is evaporated and illumination of ultraviolet light is continued for a predetermined time. At this time, the fullerene molecules are excited by light and polymerized through the excited state.

It is noted that polymerization occurs by forming an evaporated film and illuminating ultraviolet rays thereon, without illuminating the light as the evaporation is going on. In this case, there are occasions wherein only a superficial layer of the film is polymerized, whilst the bulk part of the film is not polymerized. An experiment conducted by the present inventors have revealed that a pattern of cracks can be produced on the surface of the evaporated fullerene film on UV irradiation, as may be observed over a microscope.

Electron Beam Polymerization Method

This method uses an electron beam radiated from the electron gun in place of the light such as ultraviolet light. The principle of polymerization is similar to the photo polymerization method, that is, the fullerene molecules are excited by an electron beam and polymerized through the excited state.

Plasma Polymerization Method

Among the plasma polymerization methods, there are a high-frequency plasma method, a DC plasma method and an ECR plasma method. Here, the high-frequency plasma method, which is now in widespread use, is explained by referring to the drawings.

Figure 36:
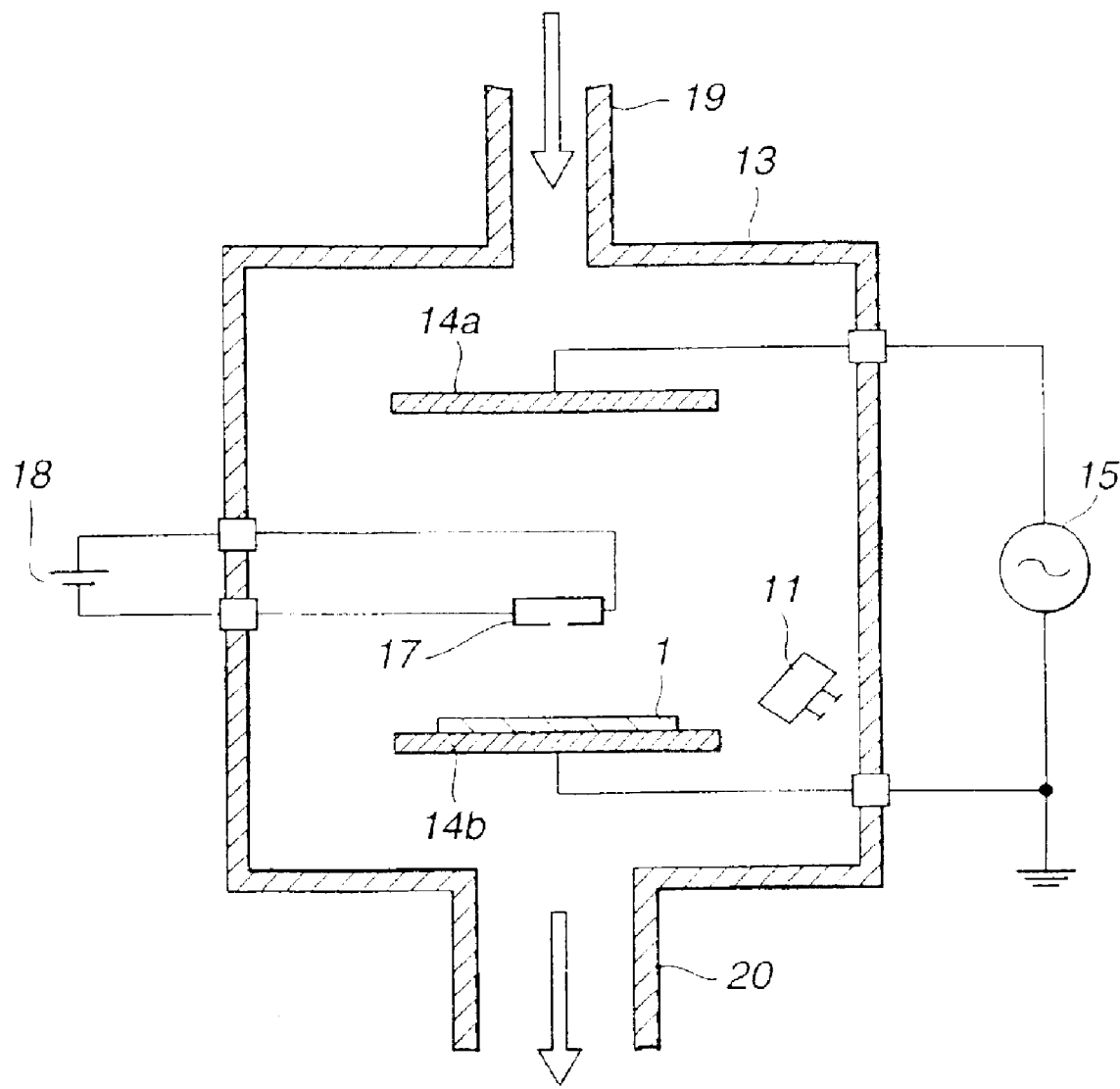
FIG. 36 shows an apparatus for producing a fullerene polymer film by the plasma polymerization method and by the vapor deposition film electro-magnetic wave illumination method.

FIG. 36 shows a typical high-frequency plasma polymerization apparatus, including a vacuum vessel 13, within which are arranged a pair of electrodes 14a, 14b facing each other. These electrodes are connected to an outer high frequency power source 15. On one 14b of the electrodes is set a substrate 16 for permitting a fullerene polymer film to be deposited thereon, that is the above-mentioned substrate having the electrically conductive high polymer film formed on the light-transmitting electrode.

In this vacuum vessel 13, there is arranged a vessel 17 formed e.g., by a molybdenum boat, accommodating the fullerene molecules, as a starting material. This vessel 17 is connected to an external power source for resistance heating 18.

In the polymerization apparatus, constructed as described above, a low-pressure inert gas, such as argon, is introduced through an inlet 19 into the vacuum vessel 13, which is evacuated through the exhaust port 20. After the vacuum vessel 13 is charged with the inert gas, the current is supplied to the vessel 17 to heat it to vaporize the fullerene molecules therein. The high frequency voltage is applied from the high frequency power source 15 to generate a high frequency plasma across the electrodes, while illumination is made into the fullerene gas to form a fullerene polymer film holding the π-electron skeleton on the substrate 16.

Meanwhile, a DC power source may be used in place of the high frequency power source 15 (DC plasma method). If the vessel 17 is heated without actuating these power sources, that is without generating the plasma, the fullerene is not polymerized, with its evaporated film being formed on the substrate 16.

If the temperature of the substrate 16 is excessively high, the amount of deposition of the fullerene polymer film is decreased. Therefore, the substrate is usually kept at a temperature of 300° C. or less. If the plasma power is of the order of 100 W, the temperature scarcely exceeds 70° C.

Microwave Polymerization Method

Figure 37:
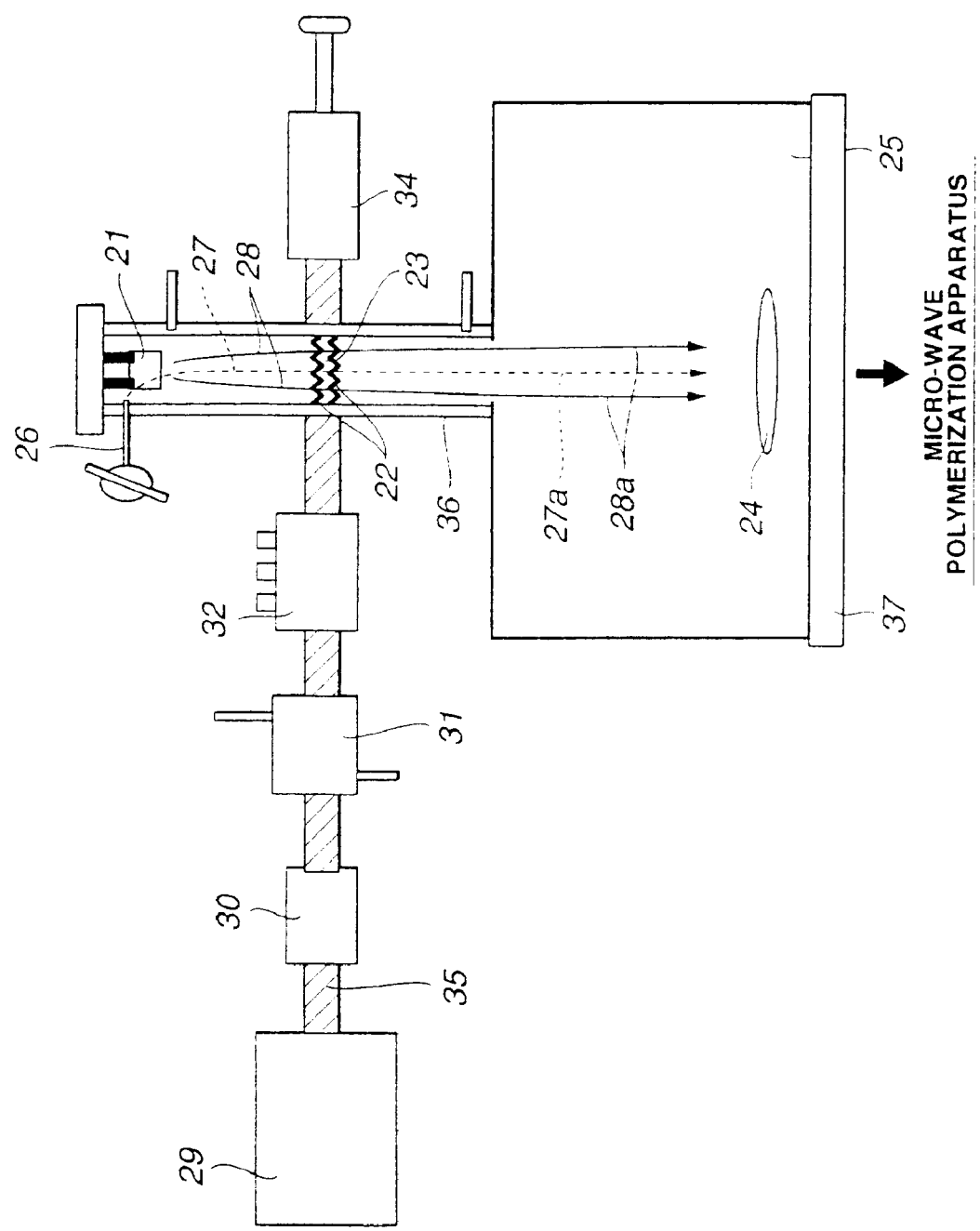
FIG. 37 shows an apparatus for producing a fullerene polymer film by the microwave polymerization method.

FIG. 37 shows a typical microwave polymerization apparatus including a vessel 21, such as a molybdenum boat, accommodating the fullerene molecules as a supply source of a starting material, a microwave operating portion 23 for causing the microwave 22 to operate on flying fullerene molecules, a reaction chamber 25 for generating a fullerene polymer by induction by the microwave 22 (excitation of asymmetric plasma) and for forming its film on the gas 24, and a microwave generating device for generating the microwave 22.

In an inner wall of the polymerization apparatus in the vicinity of the vessel 21 is opened a gas inlet tube 26 for introducing a carrier gas, such as an argon gas, into the inside of the apparatus. This carrier gas 27 has not only the capability of entraining fullerene molecules 27 to bring them onto the substrate 24 in the reaction chamber 25 but the capability of modifying the surface of the substrate 24 in the following manner.

That is, if, before introducing the fullerene molecules 28 into the inside of the apparatus, the carrier gas 27 is introduced and excited by the microwave operating portion 23 so as to be bombarded onto the surface of the substrate 24 in the reaction chamber 25, the substrate surface is etched by the excited carrier gas 27 to improve adhesion of the substrate surface with the fullerene polymer film deposited thereon.

The microwave generating device (microwave unit) includes a microwave oscillation source 29, an isolator 30, a power meter 31, a three-stub tuner 32 and a reflection cavity 34, interconnected by a wave guide tube 35. Of these, the microwave oscillation source 29 is made up of an oscillation source, such as a magnetron, whilst the isolator 30 and the power meter 31 have the functions of rectifying the microwave and of detecting the microwave power. The three-stub tuner 32 is a device for adjusting the number of oscillations of the microwave, having the function of matching the number of oscillations, whilst the reflection cavity 34 is a device for reflecting the microwave and matching the wavelength to convert the microwave in the microwave operating portion 23 into a standing wave.

The reaction chamber 25 may be larger in diameter than a resonant tube 36 which is a flow duct of the carrier gas 27 and the fullerene molecules 28, and is configured so that the fullerene molecules induced efficiently to high density in the microwave operating portion 23 of the resonant tube will be led onto a substrate 24 of e.g., silicon, provided on a support, not shown, where the fullerene polymer film will be formed uniformly. In the reaction chamber 25, there is provided an evacuating system 37 for maintaining a pre-set pressure in the reaction chamber 25.

The support for mounting the substrate 24 thereon may be electrically conductive or insulating. It may also be provided with heating means, such as current supplying means.

If this microwave polymerization device is to be used, the inside of the reaction chamber 25 is maintained at a pressure of approximately 0.05 to 1 Torr, with e.g., an argon gas, whilst the vessel 21 is heated by heating means, not shown, for vaporizing the fullerene molecules therein. The vaporized fullerene molecules then are illuminated with e.g., a high frequency plasma of the order of 13.56 MHz by the microwave operating portion 23. This excites the fullerene molecules to form a fullerene polymer film on the substrate 24.

The temperature of the substrate 24 of 300° C. or less usually suffices. If this temperature exceeds 300° C., the amount of deposition of the fullerene polymer film is occasionally lowered. It is noted however that deposition of the fullerene polymer film is facilitated by applying a bias voltage. No special control is needed to maintain the substrate temperature in the above range during film formation. For example, if the microwave power is of the order of 100 W, the temperature rarely exceeds 100° C. Meanwhile, if the substrate 24 is put on the microwave operating portion 23, the tel is occasionally increased to near 1000° C.

Method of Illuminating the Evaporated Film with Electromagnetic Wave

Figure 38A:
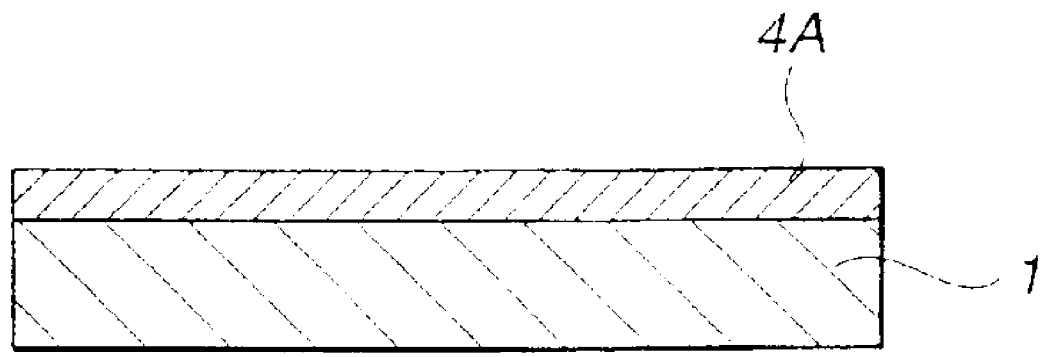
FIG. 38 is a schematic cross-sectional view showing a film-forming process of a fullerene polymer film by the vapor deposition film electromagnetic wave illumination method.
Figure 38B:
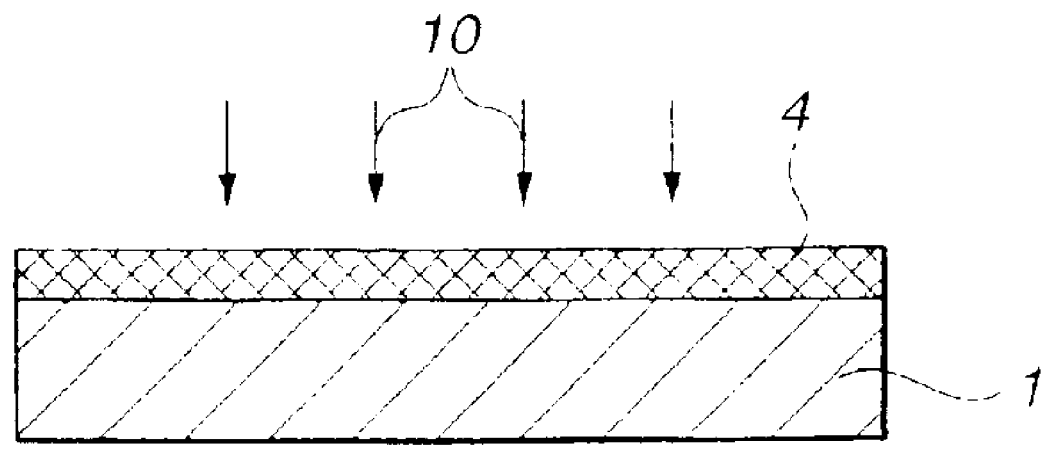
Figure 39:
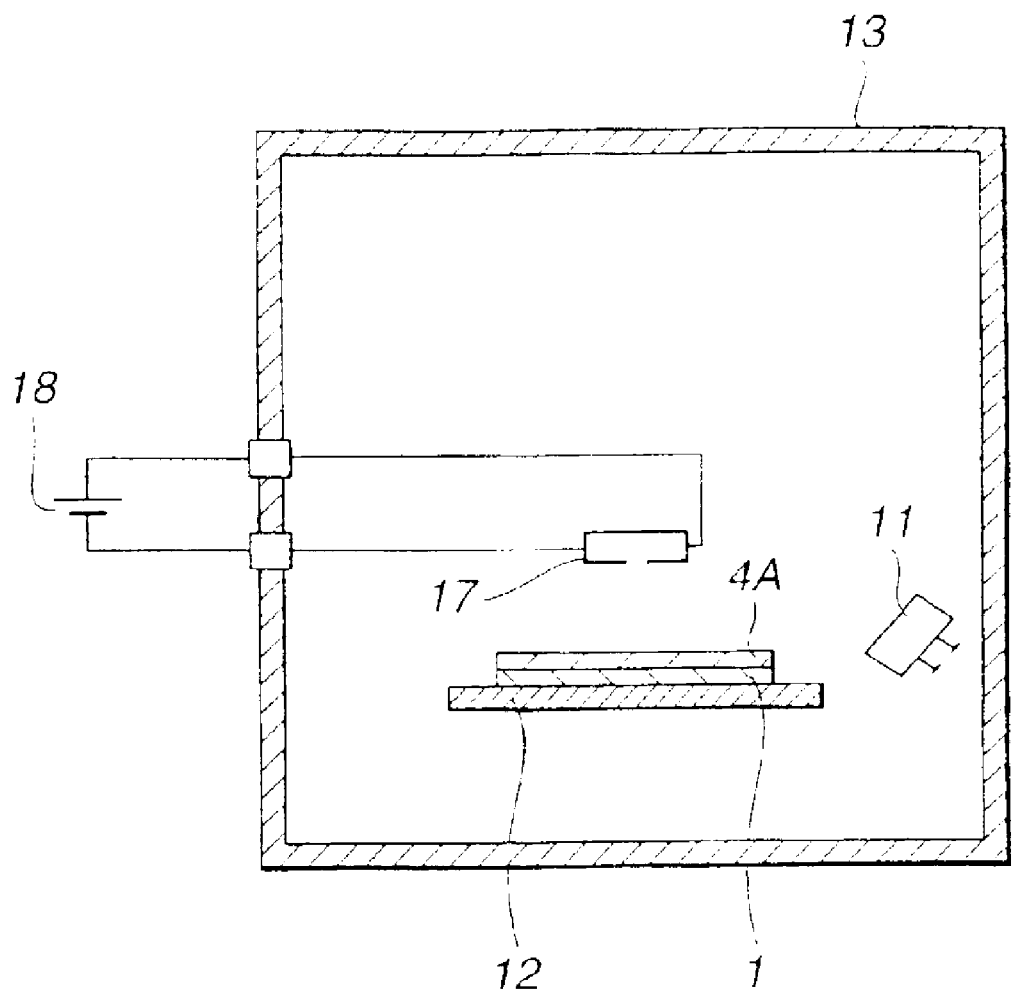
FIG. 39 is a schematic cross-sectional view of the fullerene vapor deposition device.

In this method, a vapor-deposited film 4A of fullerene molecules, such as those of $C_{60}$, is formed on the substrate 1, as shown in FIG. 38A. During this vapor deposition, the film thickness of the vapor-deposited film 4A is measured to control the film thickness to e.g., 10 Å (thickness of a single molecule) to 200 nm to execute vapor deposition. After forming the vapor-deposited film to a pre-set film thickness, the vapor-deposited film 4A is polymerized by illumination of the electromagnetic waves 10, such as RFplasma, as shown in FIG. 38B, to form the fullerene polymer film 4. The above-mentioned film thickness can be measured using a film thickness meter 11 arranged in vacuum chamber 13, as shown in FIG. 39.

Figure 8:
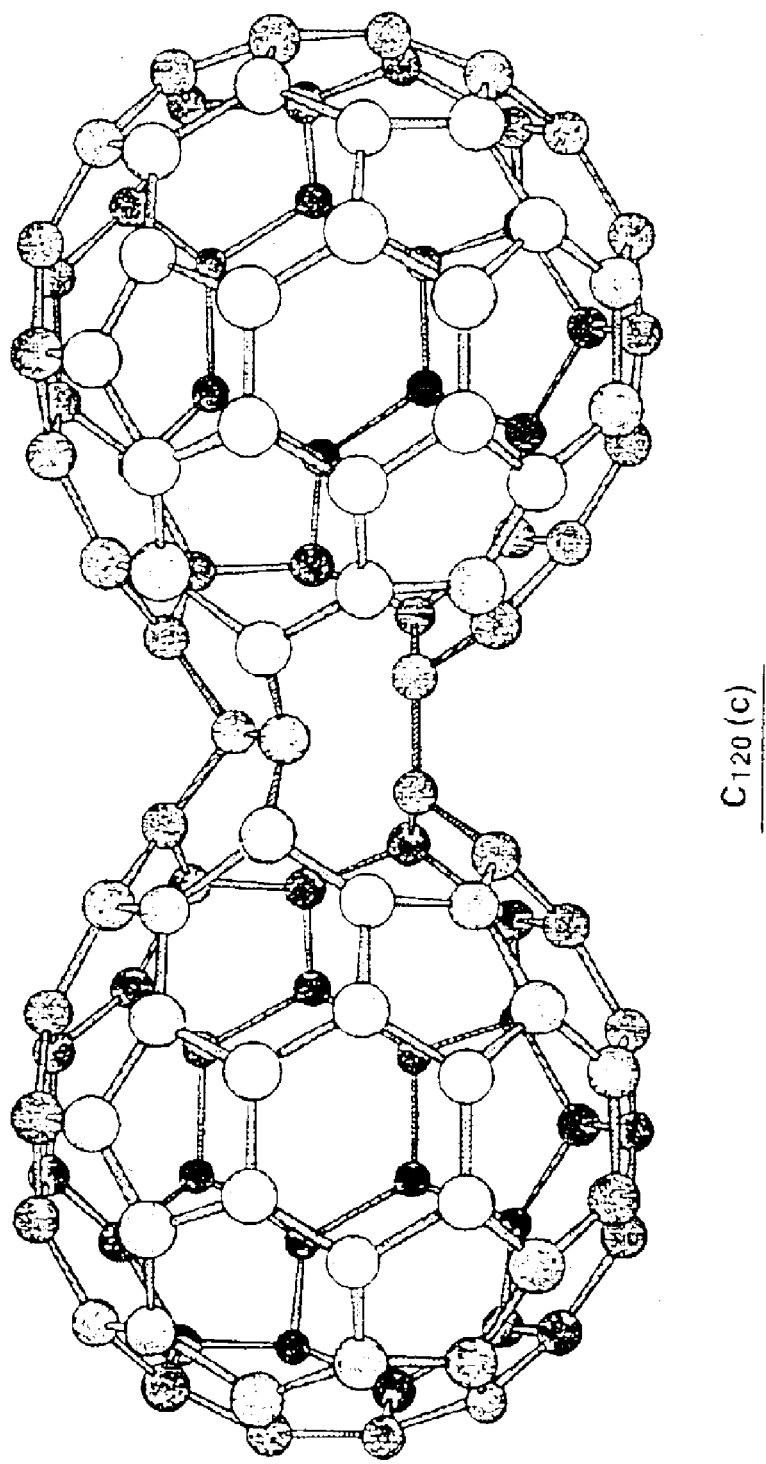
FIG. 8 shows still another dimeric structure of another $C_{60}$ molecule [$C_{120}$(c)].
Figure 9:
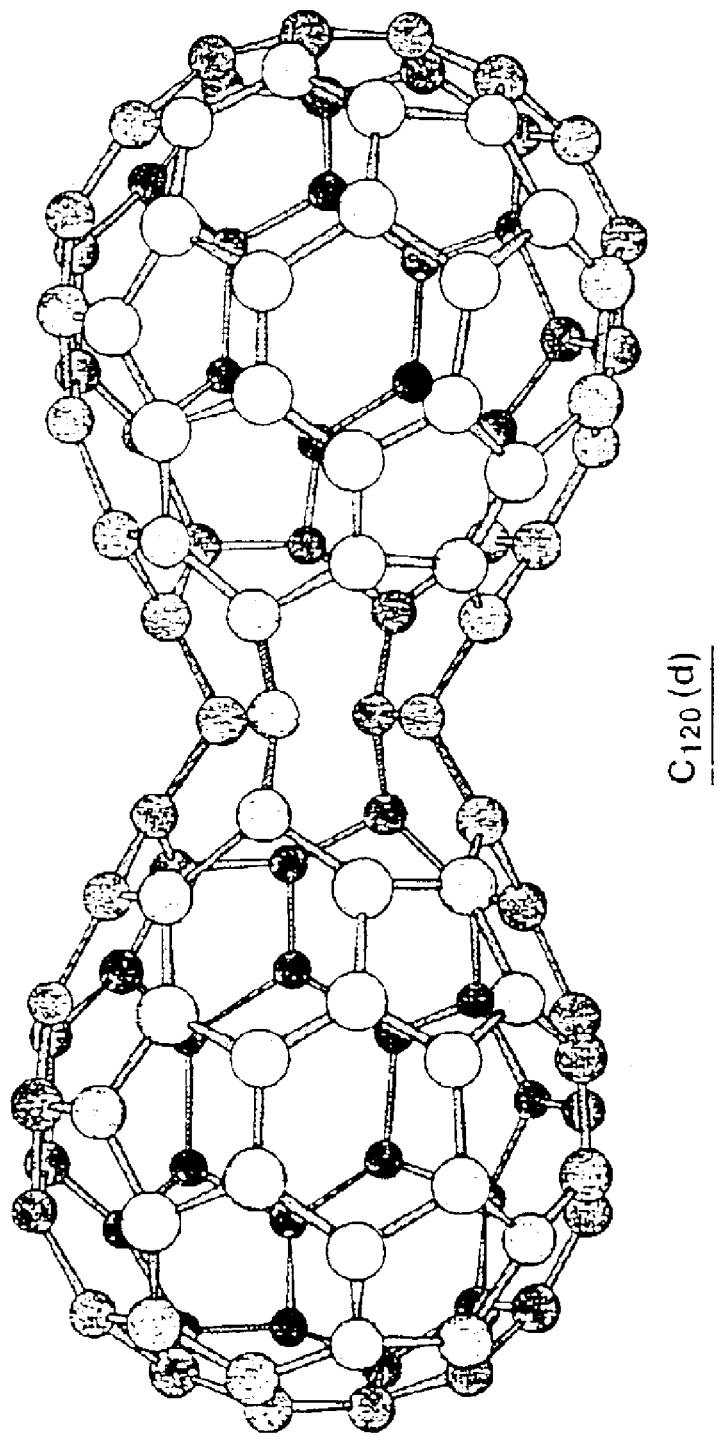
FIG. 9 shows yet another dimeric structure of another $C_{60}$ molecule [$C_{120}$(d)].
Figure 10:
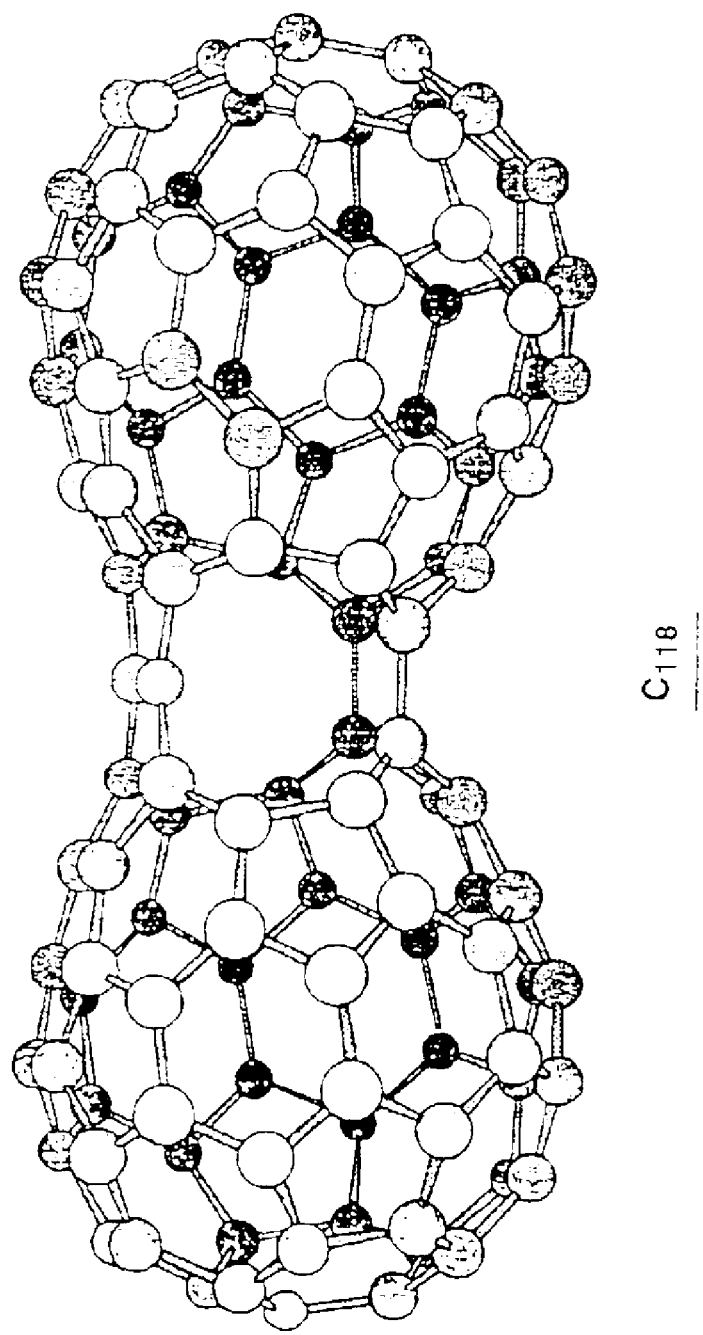
FIG. 10 shows a structure of a $C_{118}$ molecule.
Figure 11:
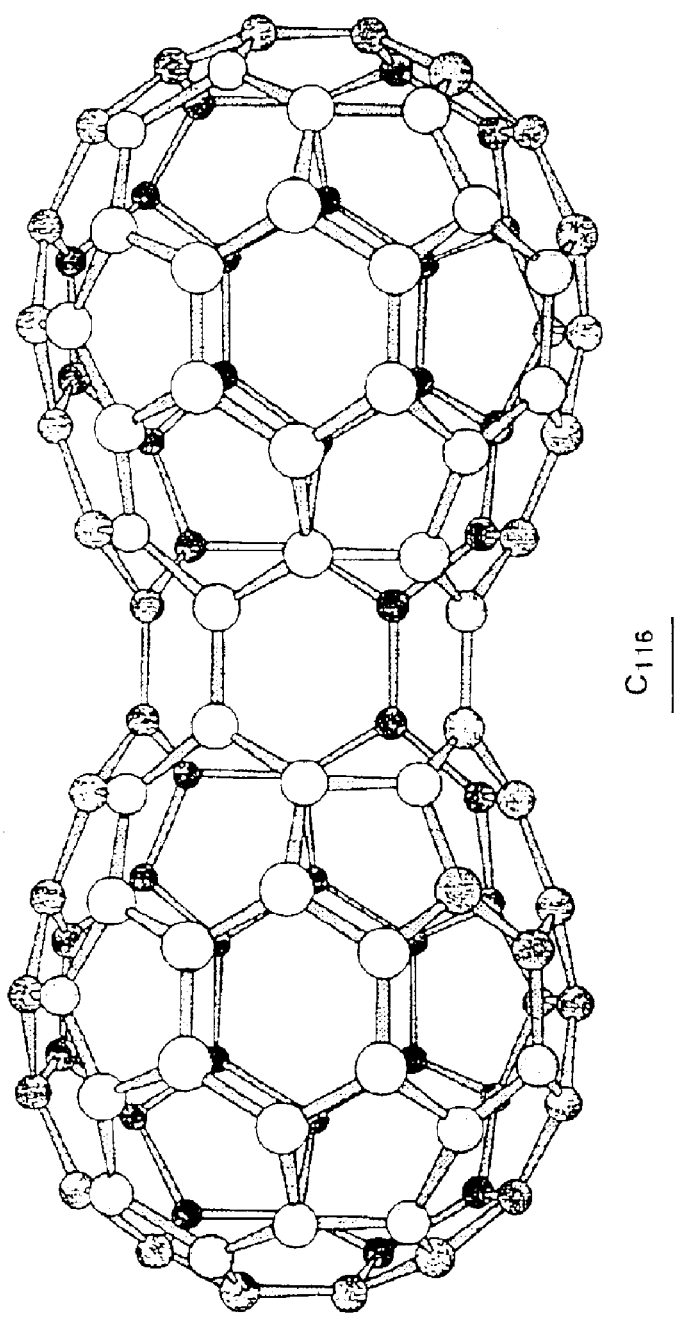
FIG. 11 shows a structure of a $C_{116}$ molecule.
Figure 12:
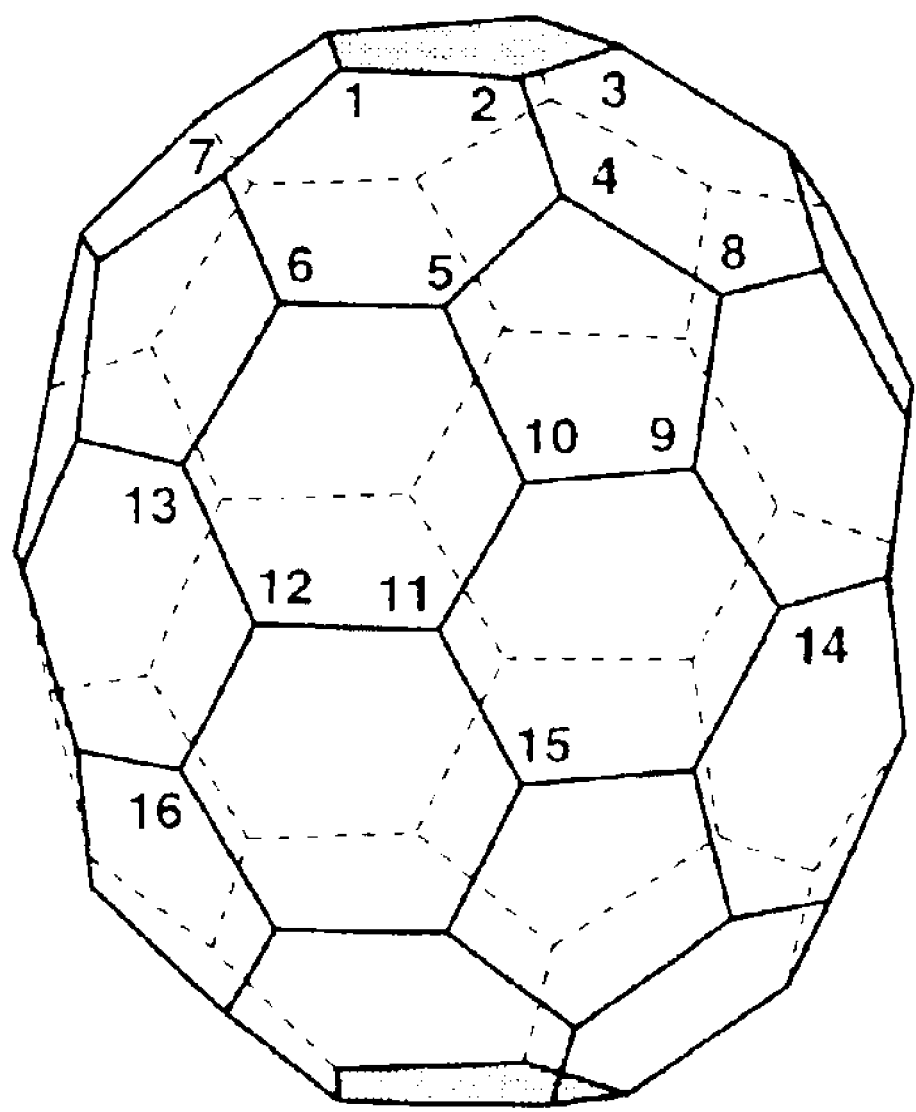
FIG. 12 shows a numbering system of a $C_{70}$ molecule.
Figure 13:
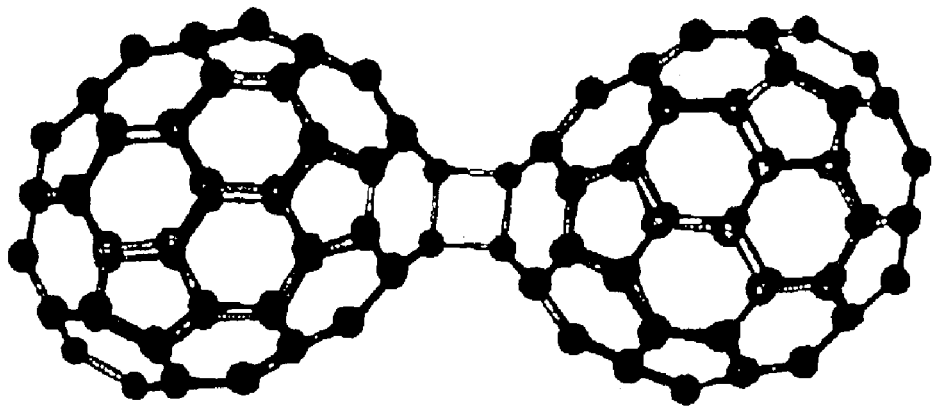
FIG. 13 shows a dimeric structure of a $C_{70}$ molecule.
Figure 14:
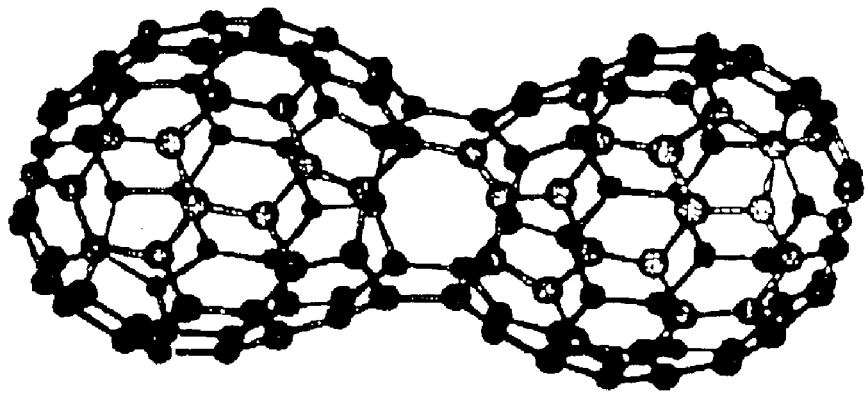
FIG. 14 shows another dimeric structure of a $C_{70}$ molecule.
Figure 16:
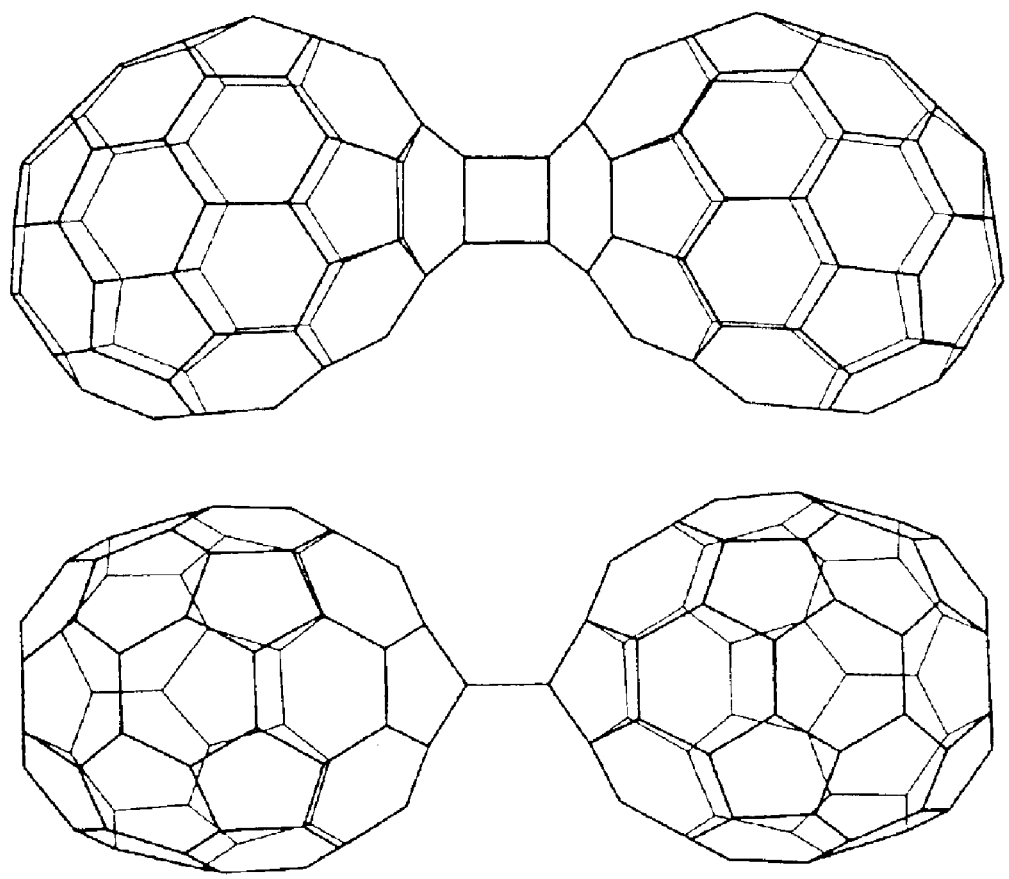
FIG. 16 shows still another dimeric structure of a $C_{70}$ molecule.
Figure 17:
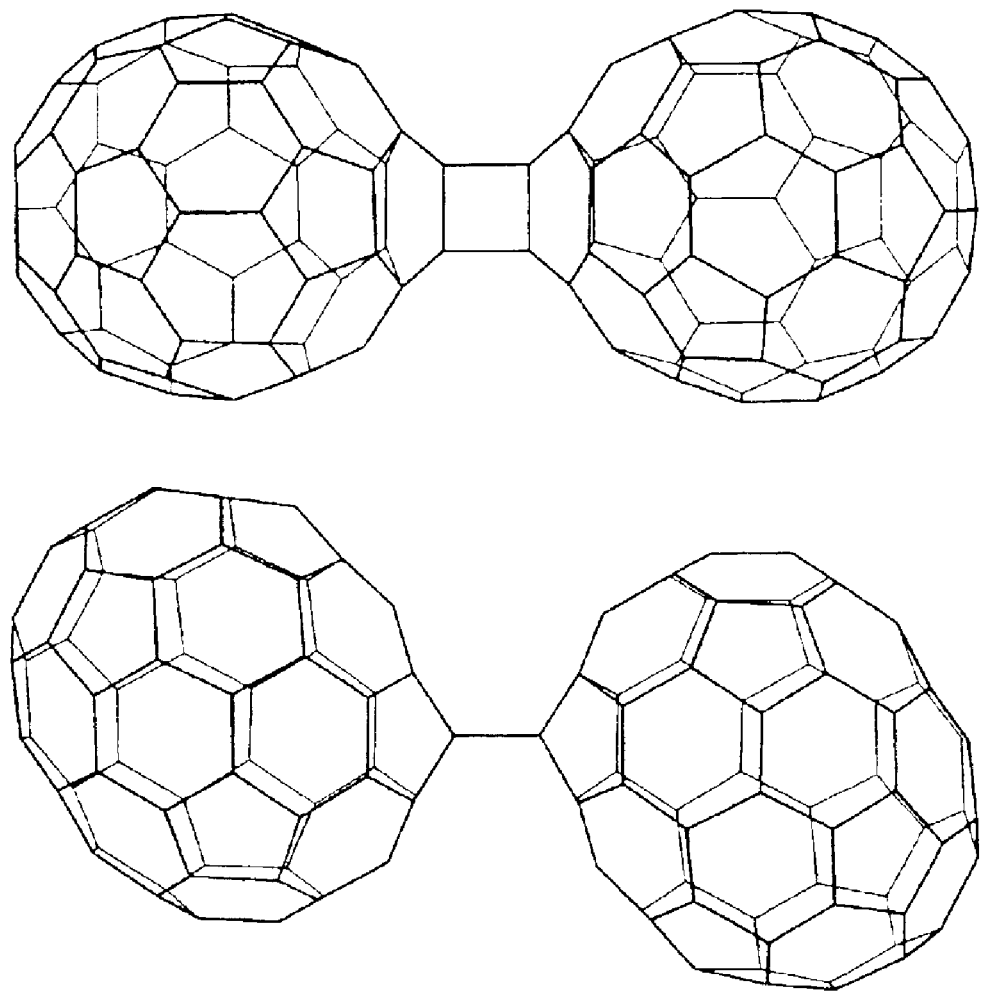
FIG. 17 shows still another dimeric structure of a $C_{70}$ molecule.
Figure 19:
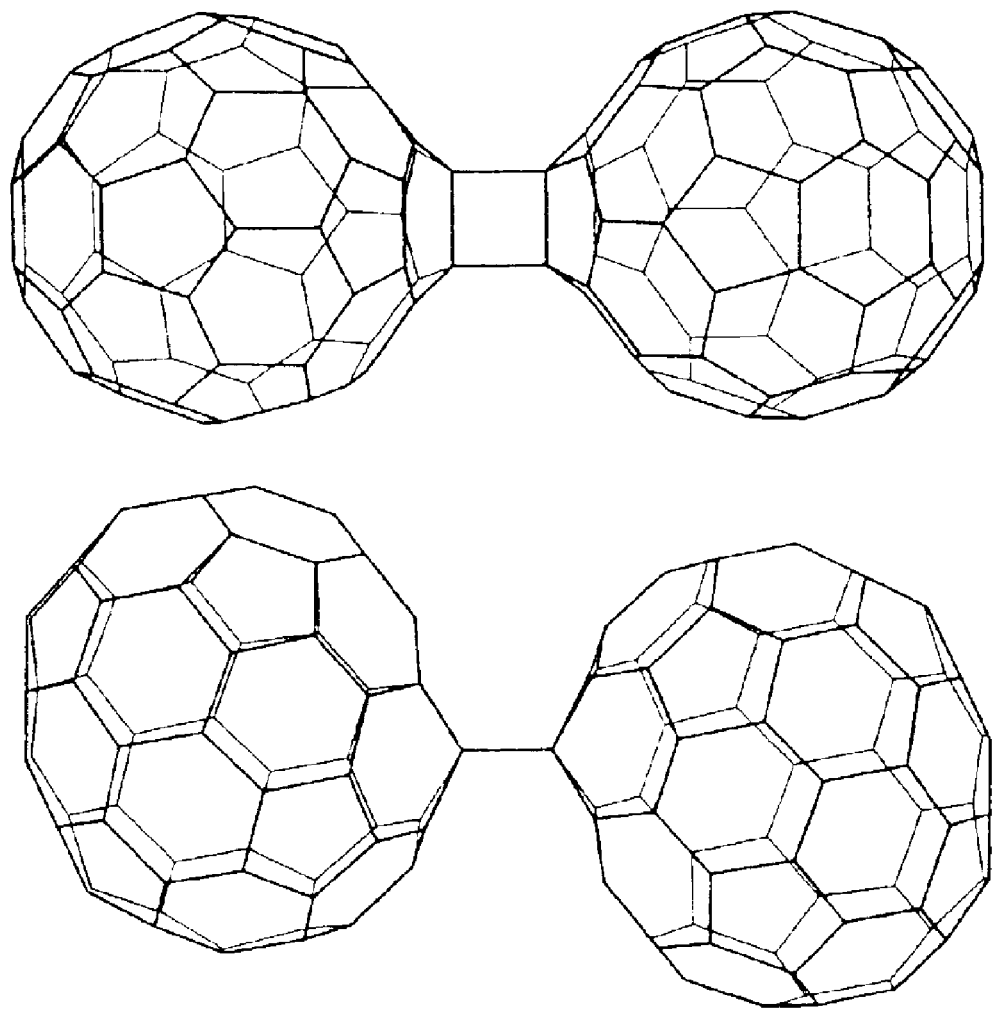
FIG. 19 shows still another dimeric structure of a $C_{70}$ molecule.
Figure 20:
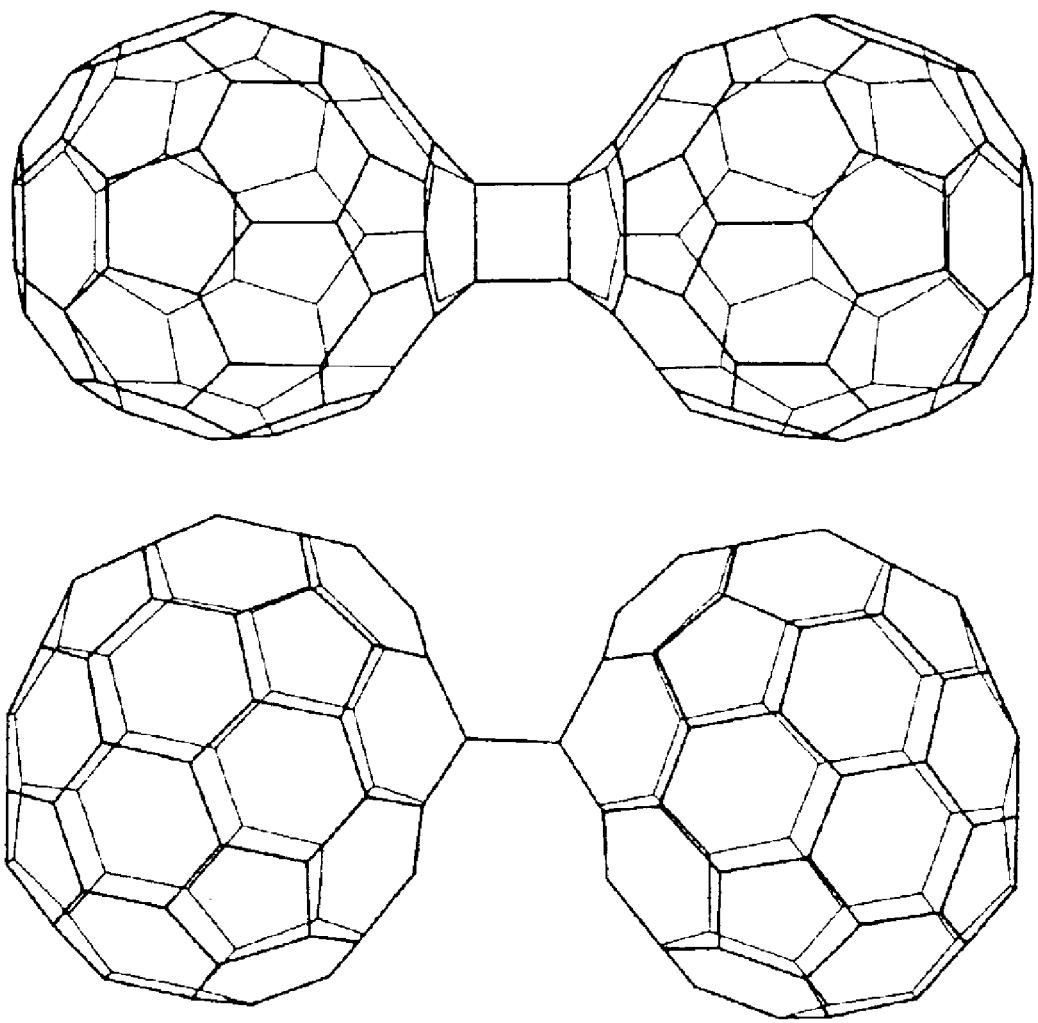
FIG. 20 shows still another dimeric structure of a $C_{70}$ molecule.
Figure 23:
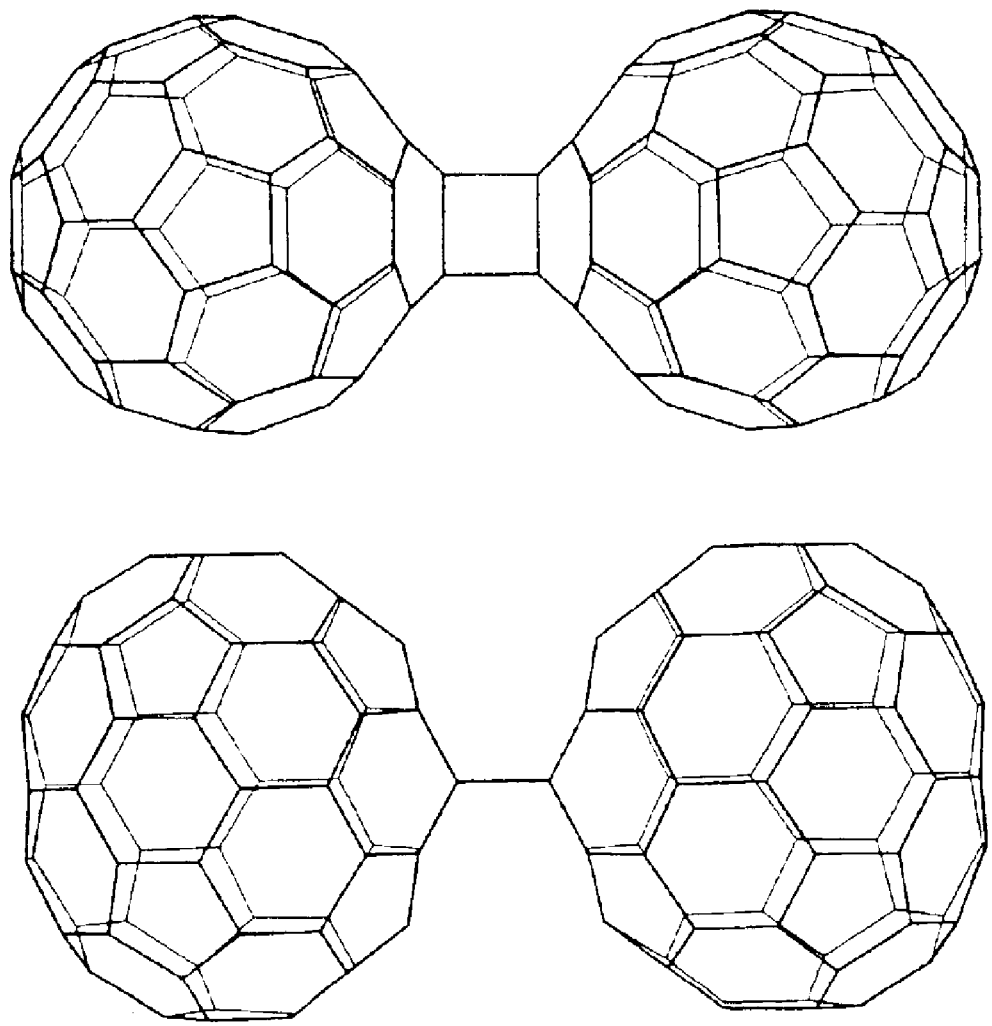
FIG. 23 shows still another dimeric structure of a $C_{70}$ molecule [$C_{140}$(i): D2h symmetrical].
Figure 27:
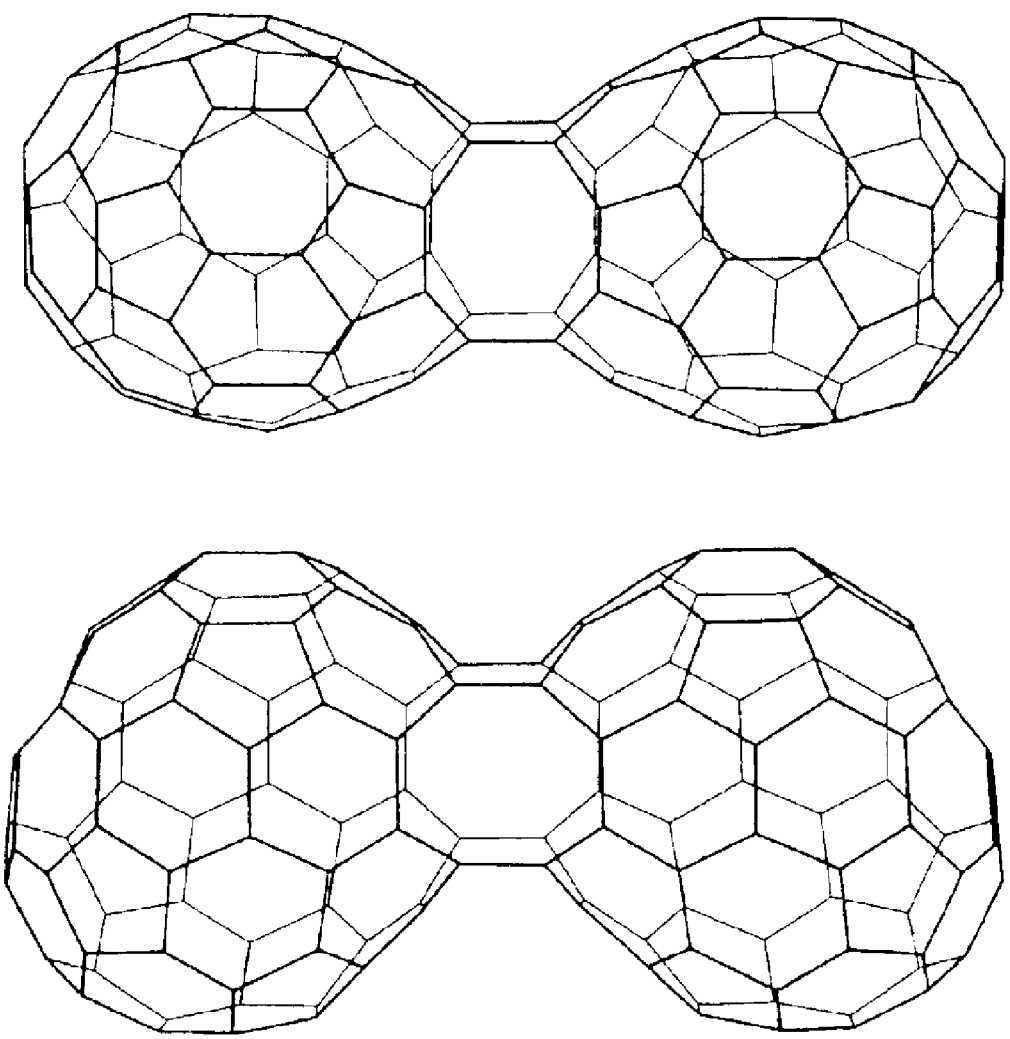
FIG. 27 shows still another dimeric structure of a $C_{70}$ molecule [$C_{136}$(d)].
Figure 28:
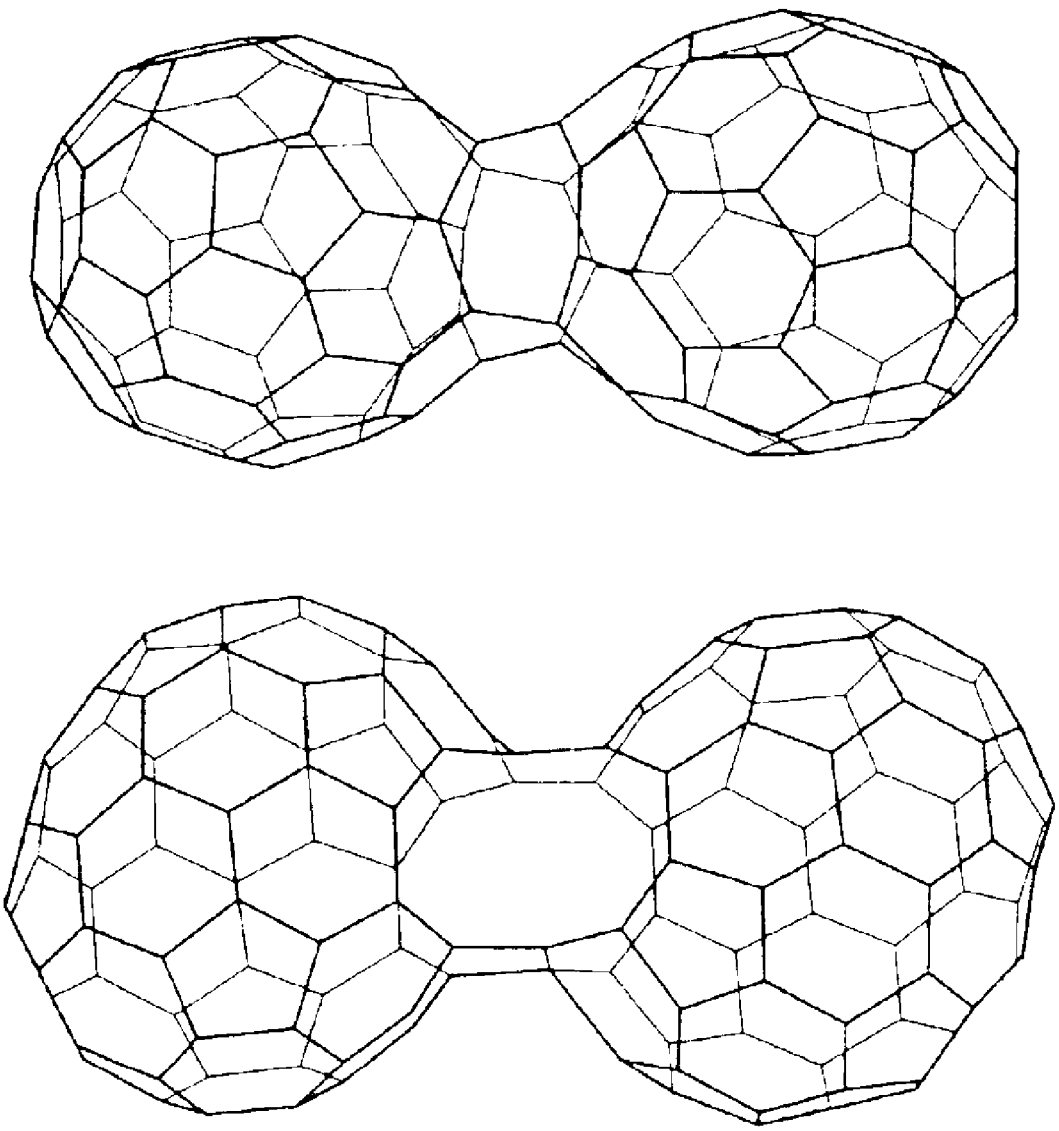
FIG. 28 shows still another dimeric structure of a $C_{70}$ molecule [$C_{136}$(e)].
Figure 29:
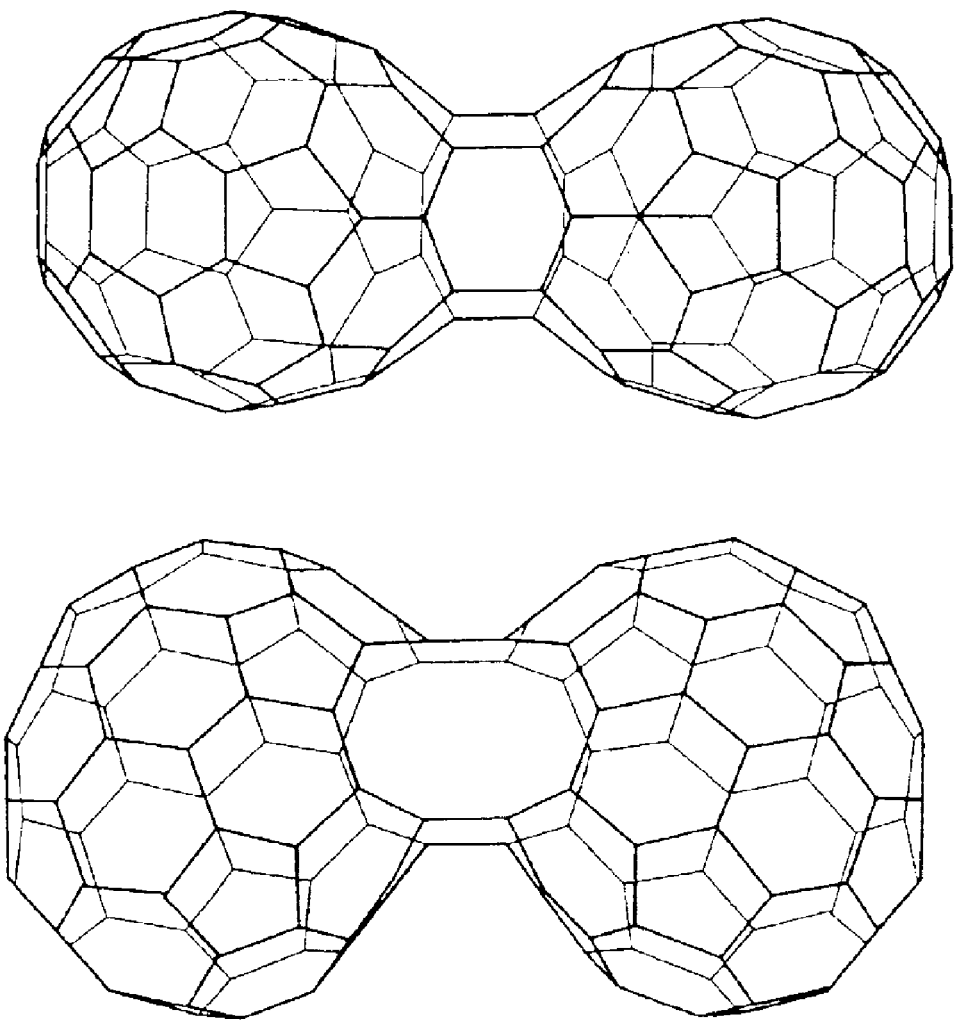
FIG. 29 shows still another dimeric structure of a $C_{70}$ molecule [$C_{136}$(f)].
Figure 31:
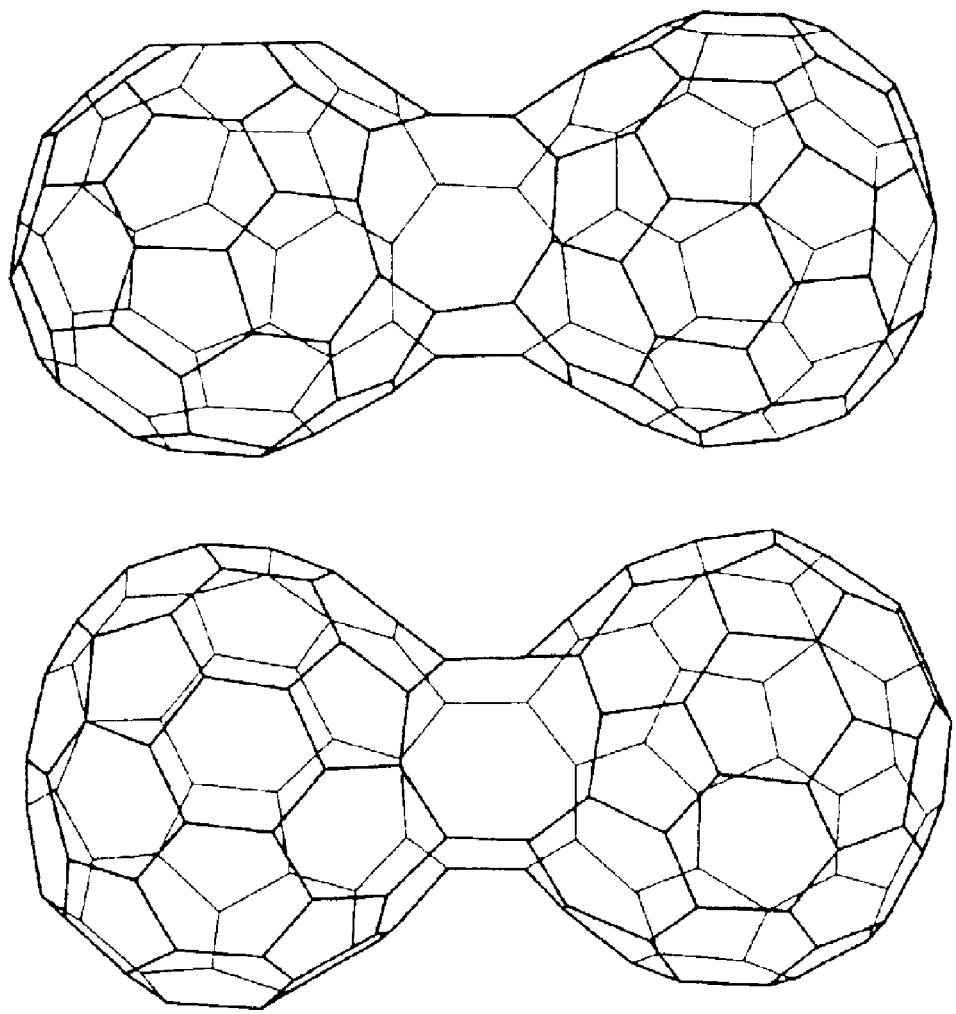
FIG. 31 shows still another dimeric structure of a $C_{70}$ molecule [$C_{136}$(h)].

FIG. 8 shows an evaporation device including a susceptor 12 arranged in the vacuum vessel 13. On the susceptor 12 is set a substrate on which to deposit an evaporated fullerene film. This substrate may, for example, be a substrate 1 on which the fullerene polymer film is to be deposited, that is the substrate on which the electrically conductive high molecular film has been formed on a light-transmitting electrode.

In the vacuum vessel 13 is arranged a vessel 17, such as a molybdenum boat, for accommodating fullerene molecules as a starting material therein. This vessel is connected to an external resistance heating power source 18.

In the evaporation device, constructed as described above, the current is supplied to the vessel 17 in the evacuated vacuum vessel 13, to heat the vessel to vaporize the fullerene molecules therein to form an evaporated fullerene film of fullerene 4A on the substrate 1.

Figure 40:
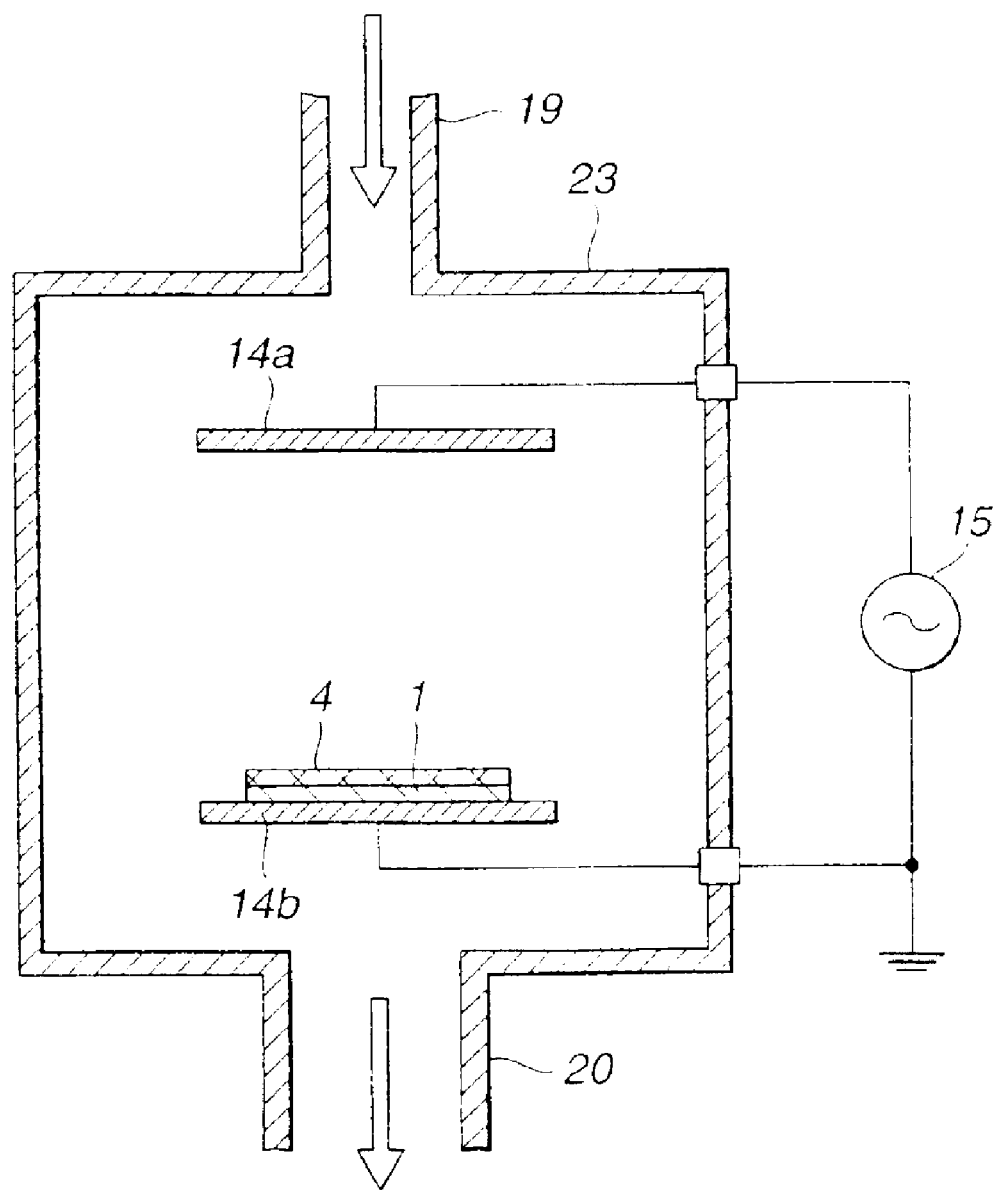
FIG. 40 is a schematic cross-sectional view showing a plasma polymerization device for polymerization of the fullerene polymer film.

Then, in a high frequency plasma polymerization apparatus of FIG. 40, in which a pair of electrodes 14a, 14b are arranged facing each other in a vacuum vessel 23 and are connected to an external high frequency power source 15, the substrate 1, carrying the evaporated fullerene film 4A, set on the electrode 14b.

In this polymerization apparatus, a low pressure inert gas, such as argon, is supplied into the vacuum vessel 23, evacuated through the exhaust port 20, to fill the inside of the vacuum vessel 23 with the gas. The high frequency voltage is applied from the high frequency power source 15 to generate a high frequency plasma across the electrodes 14a and 14b, at the same time as the evaporated fullerene film 4A is illuminated and thereby polymerized to form a fullerene polymer film 4 having the π-electronic skeleton.

The high frequency power source 15 may be replaced by a DC power source (direct current plasma method). If the devices of FIGS. 8 and 40 are combined as shown in FIG. 38, and the vessel 17 is heated without driving the power source 15, that is without generating the plasma, the evaporated fullerene film 4A is formed on the substrate 1. The power source 15 may be driven in the same apparatus to effect polymerization in a manner as described above.

The fullerene molecules may be $C_{60}$ or $C_{70}$, either alone or as a mixture. As the electromagnetic waves, an RF plasma, UV rays or an electron ray may be used.

Electrolytic Polymerization Method

FIG. 41 shows a typical electrolytic polymerization apparatus in which an electrode 39 as a positive electrode and an electrode 40 as a negative electrode, both connected to a potentiostat 41, are provided in an electrolytic cell 38, and in which a reference electrode 42 is connected to the same potentiostat 41 so that a pre-set electric potential is applied across the electrodes 39 and 40.

The electrolytic cell 38 is provided with a gas inlet tube 45 for introducing the inert gas 44 for removing an oxygen gas etc from a non-aqueous solvent 43. In a lower portion of the electrolytic cell 38, there is provided a magnetic stirrer 46 for causing movement of a stirrer, not shown, provided in the cell.

For operating the electrolytic polymerization apparatus, constructed as described above, fullerene molecules, as starting material, a supporting electrolyte, for accelerating electrolysis, and the non-aqueous solvent 43, are charged into the electrolytic cell 38 and the potentiostat 41 is operated to cause a pre-set electrical energy to operate across the electrodes 39, 40. Then, a majority of the fullerene molecules are turned into anionic radicals, whilst a fullerene polymer is formed as a precipitate as a thin film and/or a precipitate on the negative electrode 40. Meanwhile, the spherically-shaped fullerene polymer, obtained as a precipitate, can be readily recovered by filtration or drying. After recovery, the polymer can be solidified or kneaded into a resin to form a thin film.

Although the electrodes 39, 40 are preferably metal electrodes, they may also be formed of other electrically conductive materials, or by vapor depositing metal or other electrically conductive materials on a silicon or glass substrate. The materials of the reference electrode 42 need not be limited to particular metals, depending on the sort of the supporting electrolyte.

The removal of e.g., oxygen by the inert gas 44 may usually be helium gas bubbling. The helium gas may also be replaced by other inert gases, such as nitrogen or argon. For completely removing oxygen etc, it is advisable to dehydrate the non-aqueous solvent, composed of first and second solvents, as later explained, using a dehydrating agent, to evacuate the solvent, to save the respective solvents in ampoules and to introduce the solvents saved in the ampoules through a vacuum line into the electrolytic cell 38.

It should be noted that oxygen etc is removed from the electrolytic solution in order to prevent oxygen etc from being captured into the fullerene polymer film to suppress paramagnetic centers to improve stability of the fullerene polymer film.

As the supporting electrolyte, tetrabutyl ammonium perchloride, lithium tetrafluoro borate ($LiBF_4$), lithium hexafluoro phosphate ($LiPF_6$), sodium peroxide ($NaClO_4$), $LiCF_3SO_3$, and lithium hexafluoro arsenide ($LiAsF_6$) may be used. If these supporting electrolytes are used, the produced spherical carbon polymers tend to be precipitated in the electrolytic solution.

If lithium perchloride ($LiClO_4$) or tert-butyl ammonium perchlorate is used, a spherically-shaped carbon polymer can be produced as a thin film on the electrode, depending on the temperature at the time of the electrolytic polymerization reaction.

According to the present invention, a mixed solvent composed of a first solvent, capable of dissolving fullerene molecules, and a second solvent, capable of dissolving the supporting electrolyte, is preferably employed. The mixing ratio of the first solvent to the second solvent is preferably 1:10 to 10:1 in volume ratio.

The first solvent is preferably a solvent of lower polarity, having a π-electronic system (low polarity solvent). Examples of this sort of the solvent include one or more selected from the group of carbon disulfide ($CS_2$), toluene, benzene and o-dichlorobenzene.

The second solvent is preferably an organic solvent having a high dielectric constant, such as, for example, acetonitrile, dimethyl formamide, dimethyl sulfoxide and dimethyl acetoamide. Of these, acetonitrile is most preferred.

In general, the fullerene molecules are dissolved only in low-polar solvent, such as carbon disulfide, while being extremely low in solubility even in aliphatic solvents, such as n-hexane. This is the most serious problem in electrolytic polymerization of the fullerene molecules.

The reason is that the supporting electrolyte used in electrolytic polymerization is dissolved only in polar solvents, such as water.

In carrying out electrolytic polymerization of the fullerene molecules, it is necessary to use such a solvent as is capable of dissolving both the fullerene molecules and the supporting electrolyte. However, there lacks a single solvent satisfying this condition. At least a mixed solvent made up of individual solvents having the above-mentioned dissolving properties needs to be used.

However, mixed solvents satisfying these conditions may not unconditionally be used. If such mixed solvent simply is used, it is a frequent occurrence that the solvent is insufficient in solubility for the fullerene molecules and/or the supporting electrolyte.

For example, an aqueous solvent, including water, is known to be an optimum solvent for the supporting electrolyte which is a salt. However, it is only insufficiently soluble in the low-polar solvent capable of dissolving fullerene molecules. Therefore, the mixed solvent composed of the two solvents cannot be said to be optimum.

Our researches have revealed that the desirable mixed solvent used in the present invention is made up of the first and second solvents, with the first solvent being a low polar solvent and the second solvent being an organic solvent of high polarity and large dielectric constant.

Among the above-specified second solvents, acetonitrile, a solvent frequently used in preparing radicals of an organic matter in the presence of a supporting electrolyte in an electronic cell, is most preferred.

It is however unnecessary to use this acetonitrile as the second solvent in limiting manner since dimethyl formamide or other organic solvents are also desirably used in the present invention.

The fullerene polymer film, produced as described above, is formed on a silicon or glass substrate, a transparent electrically conductive substrate of, for example, ITO, or on a metal substrate of gold, platinum or aluminum formed by vapor deposition or sputtering on a substrate of silicon or glass. There are occasions wherein the fullerene polymer film is formed on a so-called comb-shaped electrode obtained on vapor deposition or sputtering of gold, platinum or aluminum using a mask, or wherein the fullerene polymer film is sandwiched between two electrodes. For producing such structure, it suffices if a fullerene polymer film is formed to a desired thickness on a metal electrode formed on a glass or silicon substrate or on a transparent electrode formed e.g., of ITO, a mask is placed on the fullerene polymer film and a layer of metals such a gold, platinum or aluminum, or a transparent electrically conductive layer of, for example, ITO, is formed thereon by e.g., sputtering or vapor deposition.

On the surface of the fullerene polymer film, obtained by the above-mentioned different polymerization methods, partial fullerene molecular structures are left, so that there exist numerous bonds, of the double bond. Therefore, surface modification (surface processing) in a variety of ways is possible.

For example, the fullerene polymer film can be surface-modified, using techniques such as microwave induction, DC plasma or AC plasma, in an atmosphere of a hydrocarbon gas, such as acetylene, methane, ethane, propane, toluene, benzene, acetone, acetonitrile, ethanol or methanol, or a gas, such as oxygen, hydrogen, chlorine or fluorine. Alternatively, the fullerene polymer film may be surface-modified in a solvent using metal complex compounds or organic radicals.

This surface modification is effective to modify the fullerene polymer film or to afford specificity thereto depending on the objective or application.

Meanwhile, the fullerene polymer film, in particular the fullerene polymer film obtained by the microwave polymerization method, suffers the problem of dangling spin. If, for example, microwave polymerization is carried out at ambient temperature with a power of from 100 W to hundreds of W, using $C_{60}$ and/or $C_{70}$ as a starting material, there is produced a fullerene polymer film containing approximately $10^{18}$ spins/g of dangling spin.

This dangling spin significantly affects the electrically conductivity of the fullerene polymer film, band structure or chronological stability of the physical properties.

This dangling spin is possibly produced by the fact that no ideal cross-linked structure has not been formed. The amount of the dangling spin can be reduced to some extent by adjusting the substrate temperature for depositing the fullerene polymer film or by exposing the film to an atmosphere such as a hydrogen plasma. The process of decreasing the amount of the dangling spins may be confirmed from the difference in the absorption intensity by the electron spin resonance method.

According to the present invention, a counter-electrode needs to be formed, as an additional step, on a layered assembly comprising a light-transmitting electrode— electrically conductive high polymer film—fullerene polymer film or a light-transmitting electrode—fullerene polymer film—electrically conductive high polymer film, obtained by the above respective steps.

This counter-electrode is formed of metals, such as aluminum, magnesium or indium, or an alloy of two or more of these metals, in addition to oxides, such as ITO, and may be formed as a thin film on the fullerene polymer film by techniques such as vapor deposition, sputtering, electron guns or electrolytic plating.

In the heterojunction structure of the present invention, obtained in this manner, in which the electron-donating electrically conductive high molecular material and an electron-accepting fullerene polymer film are layered between the electrodes, charge separation may occur by light induction.

According to the present invention, it is crucial to identify the fullerene polymer film and to form the remaining structural layers subsequently during the step of forming each layer of the heterojunction structure.

That is, the information on the structure, polymerization degree, amorphization, oxidation and dielectric breakdown is obtained by spectroscopically analyzing the fullerene polymer film using in particular the Raman method and the Nexafs method.

Figure 43:
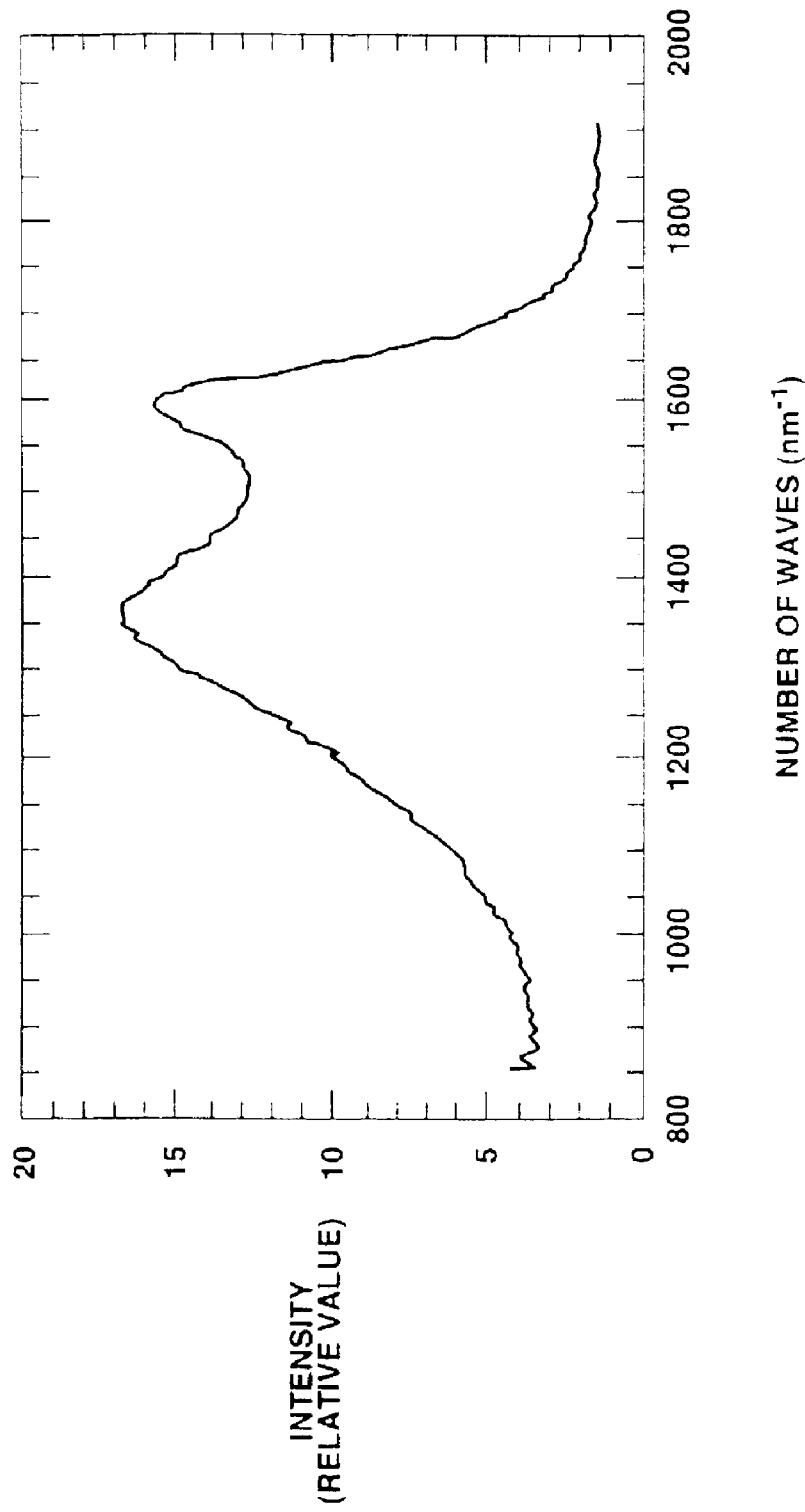
FIG. 43 shows the Raman spectrum of amorphous carbon.

In general, the Raman spectrum is frequently used in the spectroscopic analysis of the carbon thin film. This method analyses the vibrations based on changes in the polarizability caused by irradiation of electromagnetic waves. This method is used frequently because the carbon material tends to absorb the IR rays to render measurement difficult. As an example, FIG. 43 shows the Raman spectrum of amorphous carbon obtained with the CVD method at a lower temperature. An excitation source is an argon ion laser at 514.5 nm.

The spectrum of FIG. 43 reflects the features of the amorphous carbon film sufficiently despite difference in line width. Two characteristics bands are observed in the vicinity of 1350 $cm^{-1}$ and 1600 $cm^{-1}$, these being termed a disorder band and a graphitic band, respectively.

If the fullerene polymer film is formed, and the above-described Raman spectrum is produced, it may be estimated that changes have been produced in the amorphous carbon structure rather than the fullerene polymer. If a 1350 cm band is observed to a more or less extent, it may be premeditated that the intermolecular cross-linking structure is insufficient, or that there exist many dangling structures.

In general, the Raman spectrum of the $C_{60}$ polymer having a periodic structure is known to have many characteristic bands (see T. Wagberg et al., Appl. Phys. A, 64,233 (1997), A. M. Rao et al., Phys. Rev. B. 55,4766 (1997)).

However, as for the Raman spectrum of a randomly interconnected polymer, such as one obtained by the plasma polymerization method or the electrolytic polymerization method, there has been given no definite standard for judgment.

On the other hand, the Nexafs spectrum observes transition from the core electron (1s electron) of the carbon atom of the thin carbon film to the unoccupied orbitals and has so far been used for evaluating the unoccupied orbitals or density of the conducting band of an organic high molecular thin film.

The present inventors have found that more definite identification of the fullerene polymer, which has so far not been possible, can be achieved only by using the Raman methos and the Nexafs method in combination.

The present invention will be explained more specifically in reference to illustrative Examples which are not intended to limit the scope of the invention.

EXAMPLE 1

Measurement of Fermi Level of the Light-transmitting Electrode (ITO Thin Film)

Figure 44:
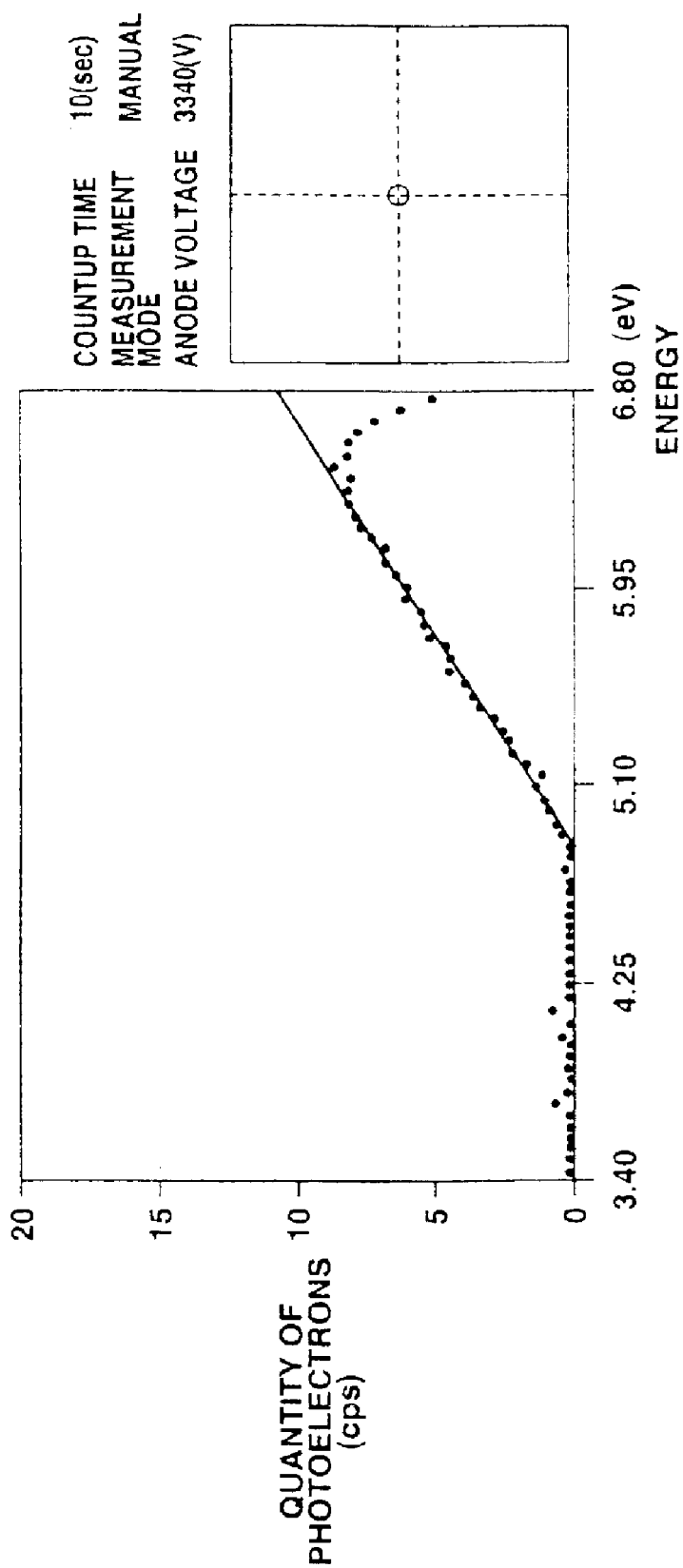
FIG. 44 shows Fermi level of an ITO thin film.

An ITO thin film was formed by sputtering on a commercial quartz glass to form a light-transmitting electrode and measurement was made of the PES (photoelectron emission spectroscopy) to evaluate the Fermi surface level of the ITO thin film. The results are shown in FIG. 44.

It was seen from the measured results that the Fermi level of the ITO thin film present at 4.87 eV below vacuum.

EXAMPLE 2

Figure 45:
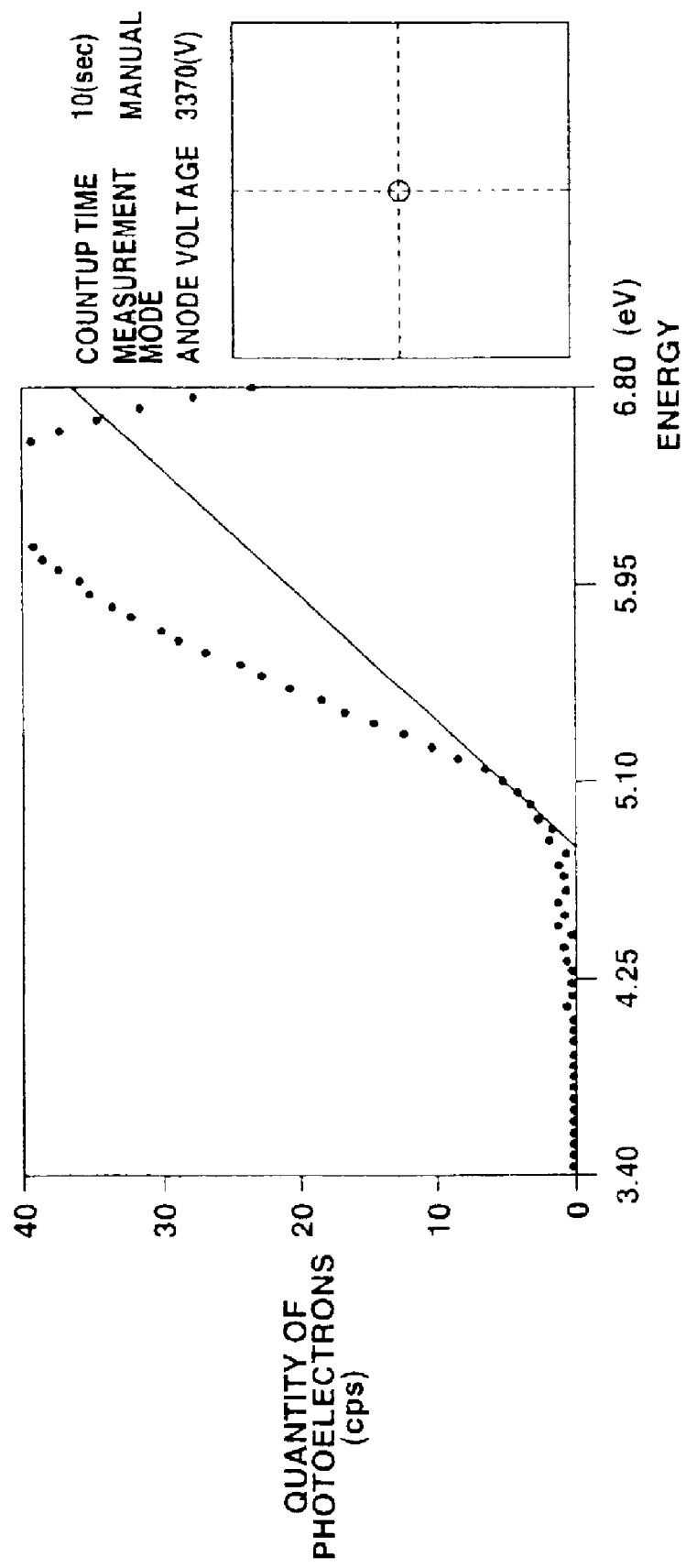
FIG. 45 shows the results of PES measurement of a polythiophene thin film.

Formation of Polythiophene Thin Film (Electrically Conductive Organic Film) and Measurement of Physical Properties Thereof On this ITO film was then formed a commercial polythiophene thin film having a sulfur radical as a dopant. The measured results of the PES of this polythiophene thin film are shown in FIG. 45.

It was seen from the above results that the valence band edge level of the polythiophene thin film exists at 4.82 eV below vacuum.

Figure 46:
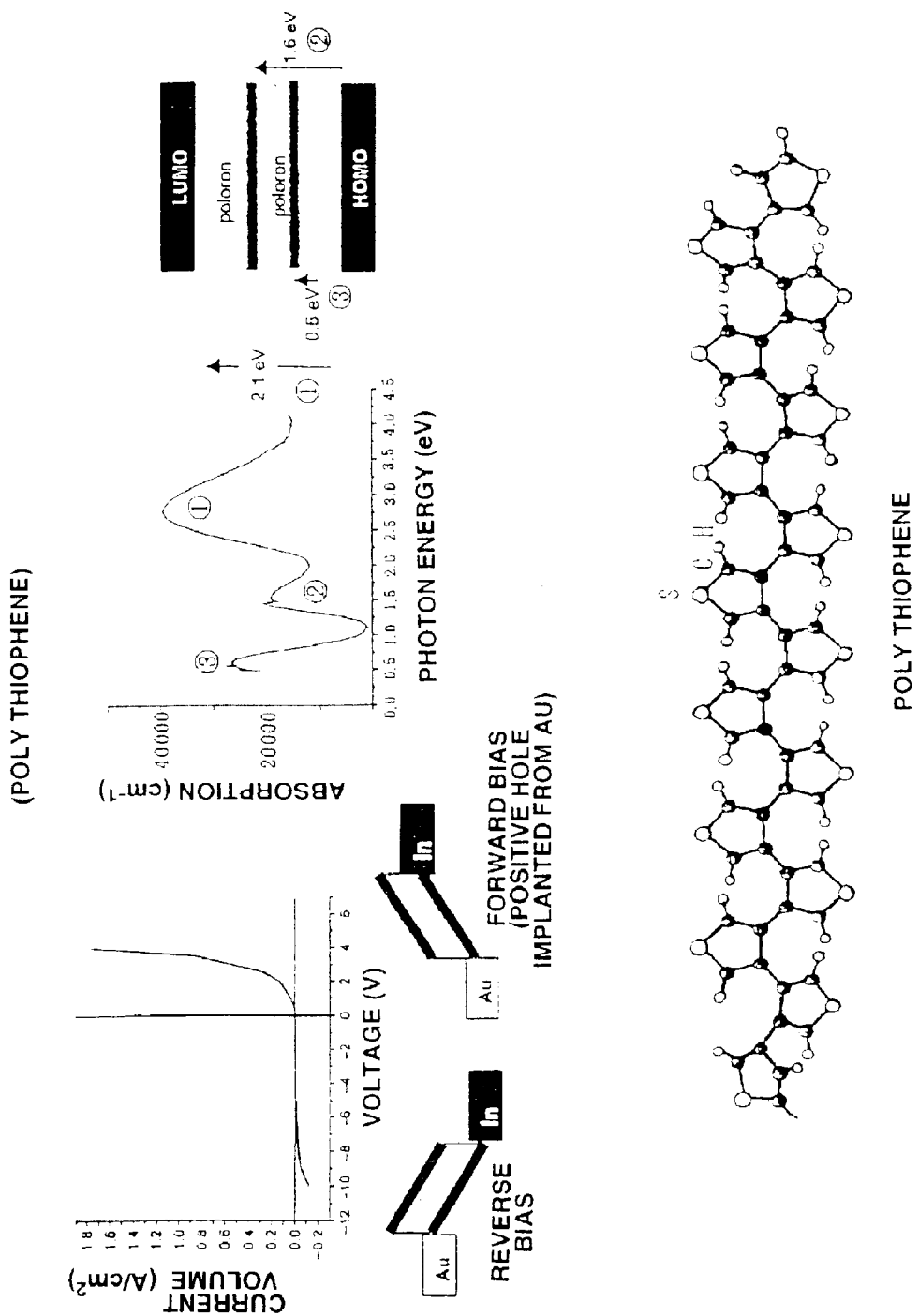
FIG. 46 shows diode characteristics of the polythiophene thin film.

Moreover, a polythiophene thin film was also formed on the quartz glass and measurement was made of the current-voltage characteristics thereof. FIG. 46 shows the measured results of the V-I characteristics and absorption coefficients by the light quantum energy.

A polythiophene thin film was formed on each of an ITO thin film and on a metal film. First, the Fermi level of the ITO and gold was measured by the photoelectron emission method and, based on the measured value, the Fermi level of the polythiophene thin film was measured by the contact potential method.

As a result, it was found that the Fermi level of the polythiophene thin film, formed on the ITO thin film, was 4.4 eV, whereas that of the polythiophene thin film, formed on a gold thin film was 4.5 eV, which was close to 4.4 eV.

EXAMPLE 3

Formation of a Fullerene Polymer Film and Measurement of Various Physical Properties A fullerene polymer film then was formed on the above-mentioned polythiophene thin film.

First, fullerene molecules, as a starting material, was prepared in the following manner. In an apparatus shown in FIG. 35, arc discharge was effected by the 150 A direct current in an atmosphere of 100 Torr of helium, using a graphite rod 35 cm in length as a positive electrode. After fullerene was substantially vaporized to produce the fullerene containing soot, the polarities of the two electrodes were reversed and deposited heaped on the inherent negative electrode, such as carbon nanotubes, were further vaporized to produce the soot. The soot heaped in a water-cooled reaction vessel was recovered by a sweeper to produce crude fullerene by extraction with toluene. This crude fullerene was washed with hexane, dried and purified by sublimation in vacuum. The fullerene molecules, thus produced, were subjected to time-of-flight mass spectrometry. It was thus found that the fullerene molecules contained $C_{60}$ and $C_{70}$ at a rate of approximately 9:1.

Micro-Wave Polymerization

For forming a fullerene polymer film, fullerene molecules were charged into a molybdenum boat and set on a site of a reaction tube of a micro-wave polymerization device shown in FIG. 37. After evacuating the interior of the reaction chamber by a molecular turbo-pump, the argon gas started to be introduced. When the inside of the reaction chamber is constant at 0.05 Torr, a micro-wave oscillation device was actuated to set a micro-wave power of 400 W by making adjustment by a tuner. When the micro-wave output is constant, current was supplied to the molybdenum boat and the current value was gradually raised to raise the temperature. Fullerene vaporization and heaping was monitored by a quartz film thickness sensor provided laterally of a substrate. For confirmation, the film thickness of the polymer film was measured using a contact type film thickness meter. For measuring the current, a nanoammeter was used. The band gap of the fullerene polymer film was determined from the temperature dependency of the current value.

During film formation, a glass substrate and a silicon substrate etc were set simultaneously in a bell jar to measure the physical properties. The mass spectrography of the fullerene polymer film was effected by ionization and ablation by a pulsed nitrogen laser using a time-of-flight mass spectrometer. The dangling spins were measured using an x-band electronic spin resonation device in a nitrogen atmosphere. The number of dangling spins per unit weight of the fullerene polymer thin film was found by the relative comparison method of the third and fourth absorption lines from the low magnetic field of a digital manganese marker, using a solution in toluene of d-tert-butyl nitroxide as a standard spin. The results are as follows:

film thickness (as measured with a contact film thickness meter): 30 nm electrically conductivity: $1.1 \times 10^{-8}$ S/cm band gap: 1.4 eV dangling: $2.0 \times 10^{18}$ spins/g wherein the value of the band gap is found from the results of measurement of the transmittance by the forbidden-indirect method.

C60 then was purified, using a flush column charged with active charcoal filler in place of vacuum sublimation, and a fullerene polymer film was formed under similar conditions. The results of the physical properties are as follows:

film thickness (as measured with a contact film thickness meter): 30 nm electrically conductivity: $1.2 \times 10^{-7}$ S/cm band gap: 1.5 eV dangling: $2.5 \times 10^{18}$ spins/g Plasma Polymerization In the foregoing, film forming is by micro-wave polymerization. Now, using an RF plasma polymerization apparatus, shown in FIG. 36, a fullerene polymer film was formed by an RF plasma (13.56 MHz) using the RF plasma polymerization device shown in FIG. 36. C60, as purified, was accommodated in a molybdenum boat and vaporized by resistance heating to effect polymerization with a power of 70 W. Similar evaluation of physical properties was conducted on the produced fullerene polymer film. The results are as follows:

film thickness (as measured with a contact film thickness meter): 30 nm electrically conductivity: $1.8 \times 10^{-7}$ S/cm band gap: 1.5 eV dangling: $2.0 \times 10^{18}$ spins/g Of the fullerene polymer films, obtained by the microwave polymerization method, and by the plasma polymerization method, Raman spectroscopic measurement was conducted. It was suggested that the polymerization structures of the two were substantially the same.

The starting material then was switched from $C_{60}$ to $C_{70}$ to perform Ar plasma polymerization in the same was as described above. The results of evaluation of the physical properties of the produced fullerene polymer films are as shown below:

film thickness (as measured with a contact film thickness meter): 45 nm electrically conductivity: $1.0 \times 10^{-8}$ S/cm band gap: 1.5 eV dangling: $7.8 \times 10^{17}$ spins/g The results of Raman spectroscopic measurement of the $C_{60}$ polymer film were compared to those of the graphitic carbon. It was found that the so-called disorder band, as observed in the vicinity of 1350 $cm^{-1}$ of the amorphous carbon, was not observed. The 1460 and 1580 $cm^{-1}$ bands were attributed to the symmetrical extension/contraction vibrations of the single bond C—C and to the symmetrical extension/contraction vibrations of the C=C double bond.

Figure 48:
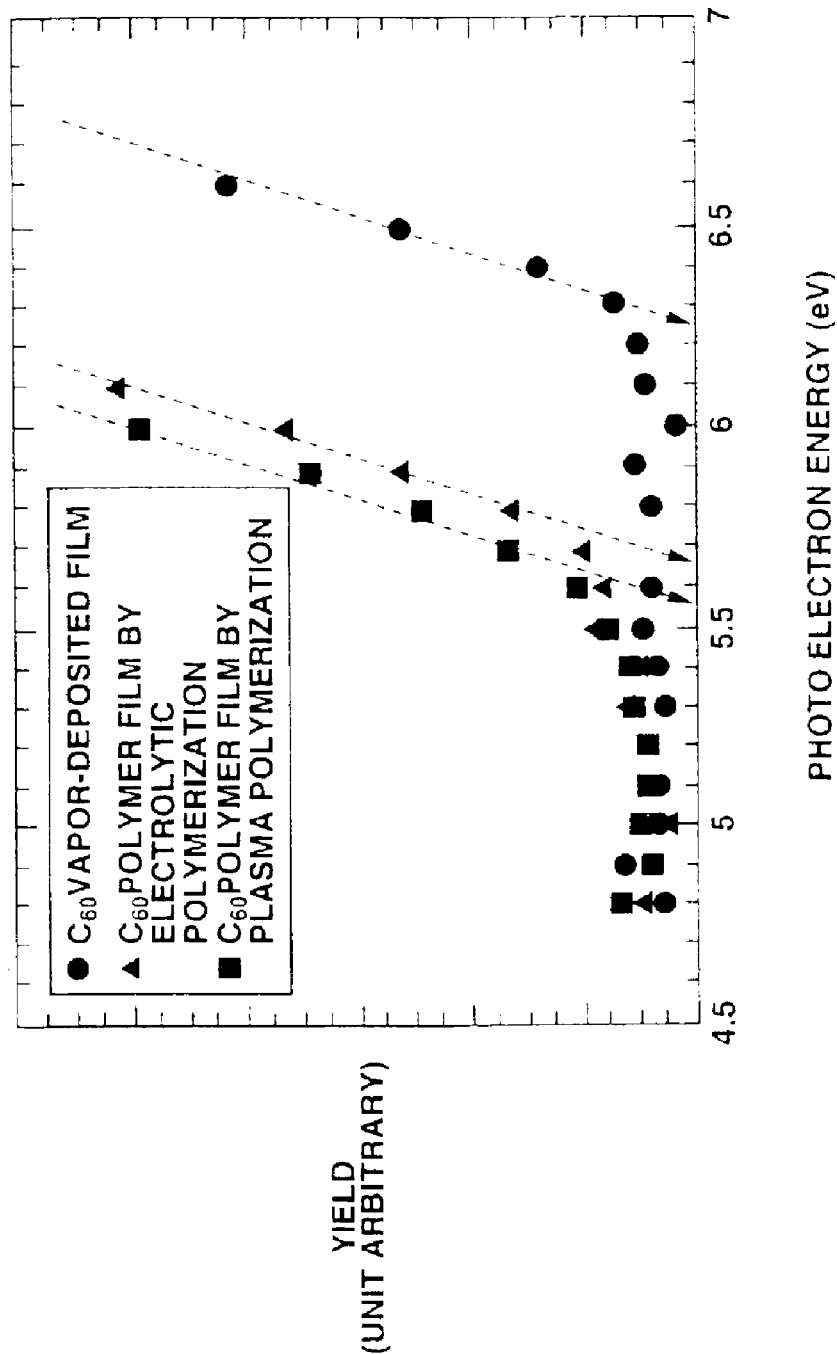
FIG. 48 shows the measured results of photoelectron emission of a fullerene thin film.

For clarifying the band structure of the fullerene thin film, the edge level of the valence band was evaluated from the photoelectron emission spectrum. The results are shown in FIG. 48. For comparison, the results for the $C_{60}$ vapor-deposited film are also shown.

Method for Vapor-deposited Film Electromagnetic Wave Illumination

In the present Example, a vapor-deposited $C_{60}$ polymer film was processed in a Ar plasma into a $C_{60}$ polymer.

(1) Formation of a Fullerene Polymer Film

As a starting material, commercially available fullerene $C_{60}$ molecules were used. These $C_{60}$ molecules can be produced as follows: using a known device, arc discharge was varied out by DC current of 150 A, under the atmosphere of 100 Torr of helium, using a graphite rod 10 cm in diameter and 35 cm in length as a positive electrode. After the graphite rod was substantially vaporized to give a fullerene containing soot, the two electrodes were reversed in polarity and products deposited and heaped on the inherent negative electrode, such as carbon nanotubes, were further vaporized to produce the soot.

The soot heaped in a water-cooled reaction vessel was recovered to produce crude fullerene by extraction with toluene. This crude fullerene was washed with hexane, dried and purified by sublimation in vacuum. The fullerene molecules, thus produced, were subjected to time-of-flight mass spectrometry. It was thus found that the fullerene molecules contained $C_{60}$ and $C_{70}$ at a rate of approximately 9:1.

Using the apparatus shown in FIG. 39 or 36, the $C_{60}$ powders were sublimated and vapor-deposited on a silicon substrate at $4 \times 10^{-6}$ Torr to deposit a $C_{60}$ thin film, controlled to a film thickness of 20 Å, as measurement was made of the thickness of the vapor-deposited film by a film thickness meter. The $C_{60}$ powders, set on the molybdenum boat, were heated gradually to approximately 600° C. for degassing and was vapor-deposited at a higher temperature.

The vapor-deposited film was exposed to an Ar plasma of 0.1 Torr in an RF reactor of plan-parallel plates started at 13.56 MHz. The $C_{60}$ thin film was maintained at 50° C. and plasma processed for 4 hours and for 30 minutes at 30 W and 50 W, respectively, to a $C_{60}$ polymer film.

(2) XPS

Figure 49:
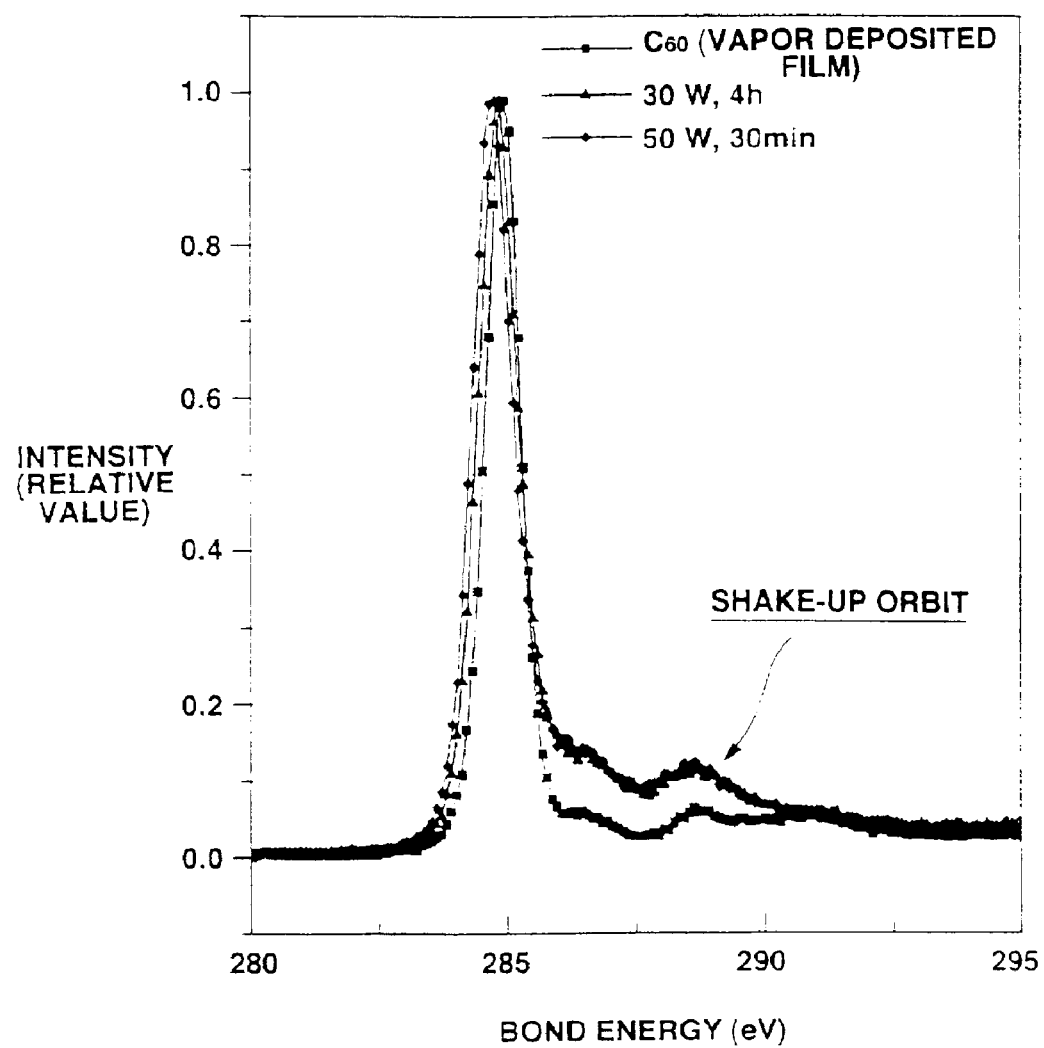
FIG. 49 is a C 1s spectral diagram of XPS of the fullerene polymer film according to the present invention.

FIG. 49 shows the normalized XPS C 1s spectra. The C 1s binding energies of the evaporated $C_{60}$ film and the plasma processed films were determined to be 284.9, 284.8 (30 W) and 284.7 eV (50 W). The full width of half magnitude (FWHM) of the C is peak of the plasma processed films increased about 0.2 eV to 1.0 eV compared to that of 0.8 eV of the evaporated film. Moreover, the shape of the C 1s becomes asymmetric to higher binding energies. The calculated chemical shifts of the C 1s is binding energy of +3 eV per four-membered ring in $C_{60}$ polymers with respect to the isolated $C_{60}$ molecule explains only partially the differences in the spectra. On the other hand, 13 (30 W) and 15 at % (50 W) oxygen were found by XS. The rather high overall FWHM's (2.7 and 2.5 eV) measured for the O 1s peaks indicates that different molecular and atomic oxygen species are superimposed.

Figure 50:
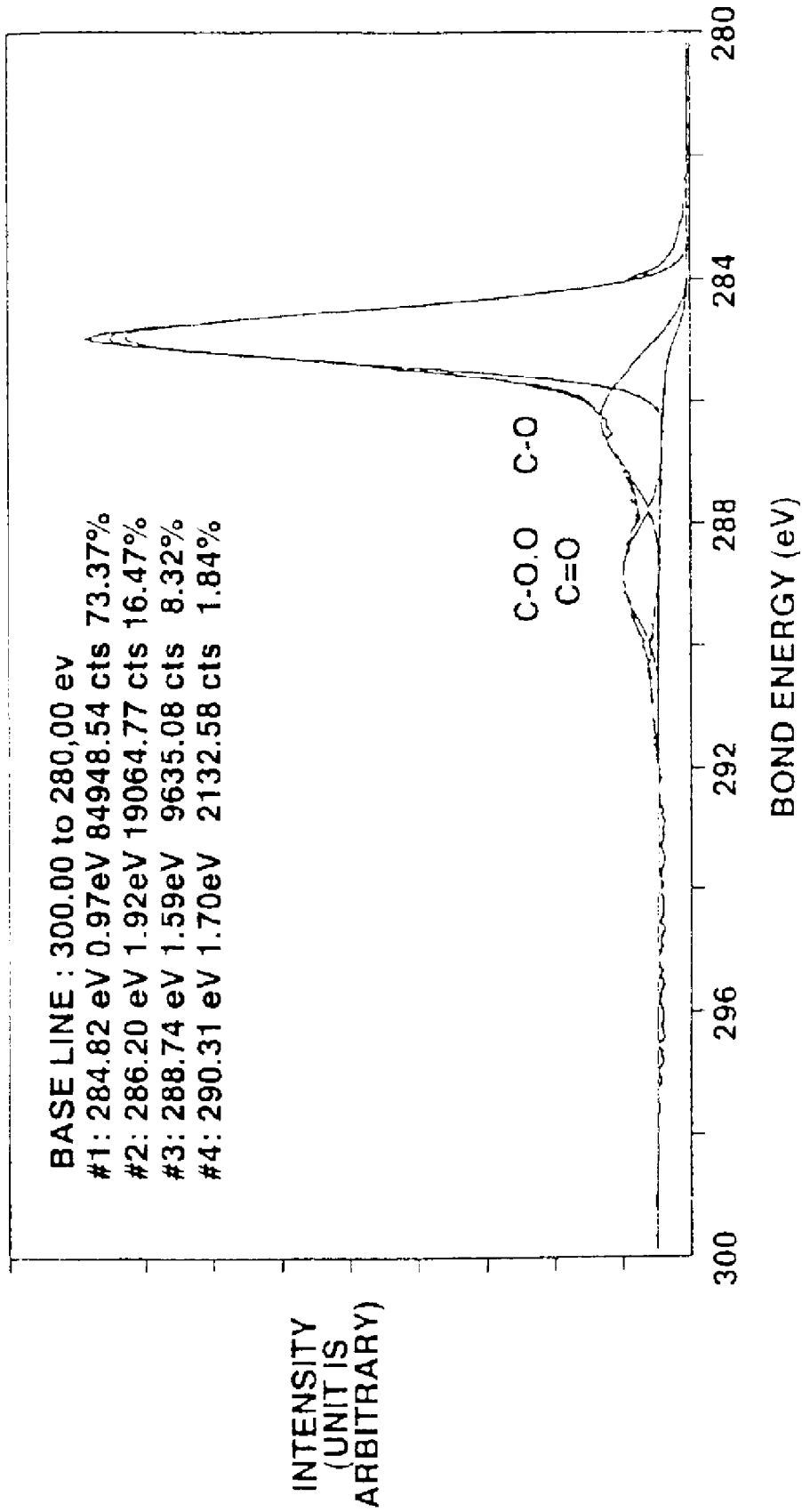
FIG. 50 is a C 1s peak distribution diagram of the fullerene polymer film.

FIG. 50 shows the peak analyses of C 1s of the plasma processed films. Peaks were found at 284.8 (284.7), 286.2 (286.1) and 288.7 (288.6) eV. The subpeaks correlate to C—O, C—O—O and C=O added by structural changes.

Figure 51:
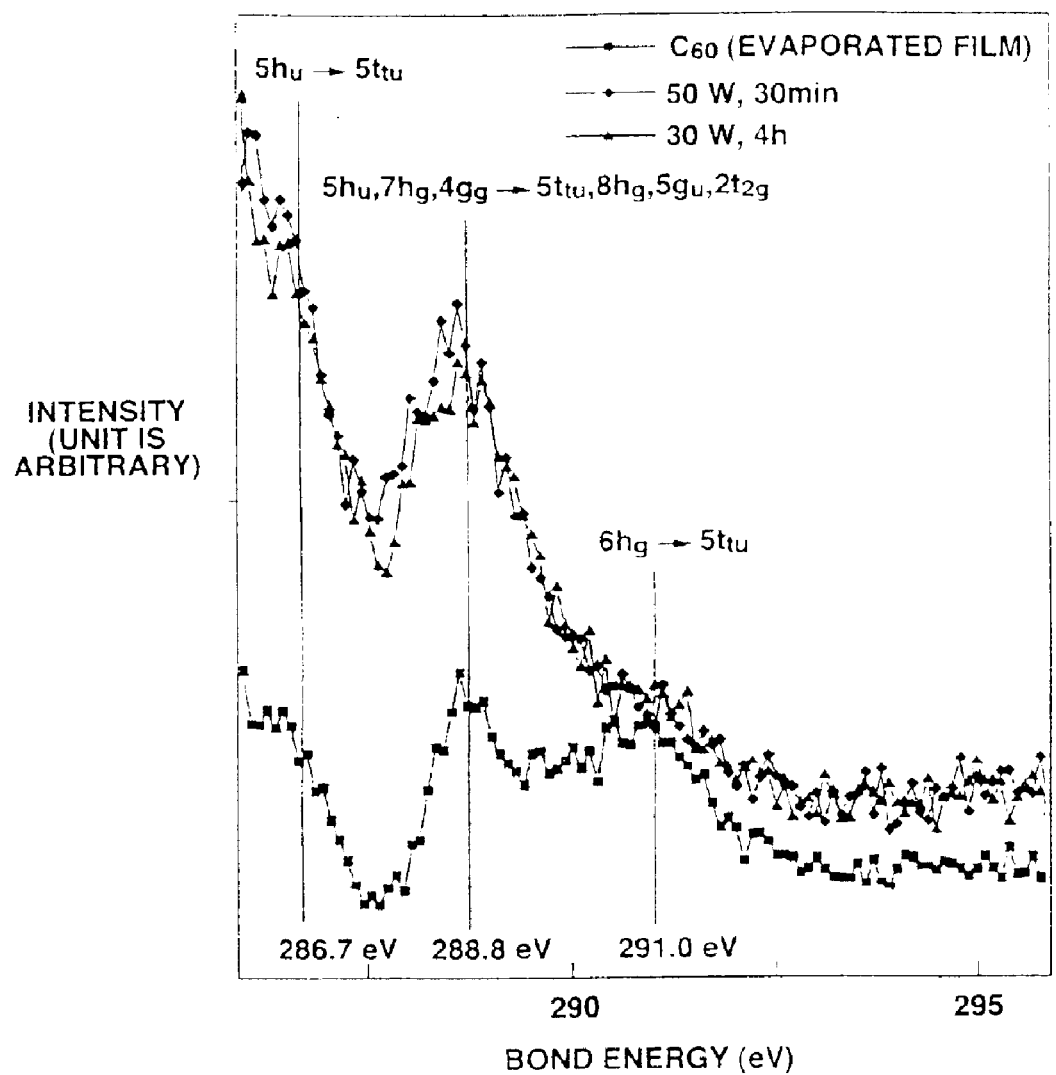
FIG. 51 is a spectrum diagram showing a shake-up satellite area of the fullerene polymer film.

FIG. 51 illustrates the expanded region covering the C 1s shake-up satellites (electron excitation). Five bands were separated by $C_{60}$ by high-resolution photoelectron spectroscopy at 1.8, 2.9, 3.7, 4.8 and 5.9 eV from the main peak (approximately 285 eV). Three of these peaks were resolved for the evaporated $C_{60}$ film, but not the peaks at 2.9 and 4.8 eV. The observation of the shake-up satellites of the plasma processed films is somewhat problematic because they are strongly superimposed by the emission from oxidized carbon species.

Figure 52:
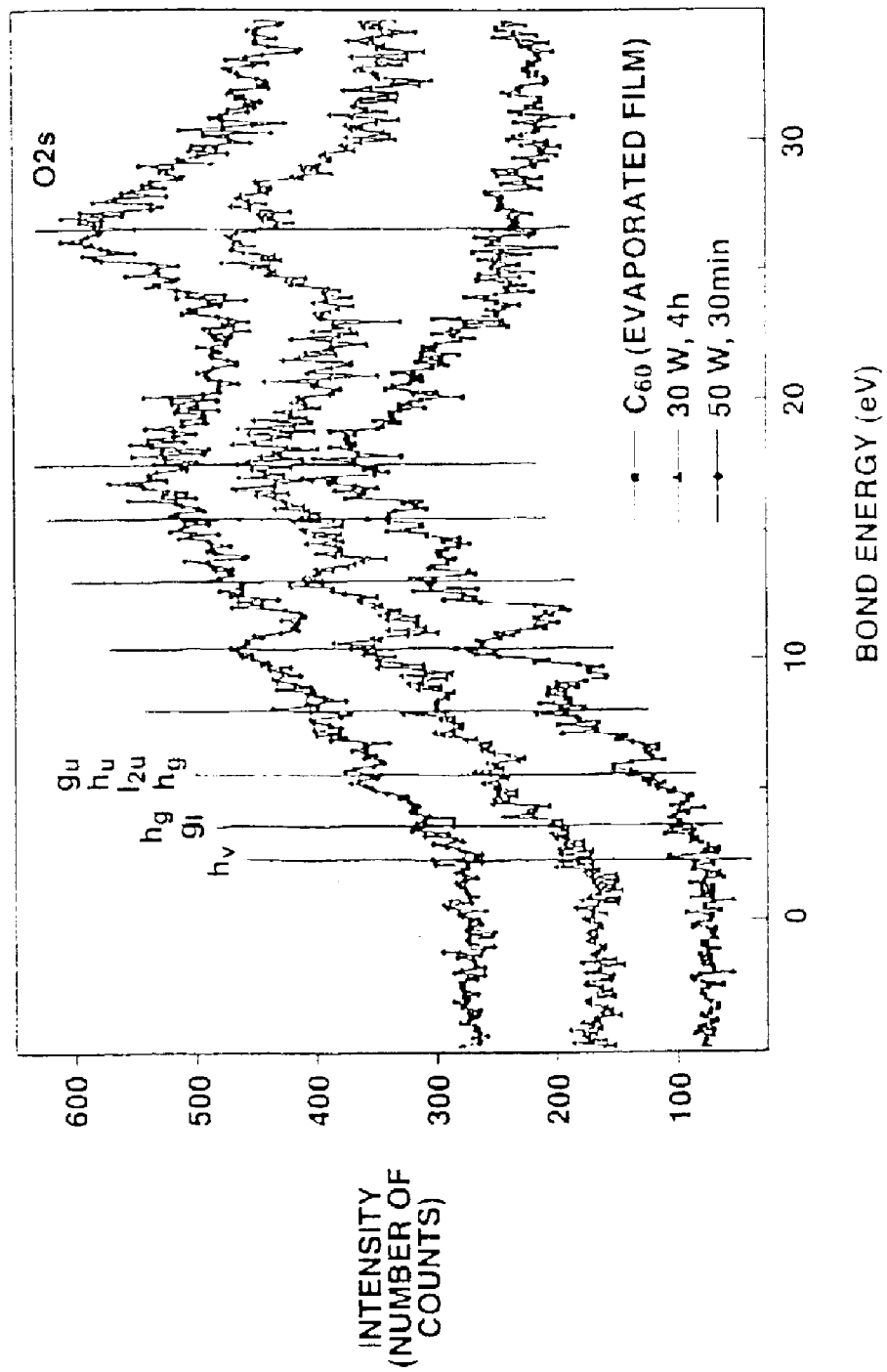
FIG. 52 shows the XPS valence band of the fullerene polymer film according to the present invention.

FIG. 52 shows the XS spectra of the evaporated $C_{60}$ film and the plasma processed films. It is apparent that the plasma processed peaks become broader and reduced in intensity. In addition to the carbon states, the O 2s peak appears at about 27 eV.

(3) TOF-MS

Figure 53:
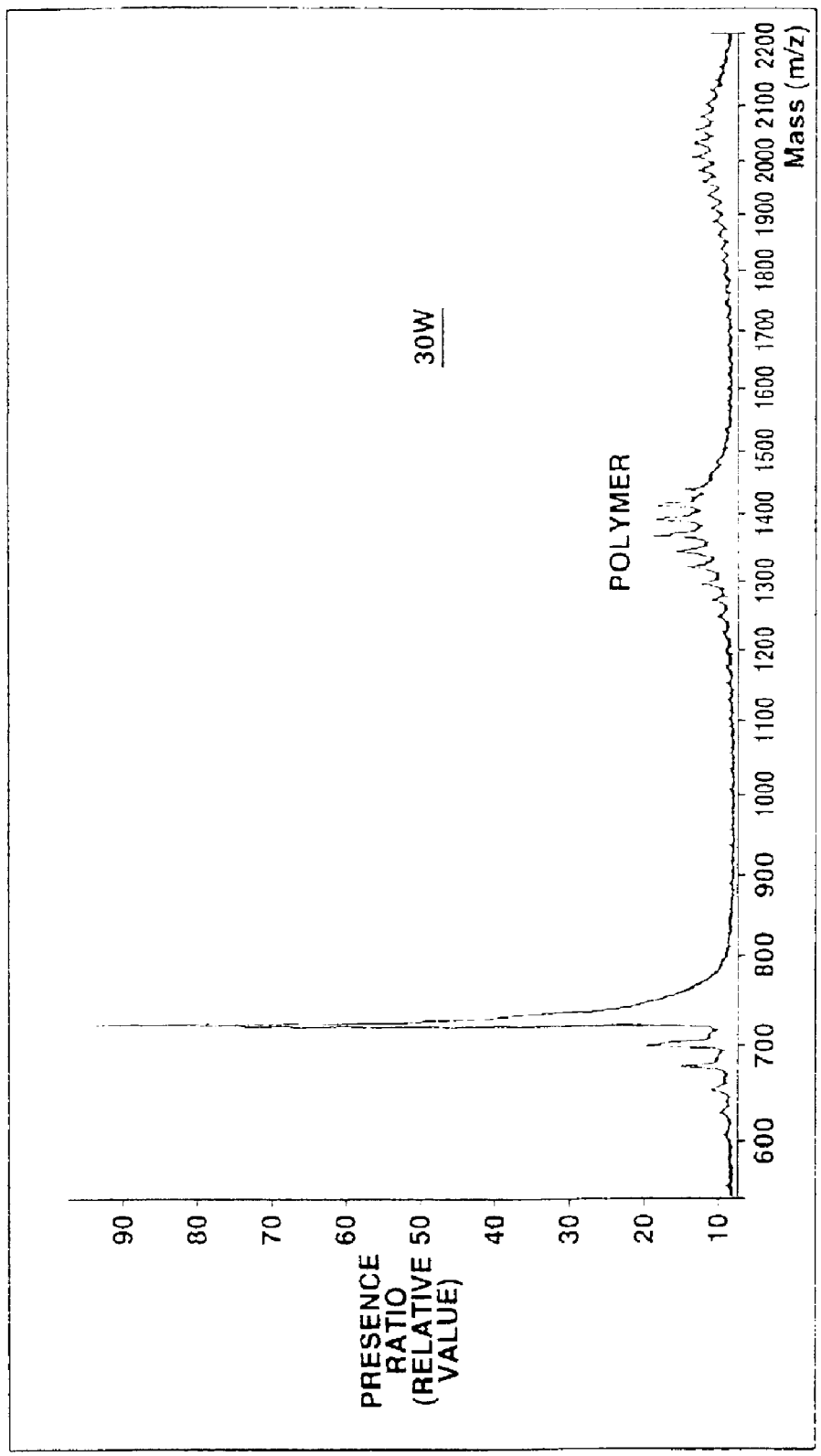
FIG. 53 is a TOF-MS spectral diagram of the fullerene polymer film obtained by the plasma processing.
Figure 54:
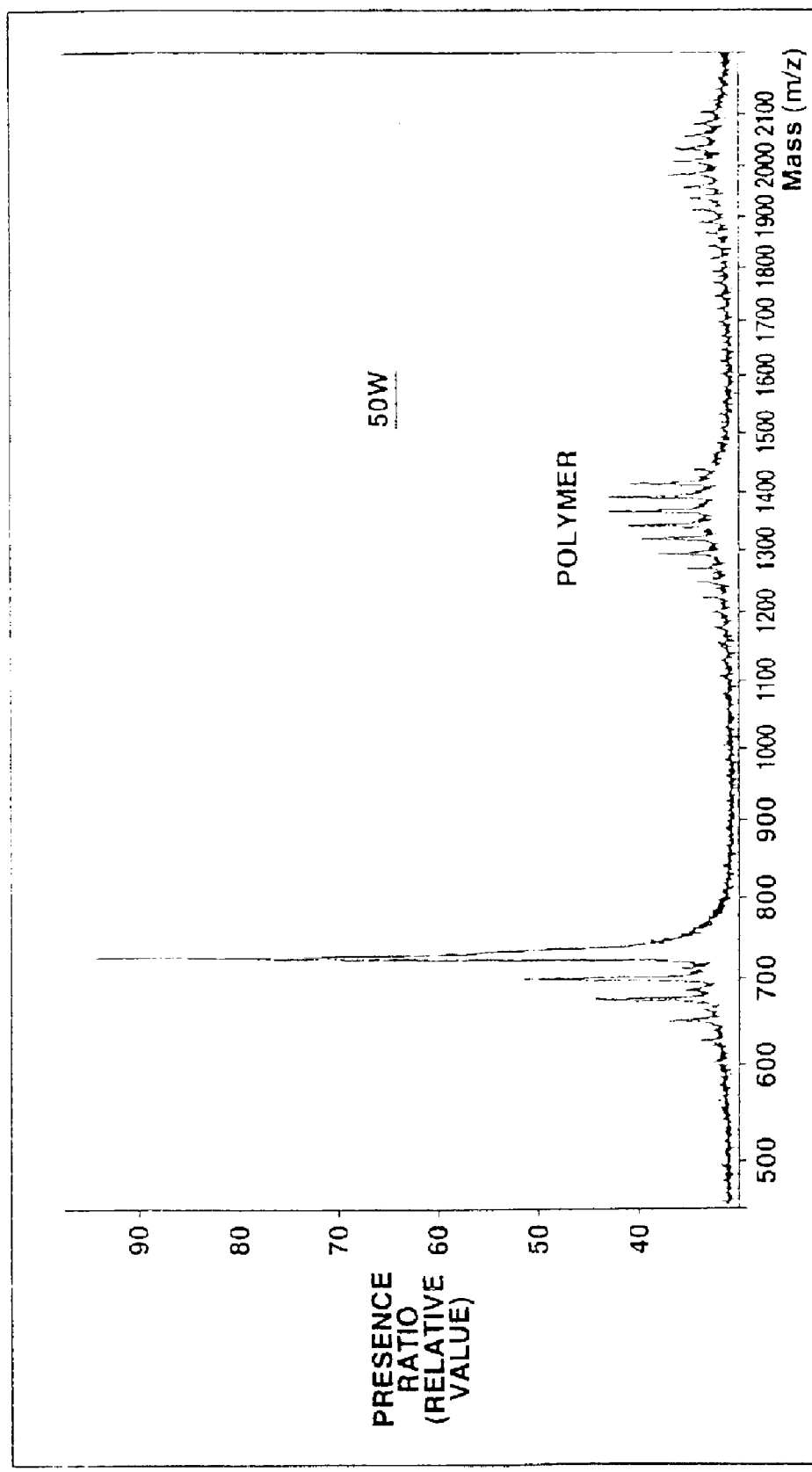
FIG. 54 is a TOF-MS spectrum diagram of the fullerene polymer film obtained by the plasma processing.

FIGS. 53 and 54 show the TOF-MS spectra of the plasma processed films. In the spectra occur peaks in the mass range of about 1440, which are attributable to fullerene polymer. Also, the $C_{60}$ structure is retained.

The results of Raman, XPS and TOF-MS confirm that the plasma processing of evaporated $C_{60}$ films resulted in polymerized $C_{60}$. The described method opens a new route to polymerize $C_{60}$ by plasma.

EXAMPLE 4

Manufacture of Heterojunction Structure and its Physical Properties

On the above-mentioned layered structure, including a polythiophene film and a C60 polymer film, deposited on an ITO electrode, an aluminum electrode was formed as a counter-electrode in the following manner. First, the inside of a vapor deposition device was evacuated to vacuum of $10^{-8}$ Torr by a turbo-pump and subsequently back-filled with a high purity hydrogen gas. An aluminum film then was formed on the $C_{60}$ polymer film of the layered structure in a hydrogen atmosphere of $10^{-5}$ Torr to produce a heterojunction structure.

Figure 55:
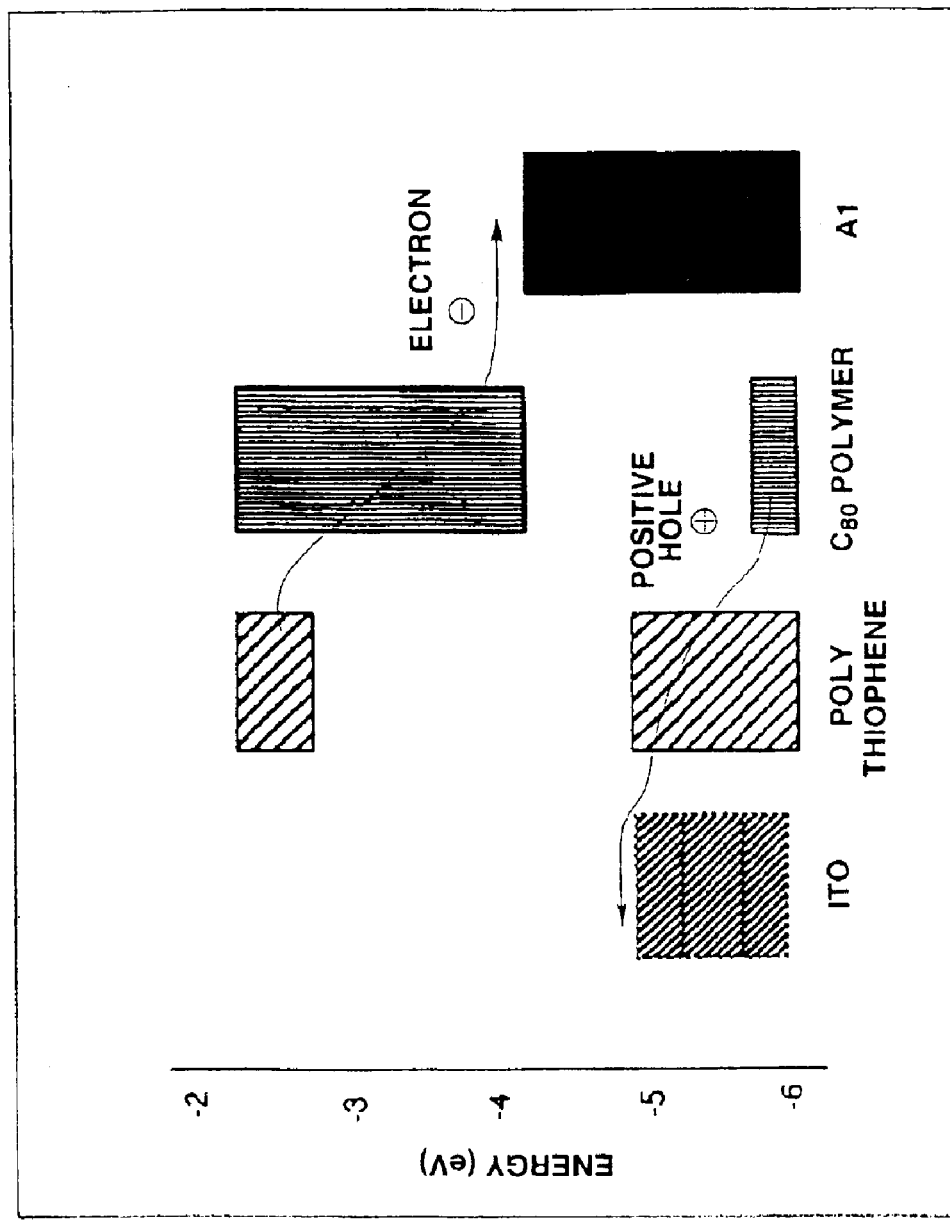
FIG. 55 shows a band structure of an example of a heterojunction structure according to the present invention.

From the evaluation of the valence electron band by the photoelectron emission method, Fermi level by the contact potential difference method and the band gap by the optical technique, the band structure of the produced heterojunction structure is as shown in FIG. 55.

Figure 56:
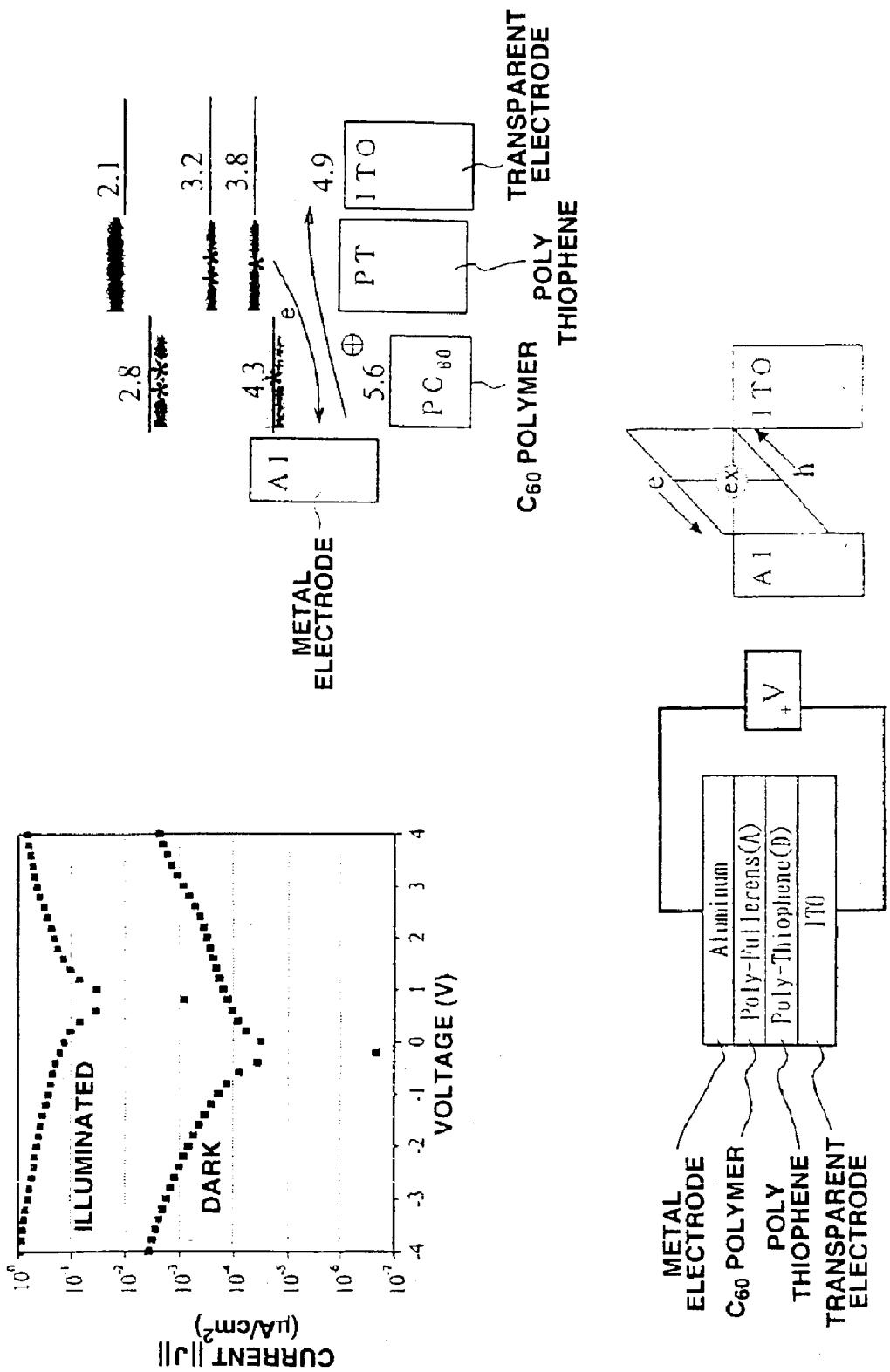
FIG. 56 shows V-I characteristics of the heterojunction structure shown in FIG. 55.

The V-I characteristics of the heterojunction structure were evaluated. The results are shown in FIG. 56. Using a 500 W Xe lamp, it was checked whether or not the structure exhibited characteristics as a photocell. As a result, it was found that, if light is illuminated from the ITO side, an outstanding function as a photocell was ascertained, as shown.

Figure 57:
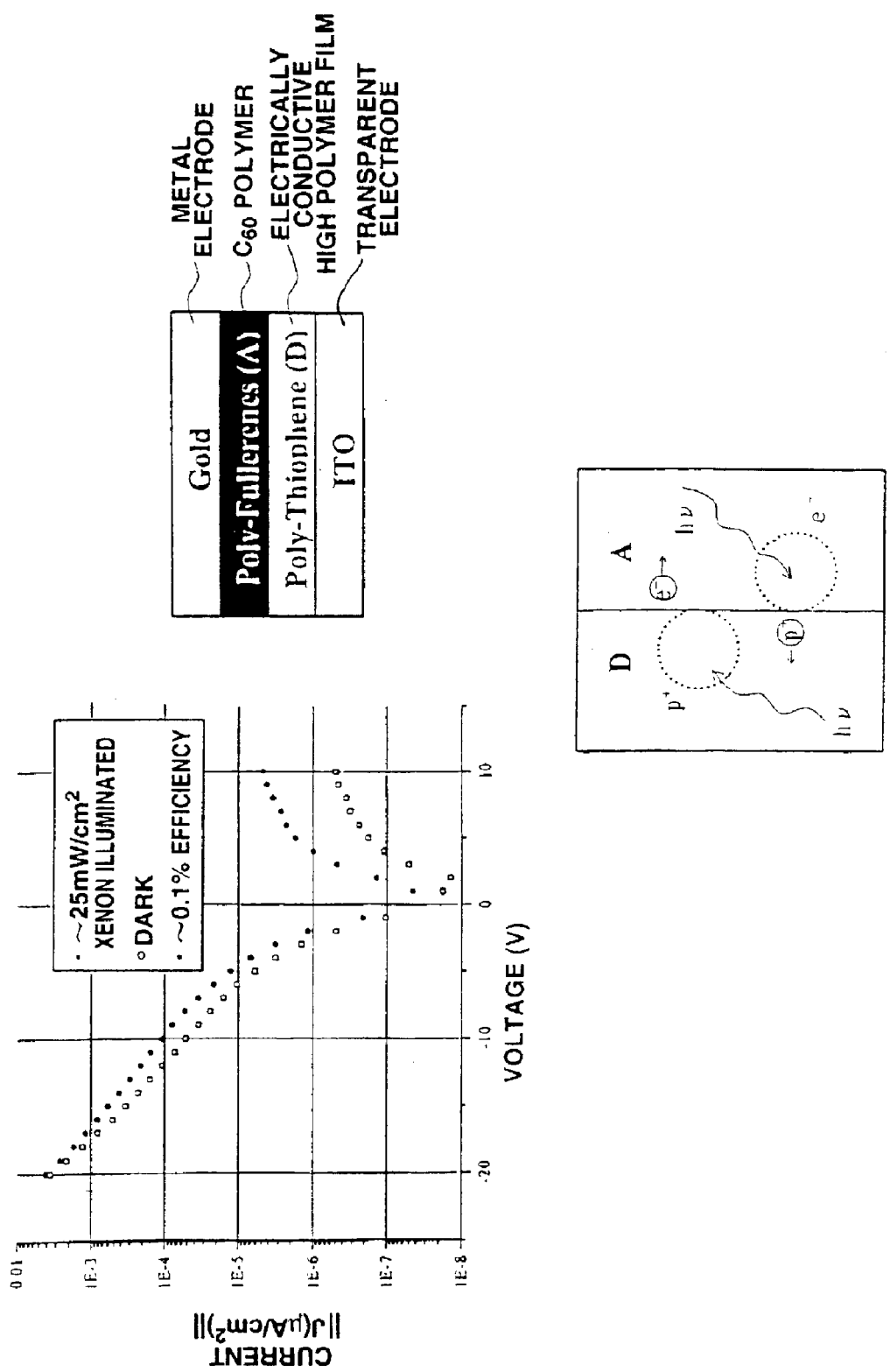
FIG. 57 shows V-I characteristics of another his according to the present invention.

The V-I characteristics were evaluated on the heterojunction structure of the same structure as described above except using gold in place of aluminum. The results are shown in FIG. 57. This heterojunction structure has the function as the photocell. 48.

Figure 58:
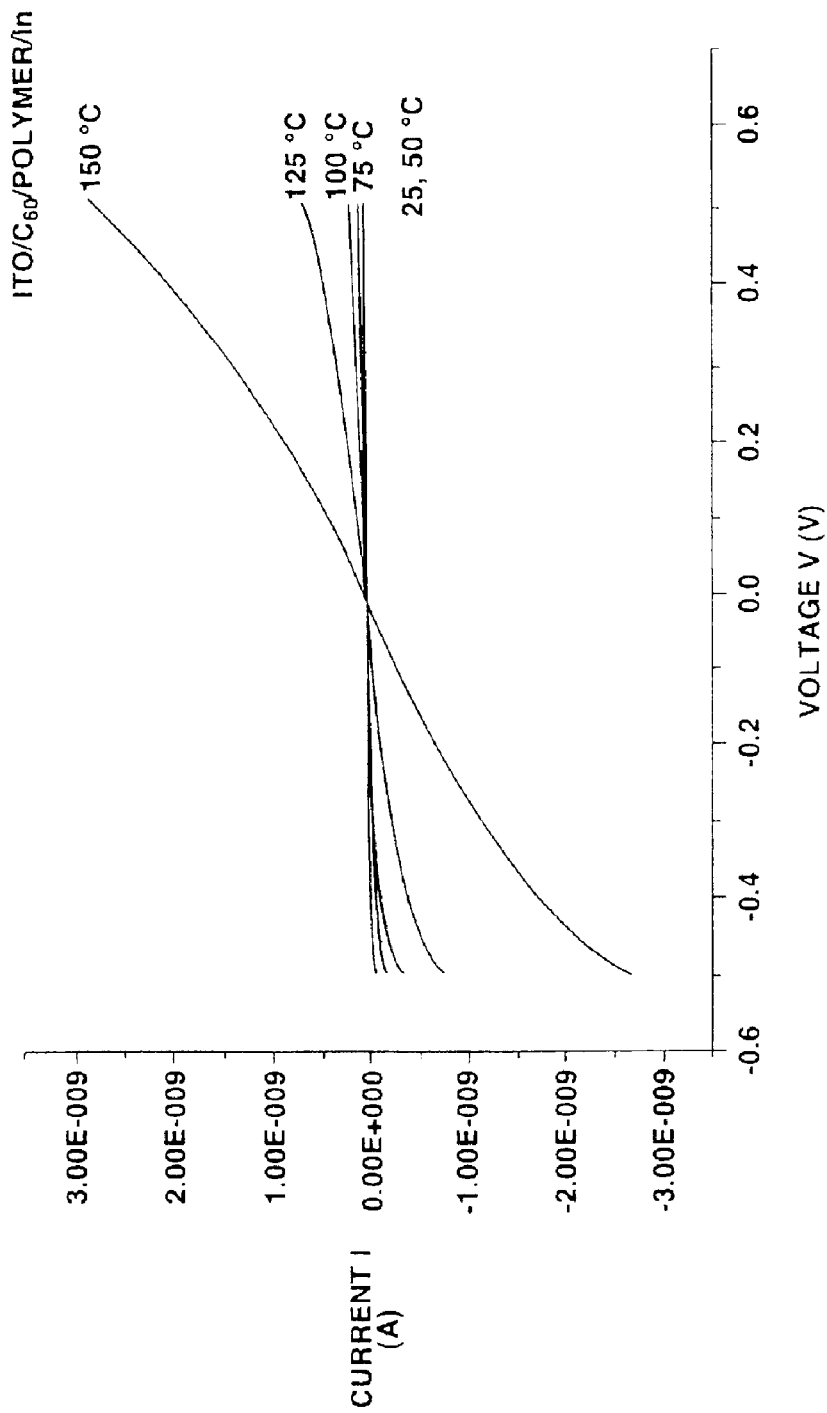
FIG. 58 shows V-I characteristics of a layered structure corresponding to the heterojunction structure.
Figure 59:
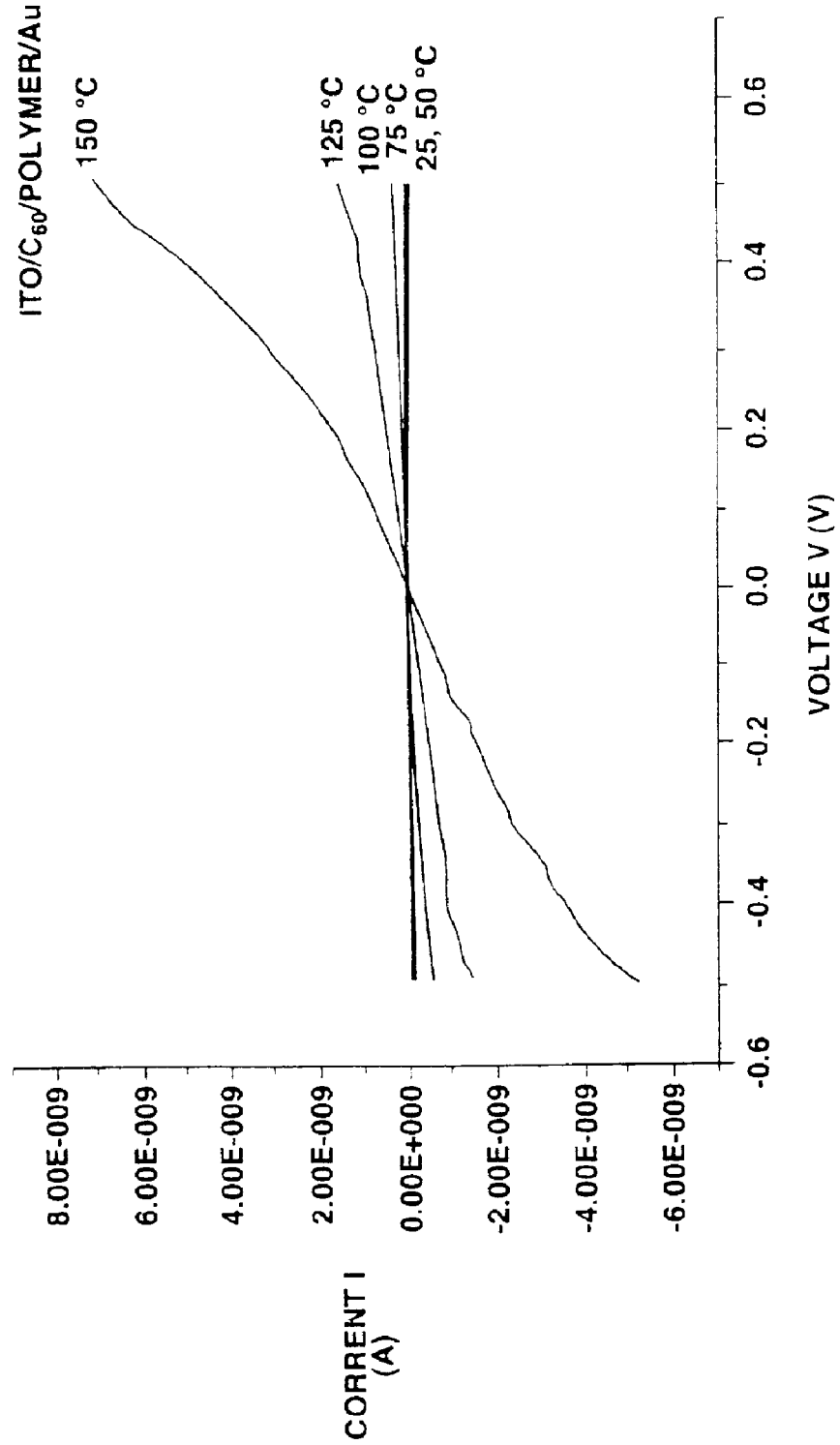
FIG. 59 shows V-I characteristics of the layered structure in which the material of the counter-electrode of the layered structure is changed.

For comparison, the relationship between the working temperature, current and voltage was measured of a layered structure in which the polythiophene film is omitted, indium and gold are used as a counter-electrode and in which an ITO is used as a light-transmitting electrode. The results are shown in FIGS. 58 and 59. It may be seen from these figures that desired V-I characteristics are not achieved such that characteristics are changed with temperature.

The Raman spectrum then was measured of the above-mentioned fullerene polymer film.

EXAMPLE 5

Figure 60:
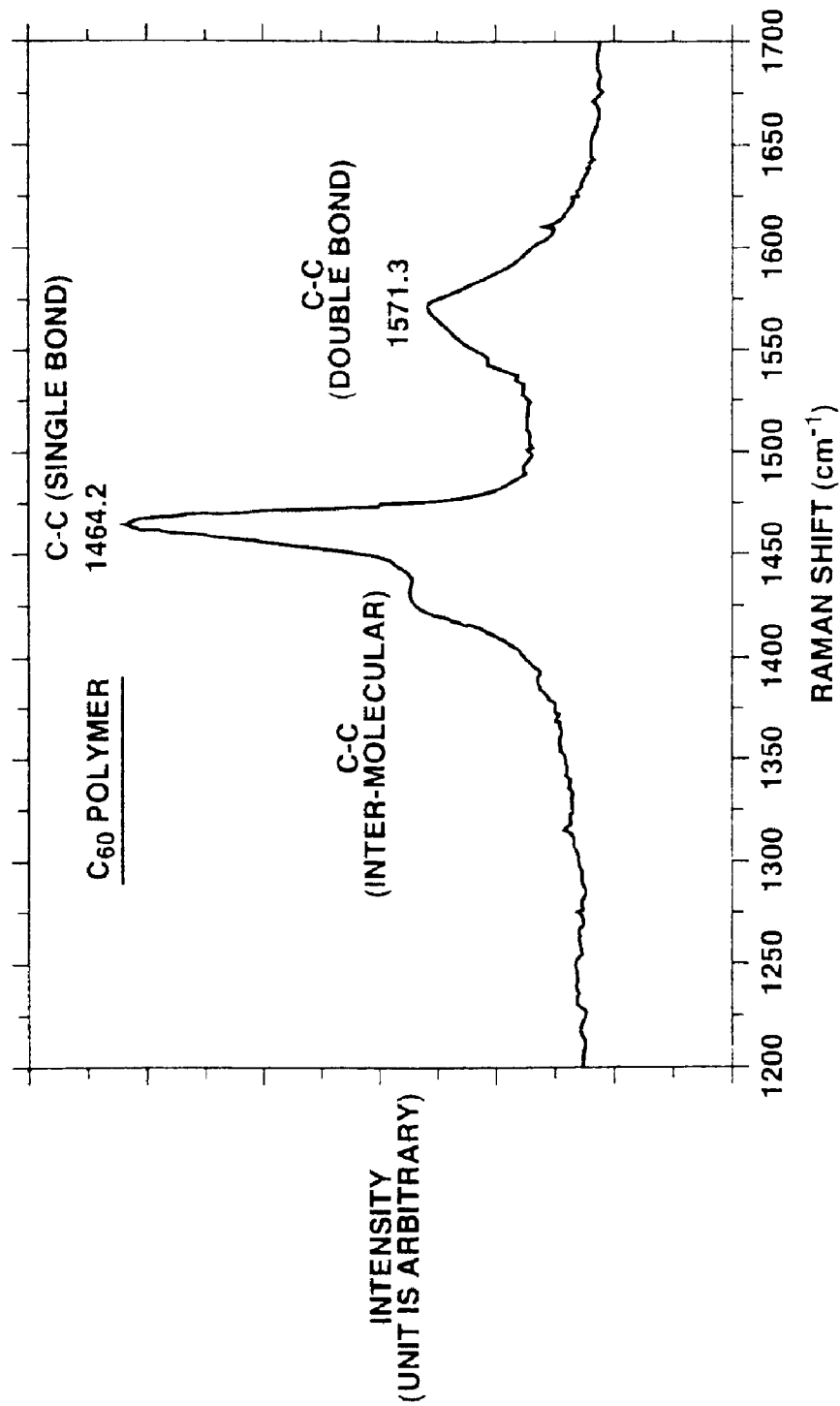
FIG. 60 shows the Raman spectrum of a $C_{60}$ polymer film obtained by the plasma polymerization method.

In the above plasma polymerization, the $C_{60}$ was plasma-polymerized using an argon pressure of 0.1 Torr and a plasma power of 50 W. On measuring the Raman spectrum of the produced polymer film, the spectrum as shown in FIG. 60 was obtained. During this measurement, the power of the argon ion laser was suppressed to a level not causing changes in the light induction structure.

EXAMPLE 6

Figure 61:
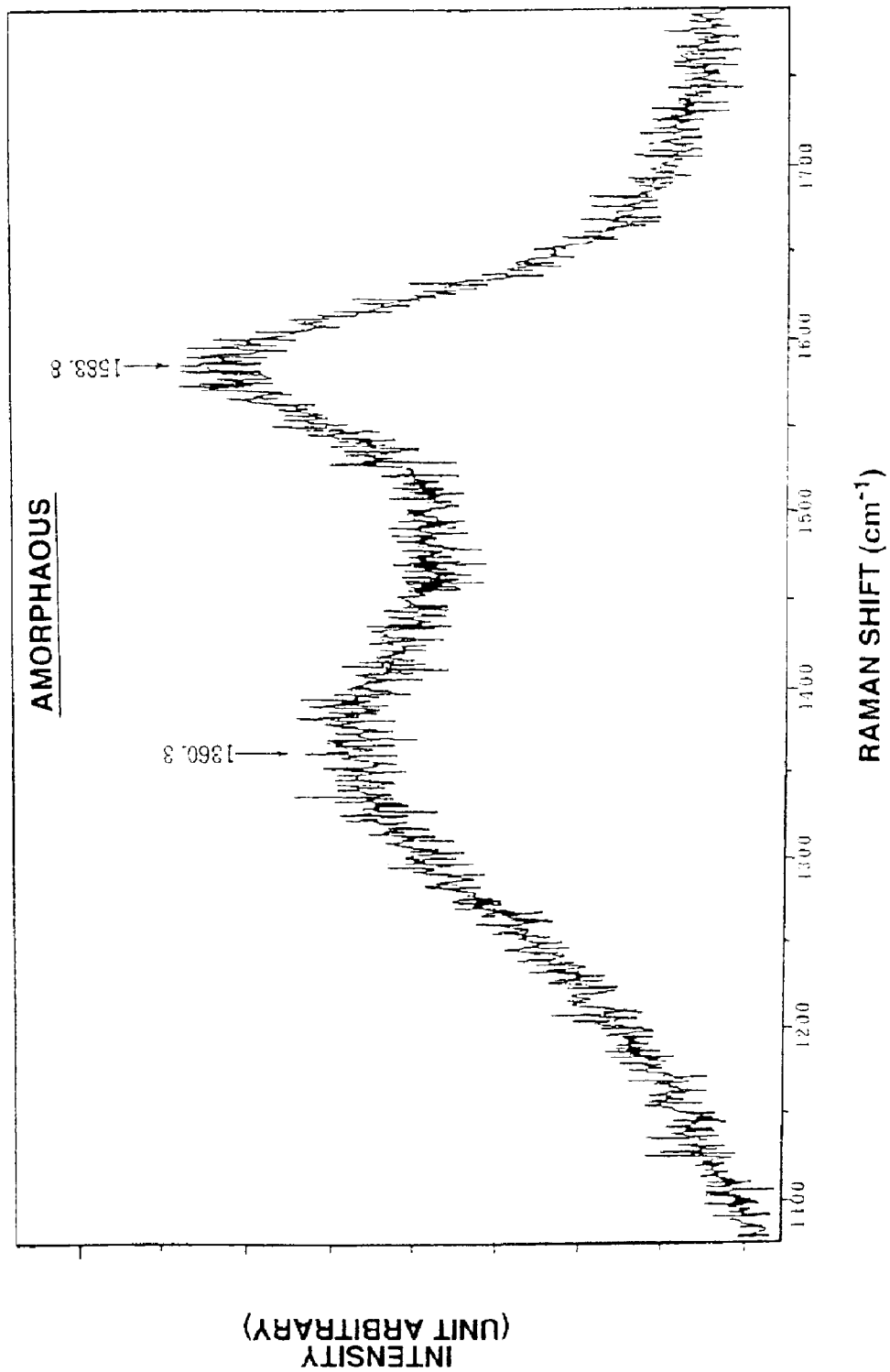
FIG. 61 shows the Raman spectrum of a $C_{60}$ polymer film obtained by changing the conditions of the plasma polymerization method.

The surface of the $C_{60}$ polymer film, obtained in the same way as in Example 5, was irradiated with a 200 W argon plasma for two hours and Raman measurement was conducted with the laser light of the same intensity as that used in Example 5. As a result, a Raman spectrum shown in FIG. 61 was obtained.

EXAMPLE 7

By the above-mentioned vapor deposition film electromagnetic wave illumination method, Raman measurement was conducted of the produced $C_{60}$ polymer film with the laser light of the same intensity as that used in Example 5. As a result, the Raman spectrum shown in FIG. 62 was obtained.

EXAMPLE 8

Figure 63:
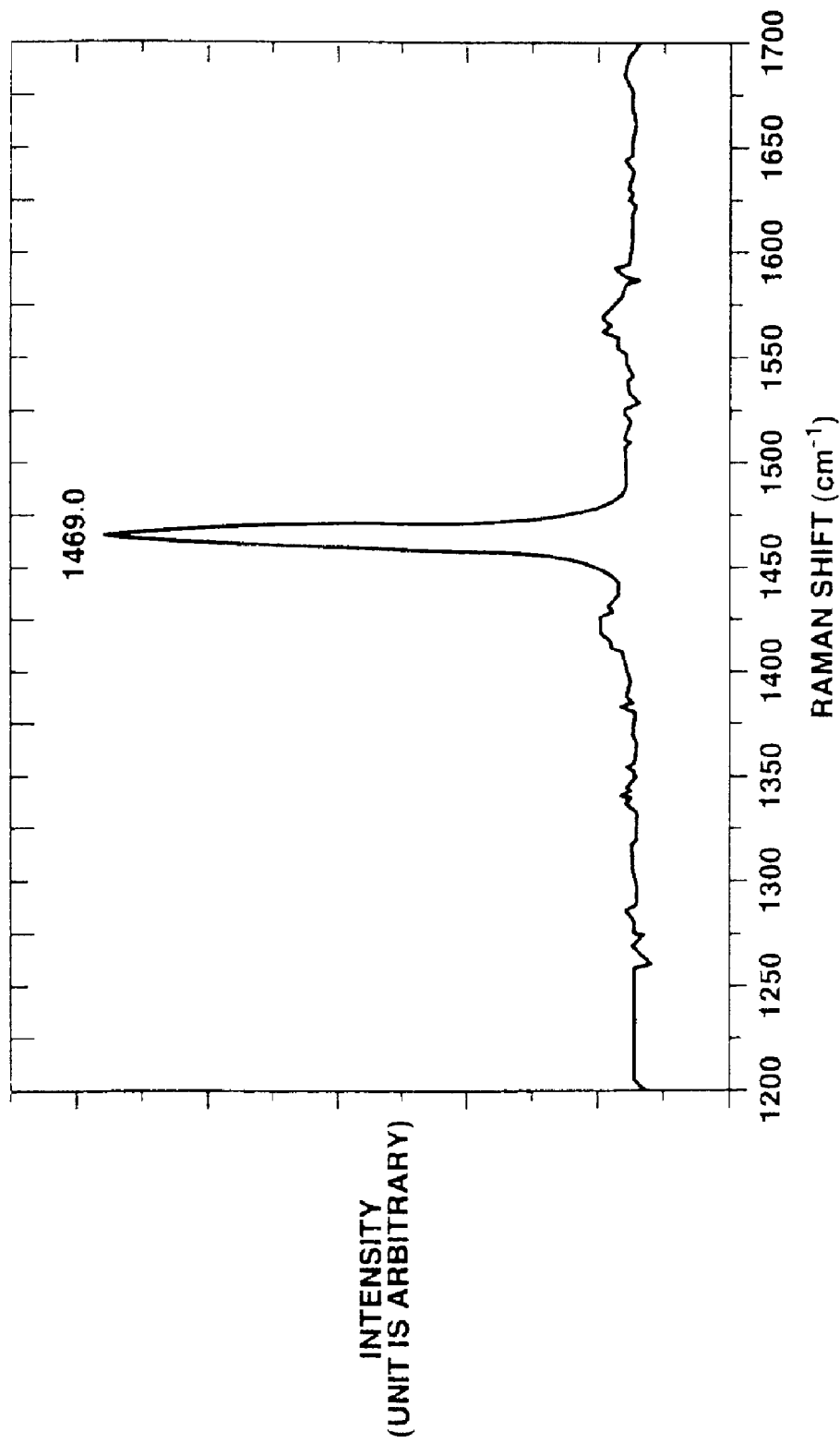
FIG. 63 shows a Raman spectrum of a $C_{60}$ vapor-deposited film.

A $C_{60}$ vapor-deposited film was formed as conventionally and Raman measurement was conducted with the laser light of the same intensity as that used in Example 5. As a result, a Raman spectrum shown in FIG. 63 was obtained.

EXAMPLE 9

Figure 64:
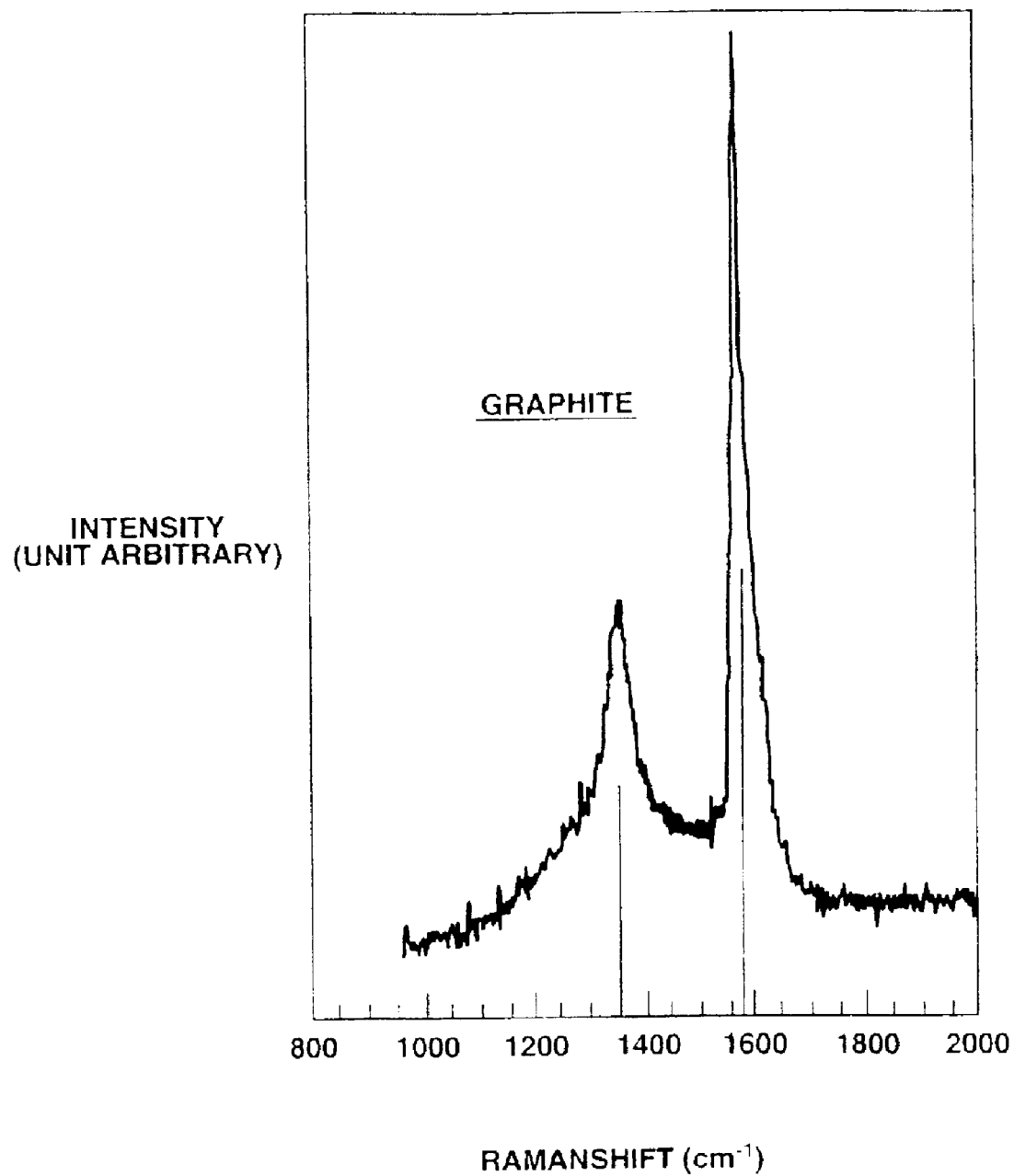
FIG. 64 shows a Raman spectrum of graphit.

The Raman measurement was conducted on the commercially available graphitic carbon. The results are shown in FIG. 64.

Figure 62:
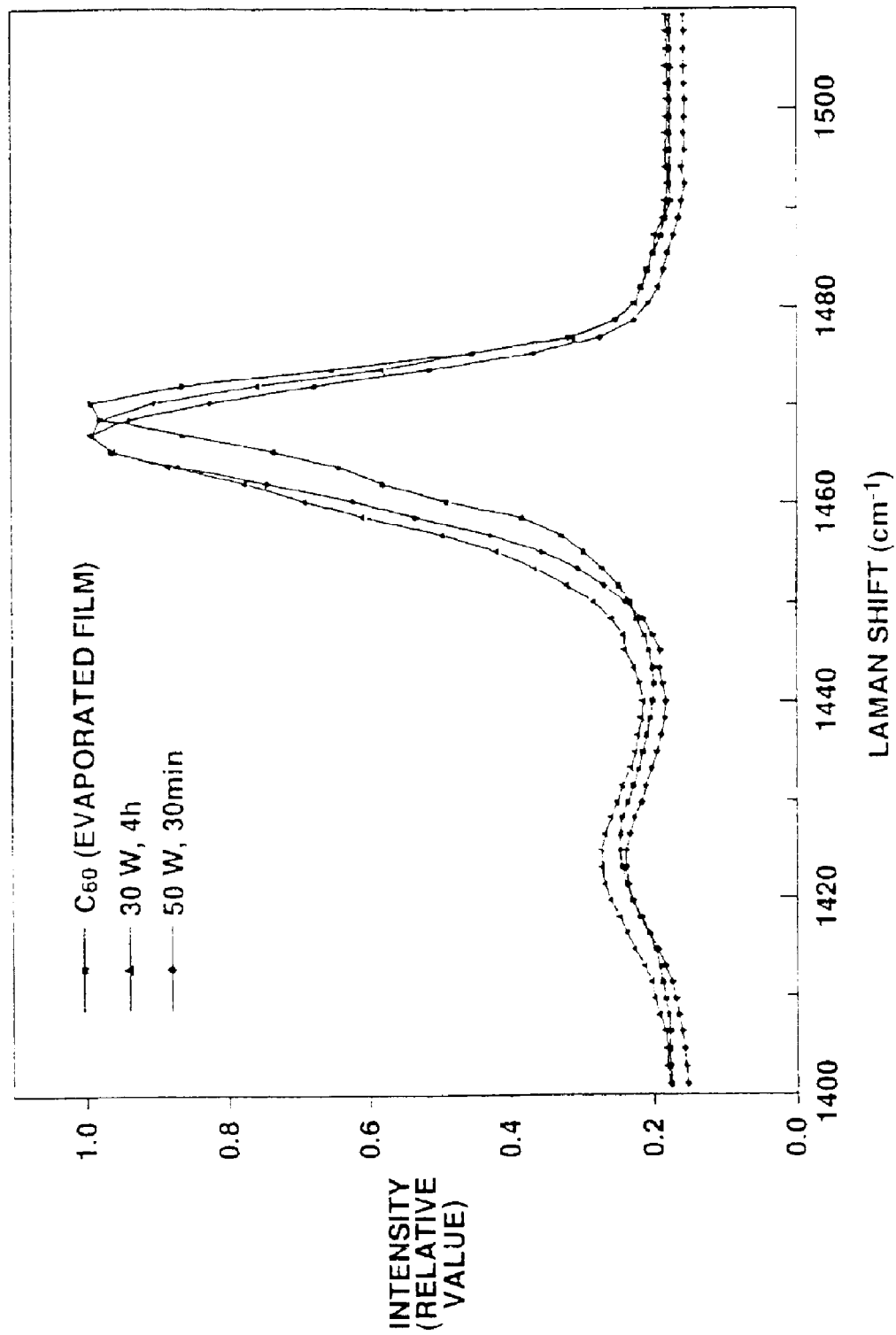
FIG. 62 shows a Raman spectrum of a fullerene polymer film according to the present invention.

The C60 molecule has ten active modes in the Raman spectrum. The strongest line is seen at 1469 $cm^{-1}$, as shown in FIG. 62. The distortion mode of the five-membered ring of Ag(2) (C—C single bond expansion/contraction) is most sensitive in checking the state of polymerization. The spectrum shown in FIG. 60 characterizes the randomly oriented $C_{60}$ polymer. Specifically, the peak at 1464 $cm^{-1}$ is attributed to the single-bond expansion/contraction vibration, whilst that at 1571 cm$^{-1}$ is attributed to the C—C symmetrical expansion/contraction vibration of the double bond. The shoulder present in the vicinity of 1425 cm$^{-1}$ is attributed to the C—C symmetrical expansion/contraction vibration of the intermolecular bond. Most crucial is the fact that the peak at 1470 cm$^{-1}$ of the spectrum shown in FIG. 63, termed the pentagonal pinch mode, is the source of the peak at 1464 cm$^{-1}$ of FIG. 60, and is subjected to slight shifting.

The fact that a large disorder band can be seen on the spectrum of the Example 6 is indicative of amorphization. The spectrum of Example 6 coincides with that of FIG. 64 as to the peak position of the graphitic carbon, despite the difference in the line width. That is, the profile of the spectrum such as that shown in FIG. 60 is peculiar to that of the $C_{60}$ polymer.

Figure 65:
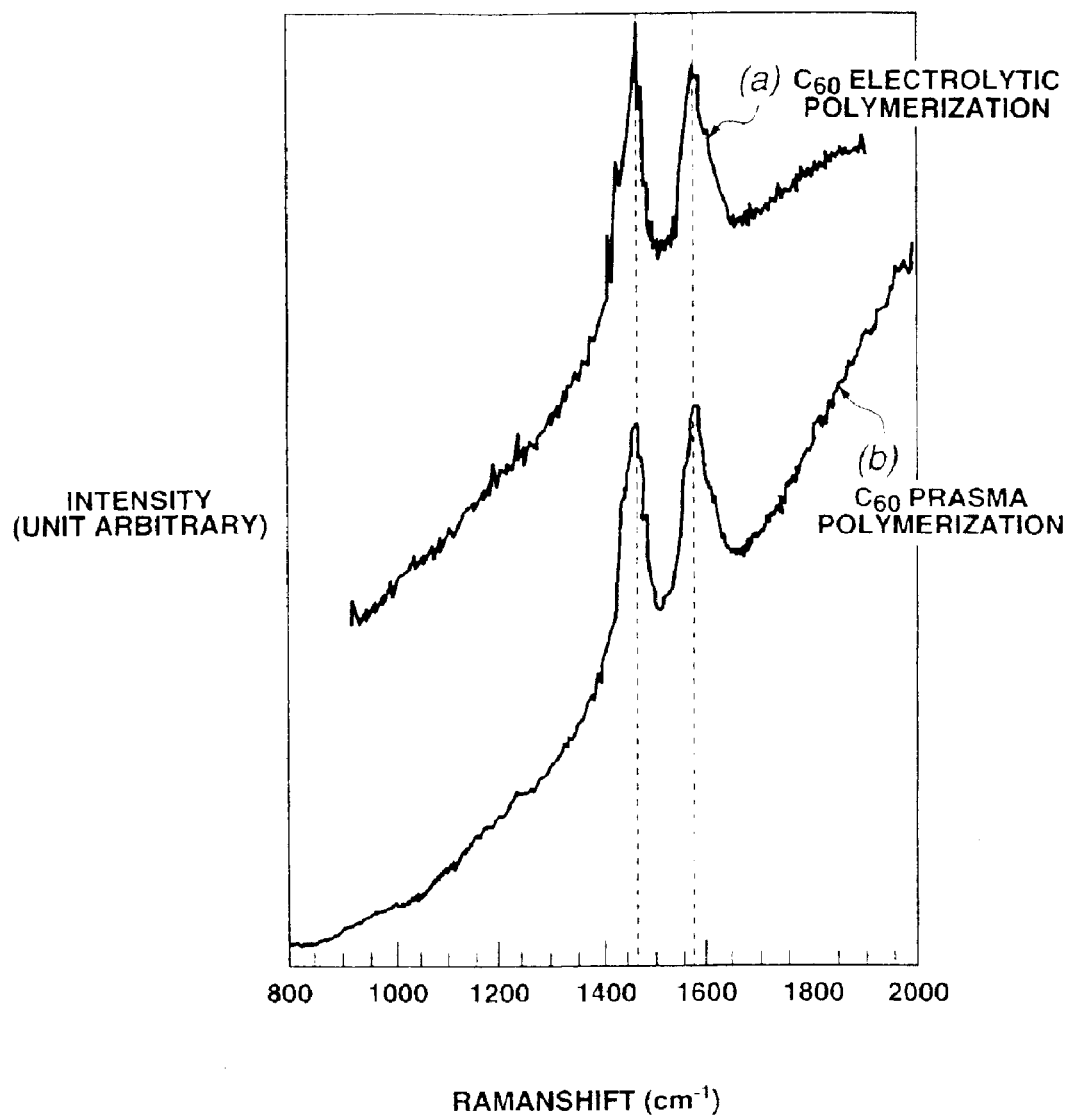
FIG. 65 shows a Raman spectrum of a $C_{60}$ polymer film, obtained by an argon plasma polymerization method, and a $C_{60}$ polymer film, obtained by an electrolytic polymerization method.

FIG. 65 shows the Raman spectrum of the $C_{60}$ polymer film produced in an argon plasma of 75 W and that of a $C_{60}$ polymer produced by the electrolytic polymerization method, as indicated in the treatise by the discoverers (P. Strasser, M. Ata, J. Phys. Chem. B, 102, 4131 (1998)). The two spectra coincide with the spectrum of FIG. 60 markedly as to the peak position and wave. With the $C_{60}$ random oriented polymer, there are necessarily observed peaks at 1464 and 1571 cm$^{-1}$.

EXAMPLE 10

Figure 66:
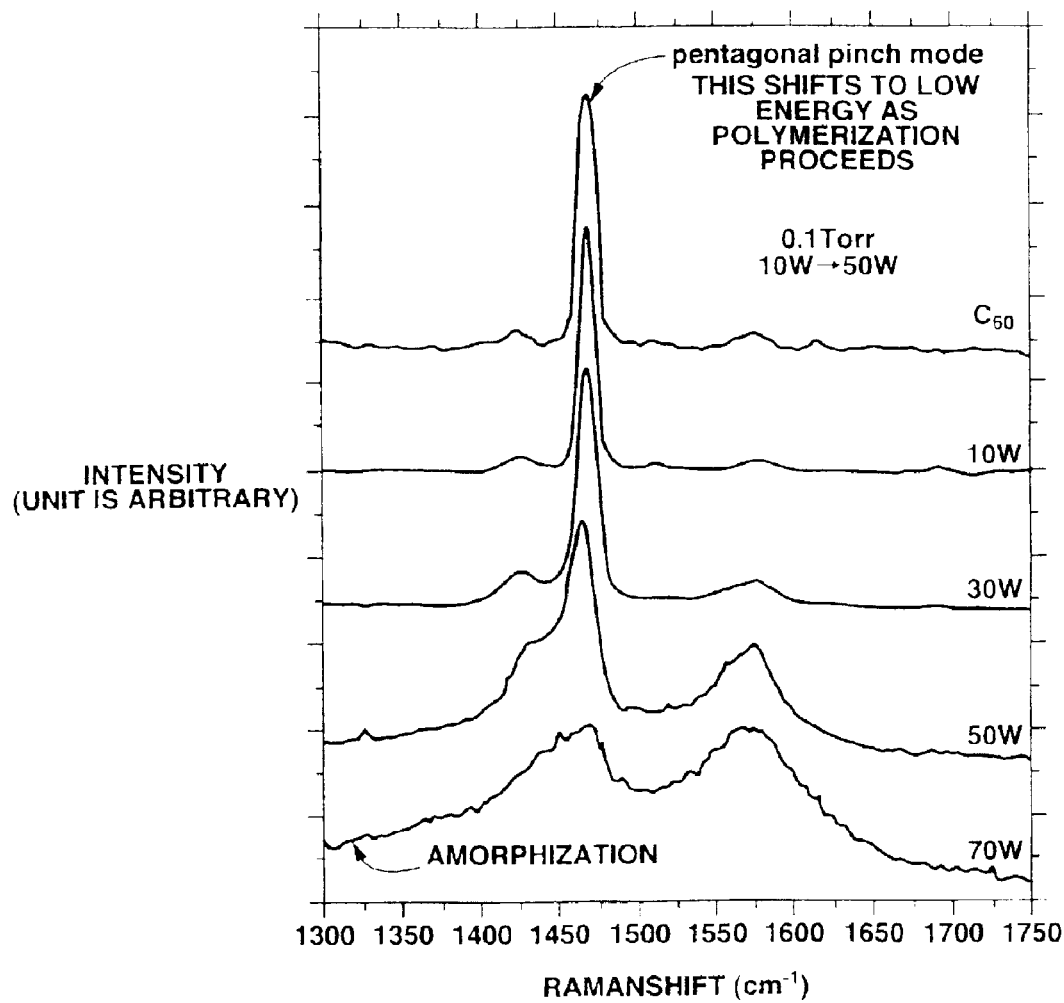
FIG. 66 shows Raman spectra of $C_{60}$ polymer film obtained by the plasma polymerization method.

The Raman spectrum was measured of the $C_{60}$ polymer films produced by the plasma polymerization method for variable plasma powers under the pressure of 0.1 Torr. The results are shown in FIG. 66.

Figure 67:
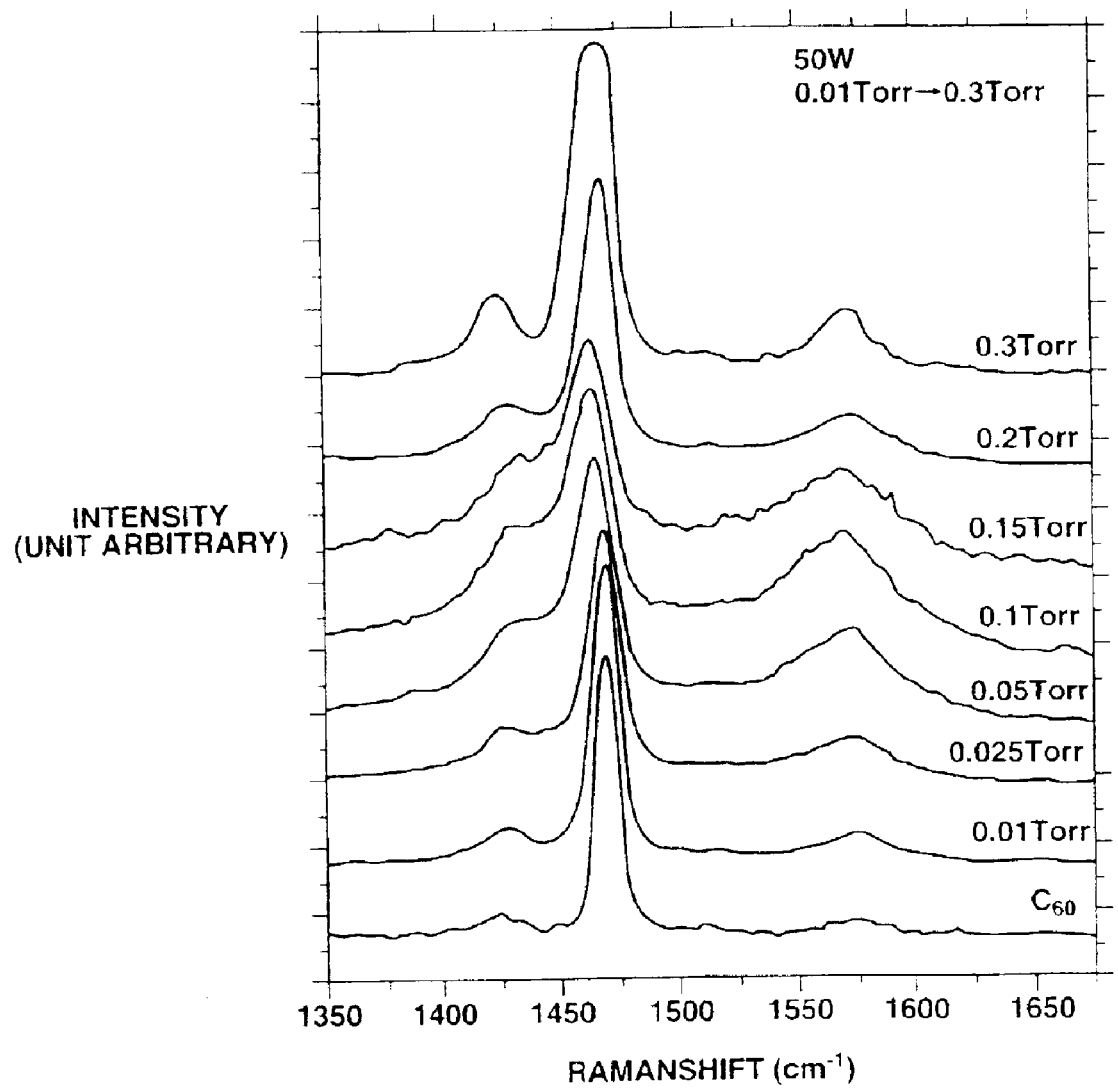
FIG. 67 shows Raman spectra of $C_{60}$ polymer film obtained by the plasma method in case the plasma power is kept constant and the pressure is changed.

The Raman spectrum was also measured of $C_{60}$ polymer films produced by varying the pressure under the 50 W plasma power using a similar plasma polymerization method. The results are shown in FIG. 67.

Figure 68:
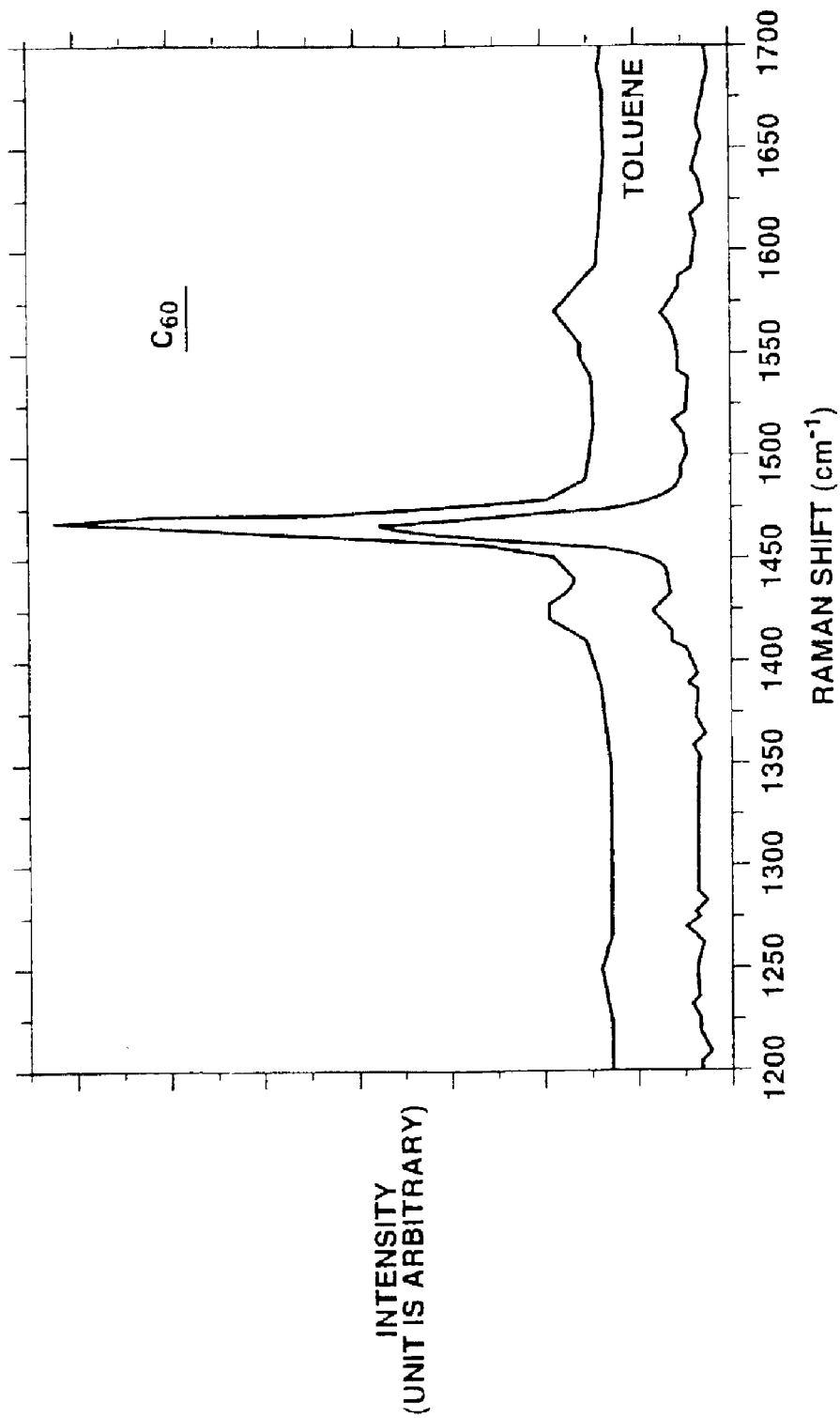
FIG. 68 shows a Raman spectrum of a $C_{60}$ vapor-deposited film.
Figure 69:
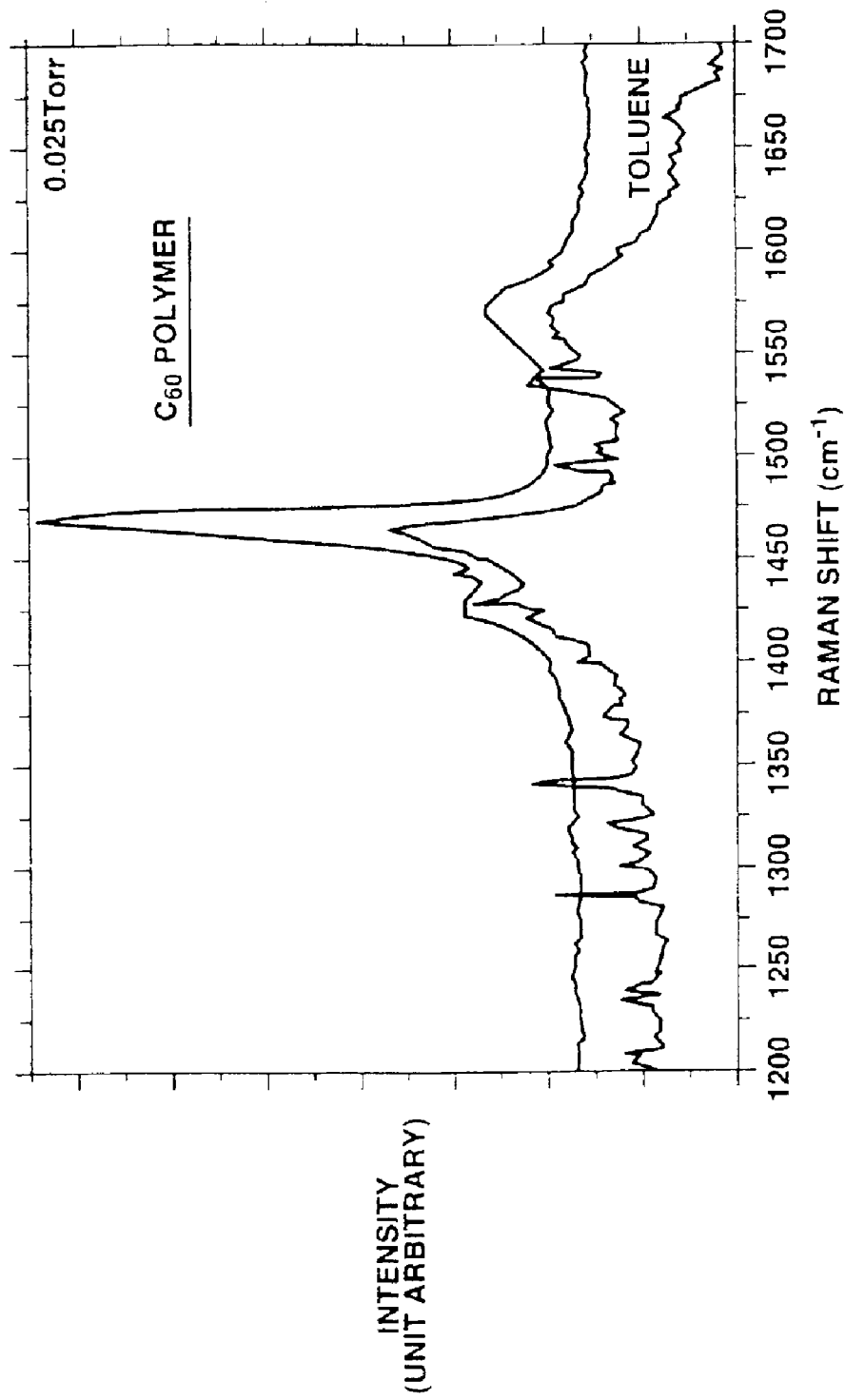
FIG. 69 shows Raman spectrum of a $C_{60}$ polymer film when the pressure is changed.
Figure 70:
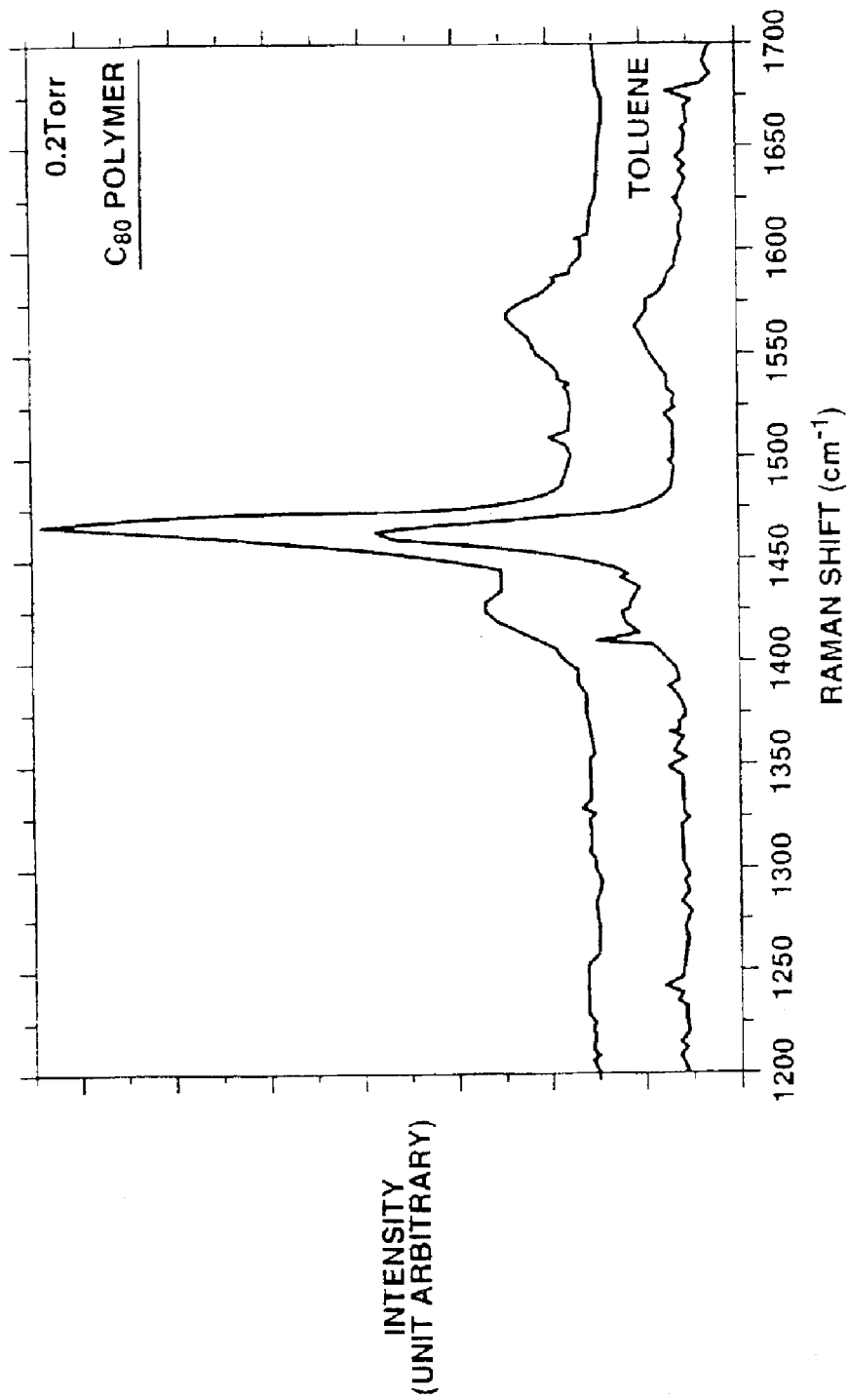
FIG. 70 shows Raman spectrum of a $C_{60}$ polymer film when the pressure is changed further.

FIGS. 68, 69 and 70 show the results of Raman measurement of the $C_{60}$ vapor-deposited films obtained by the vapor deposition method under the pressures of 0.01 Torr, 0.025 Torr and 0.2 Torr, respectively.

Figure 71:
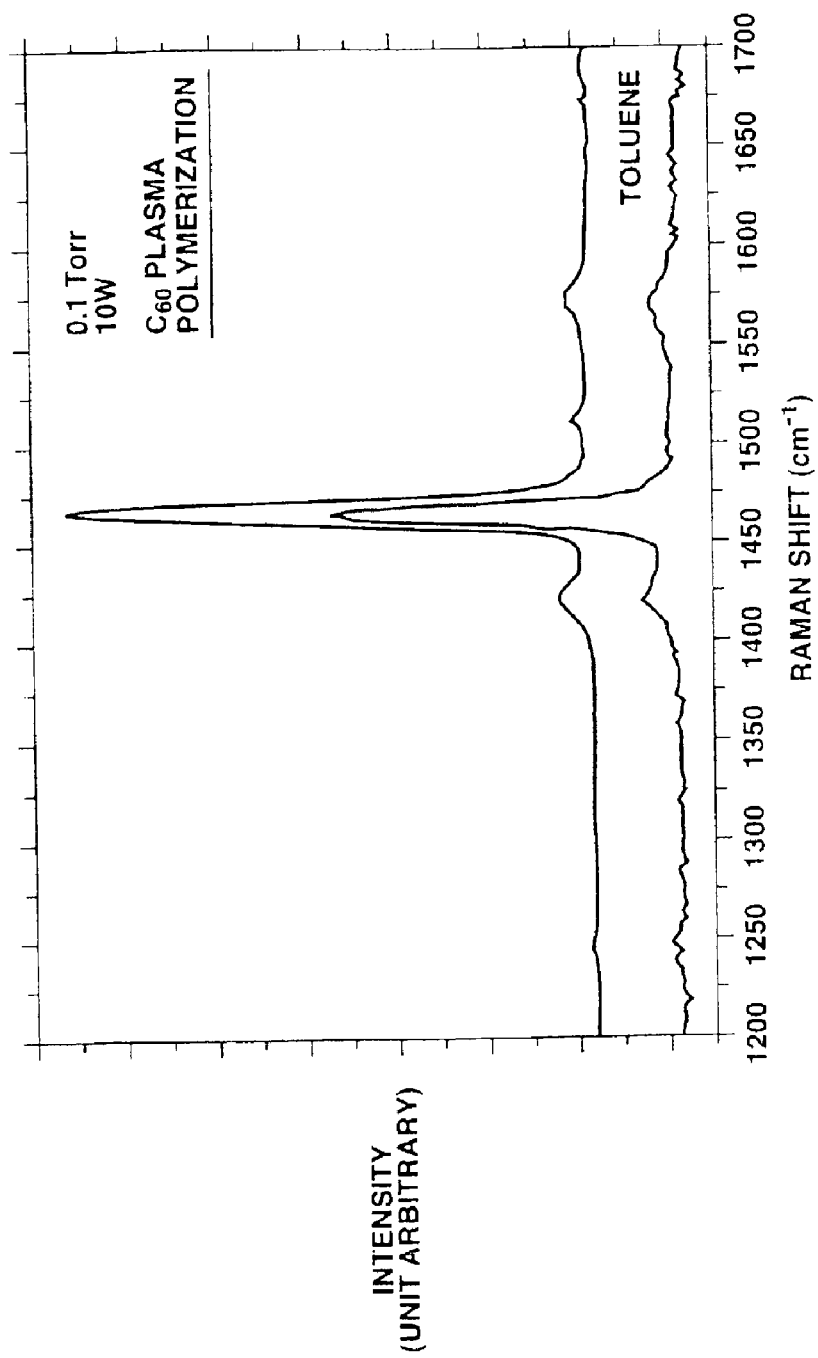
FIG. 71 shows Raman spectrum of a $C_{60}$ polymer film obtained by the plasma polymerization method under a constant power in case the pressure is changed.
Figure 72:
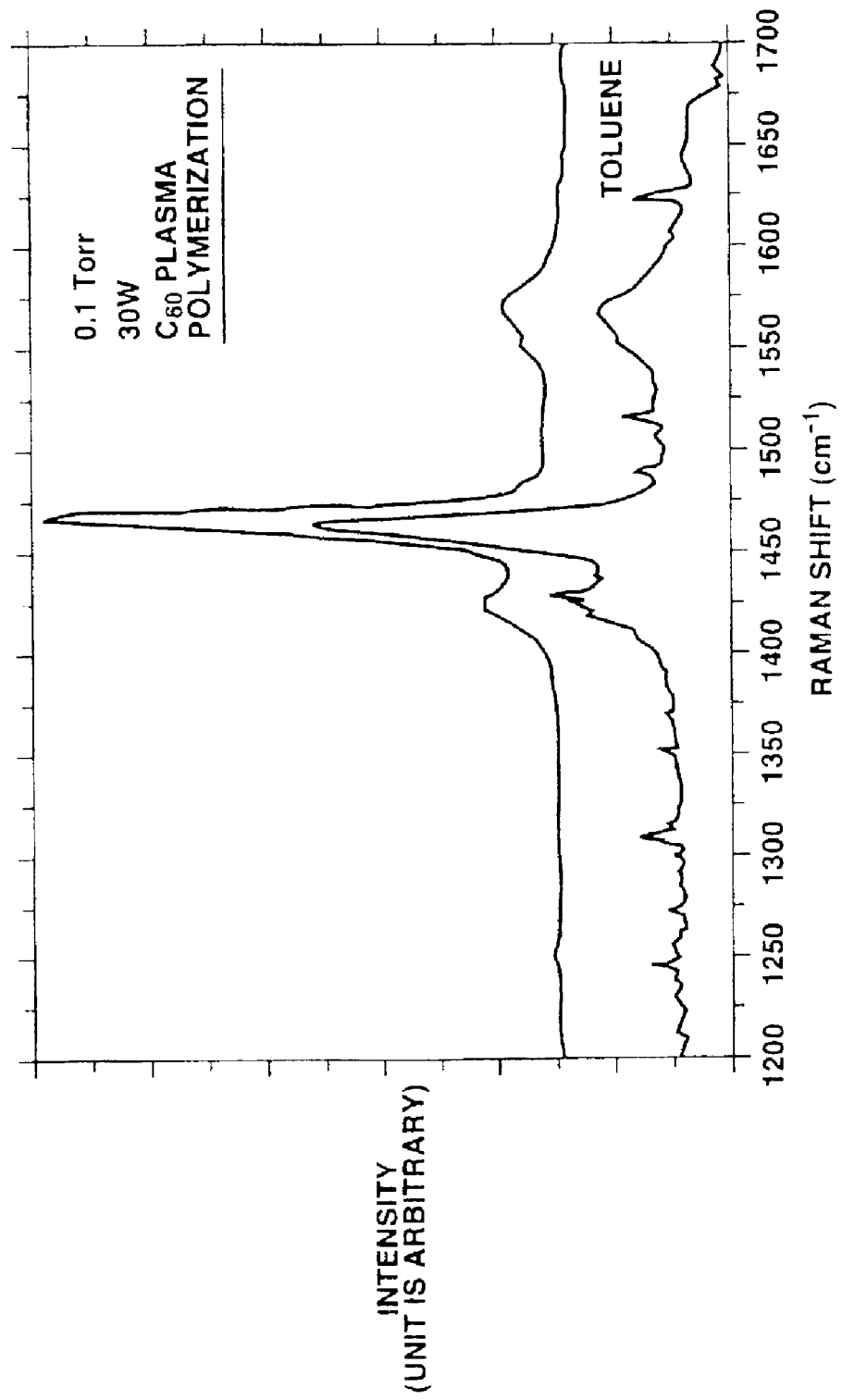
FIG. 72 shows the Raman spectrum of the $C_{60}$ polymer film in case the plasma power is changed.

C60 polymer films were also formed by plasma polymerization at a pressure of 0.1 Torr and a plasma power of 10 W and Raman measurement was carried out. The results are shown in FIG. 71. The results of Raman measurement of C60 polymer films, obtained in similar manner except changing the plasma power to 30 W, are shown in FIG. 72.

The values of Raman shifting in the above measurements are collectively shown in the following Table 3.

| $C_{60}$ film forming conditions | | pinch mode (cm$^{-1}$) | shift cm$^{-1}$, compared to C60 |
|---|---|---|---|
| 50 W | 0.01 Torr | 1468.0 | −1.0 |
| | 0.025 Torr | 1467.5 | −1.5 |
| | 0.05 Torr | 1464.2 | −4.8 |
| | 0.1 Torr | 1463.7 | −5.3 |
| | 0.15 Torr | 1463.8 | −5.2 |
| | 0.2 Torr | 1468.1 | −0.9 |
| | 0.3 Torr | 1468.1 | −0.9 |
| 0.1 Torr | 10 W | 1469.4 | +0.4 |
| | 30 W | 1468.6 | −0.4 |
| | 50 W | 1463.7 | −5.3 |

EXAMPLE 11

It is seen in Example 8 that the mode is shifted to a smaller number of waves, several Raman lines are activated by disappearance of molecular symmetry, and that the $C_{60}$ is polymerized as it holds its structure. This shifting is measured for qualitative and quantitative measurement of polymerization. The downward shift of 10 cm$^{-1}$ may theoretically be predicted as being ascribable to $C_{60}$ dimers and trimers. By the Raman spectrum of the $C_{60}$ thin film in the present example, the distortion mode of the five-membered ring of Ag(2) shifts by 4 to 5 cm$^{-1}$ as compared to $C_{60}$.

The evaluation by the Nexafs method then was carried out.

EXAMPLE 12

Figure 73:
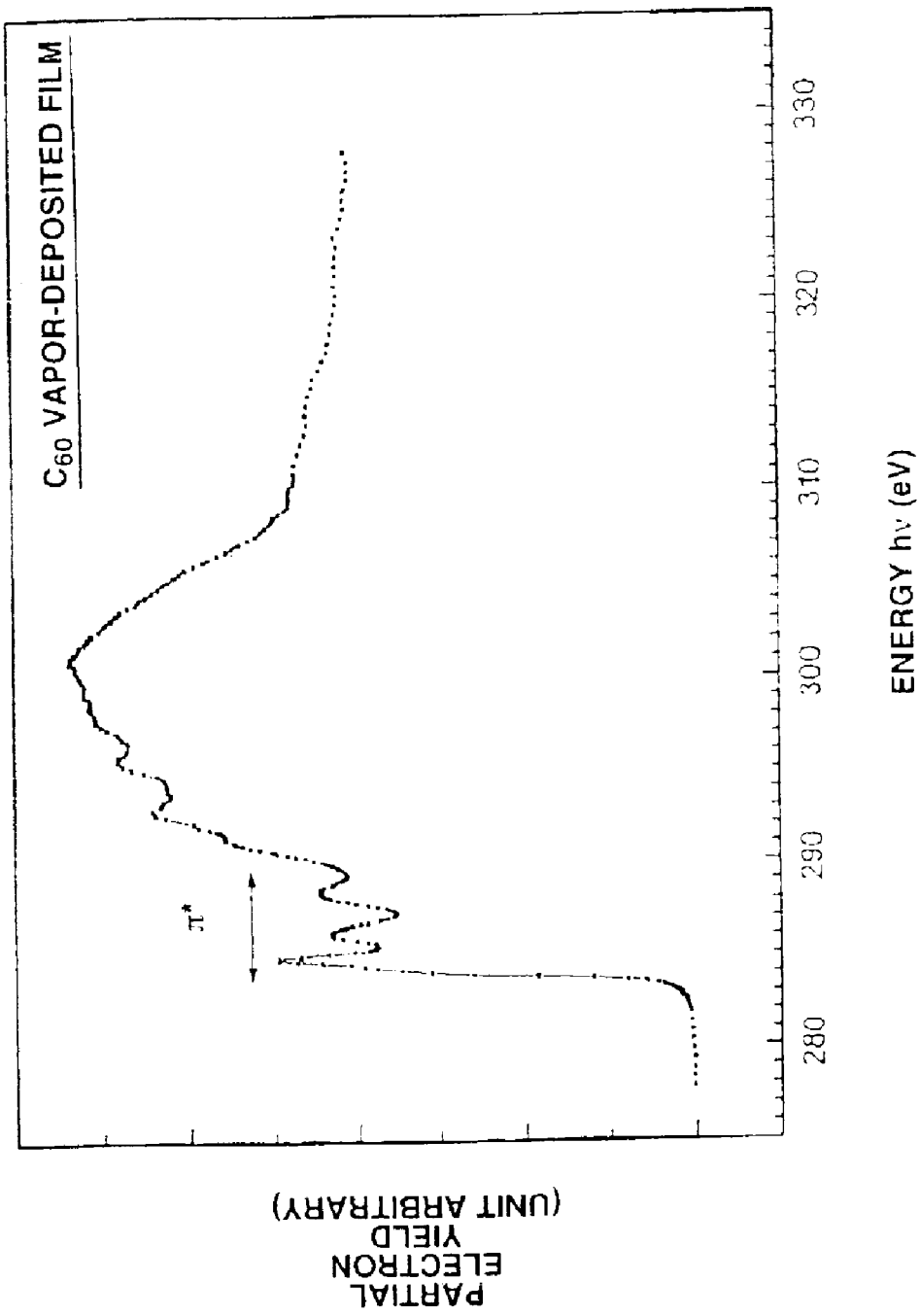
FIG. 73 shows the Nexafs spectrum of the $C_{60}$ vapor-deposited film.

Measurement was made of a carbon K absorption edge Nexafs spectrum of a $C_{60}$ vapor-deposited film. The results are shown in FIG. 73.

EXAMPLE 13

Figure 74:
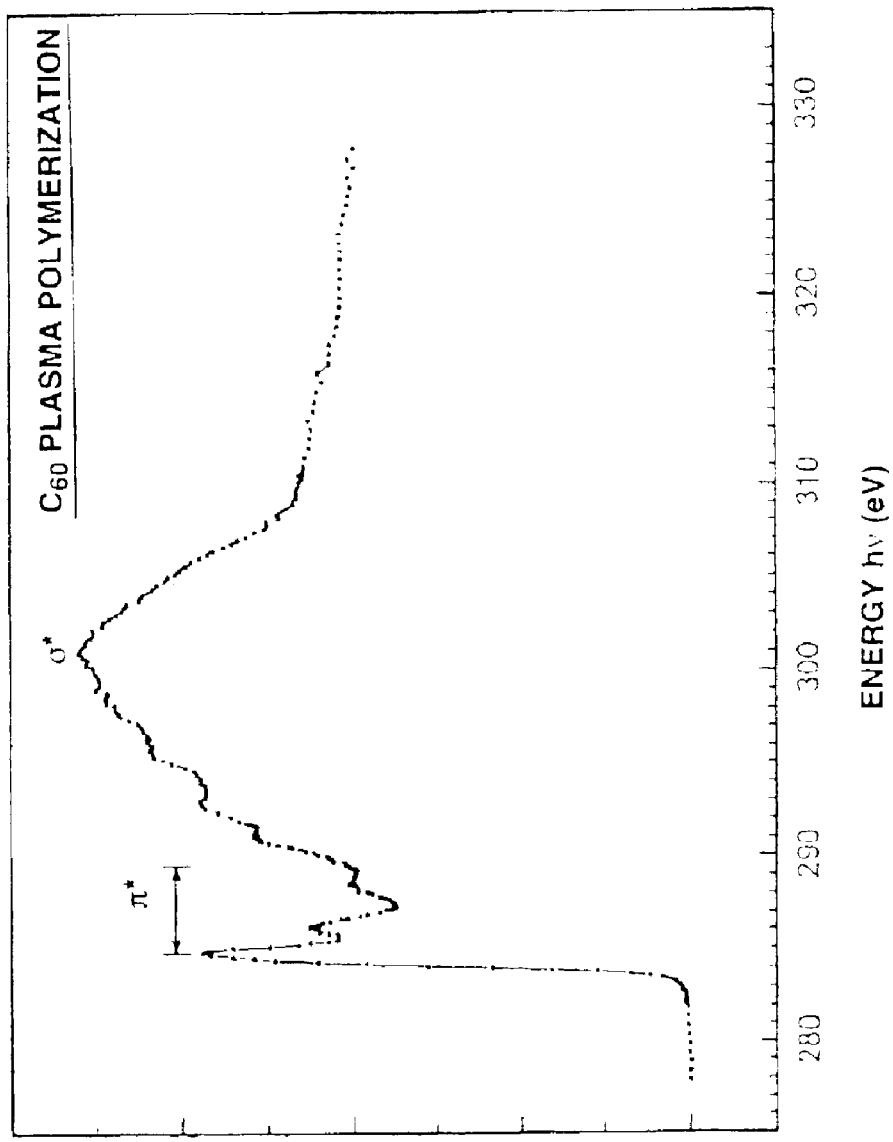
FIG. 74 shows the Nexafs spectrum of the $C_{60}$ plasma polymer film.

Measurement was made of a carbon K absorption edge Nexafs spectrum of a $C_{60}$ vapor-deposited film. The results are shown in FIG. 74.

Figure 75:
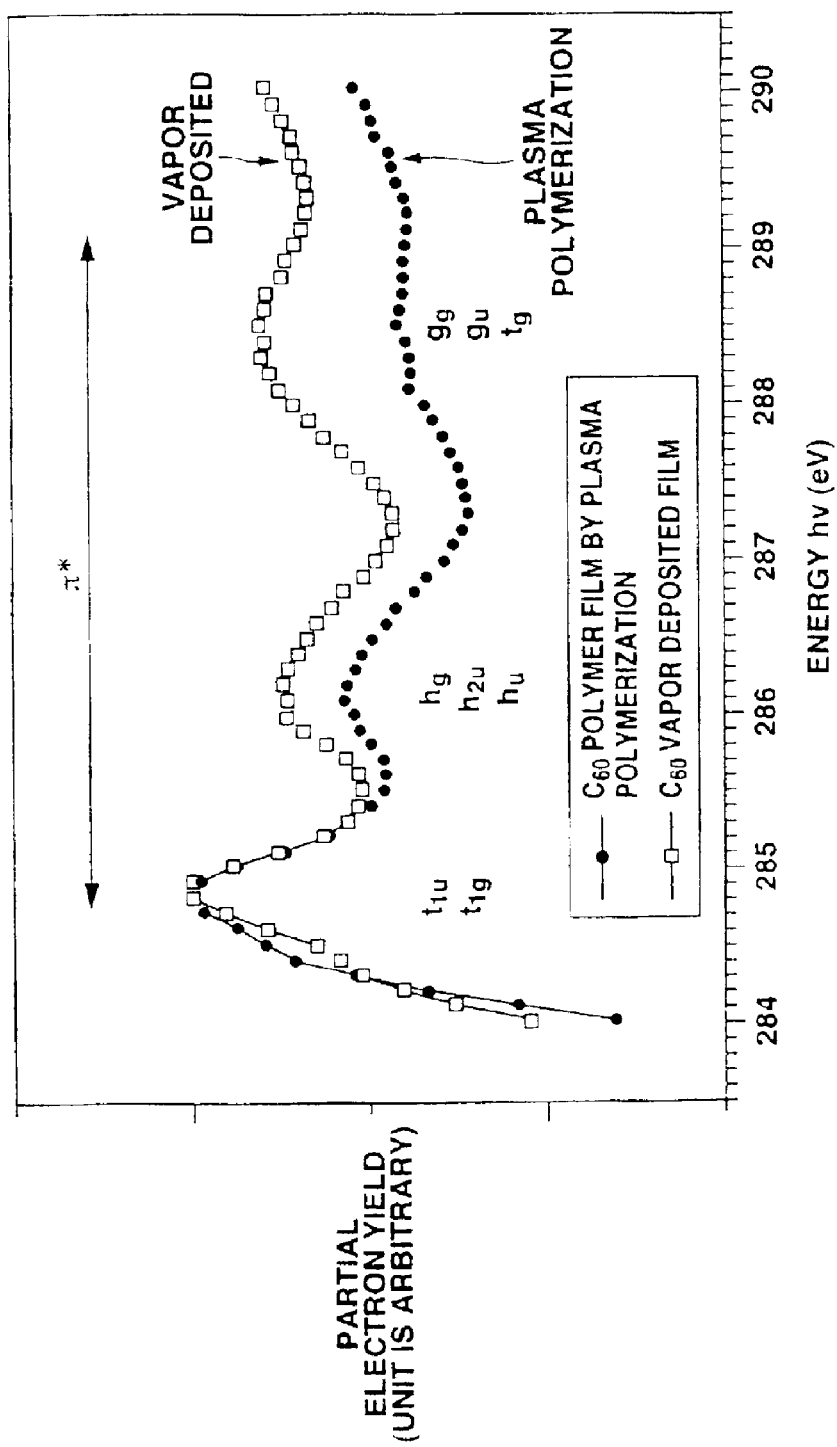
FIG. 75 shows the expanded portion π-antibonding orbital region for each sample of FIGS. 73 and 74.

The transition portion to the π antibonding orbitals of Examples 11 and 12 is shown enlarged in FIG. 75. The attribution of inherent values derived from calculations of the molecular orbit on the semi-empirical level and calculations carried out with parameterization of both MNDO/AN-1 and MNDO/PM-3 are shown. The calculated results of the $C_{60}$ dimers on the same level indicated that the spectral intensity may be predicted to occur with decrease in the number of electrons deemed to be π-electrons despite the occurrence of orbit level dispersion. The actual spectral pattern reproduces this satisfactorily.

EXAMPLE 14

Figure 6:
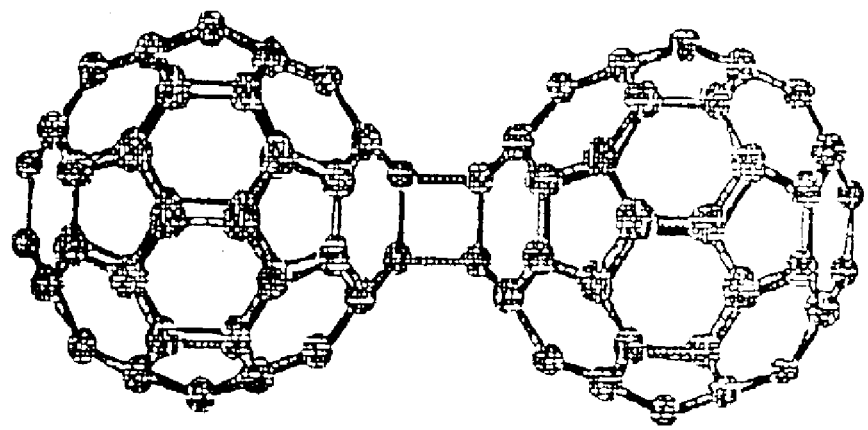
FIG. 6 shows a dimeric structure of another $C_{60}$ molecule.
Figure 7:
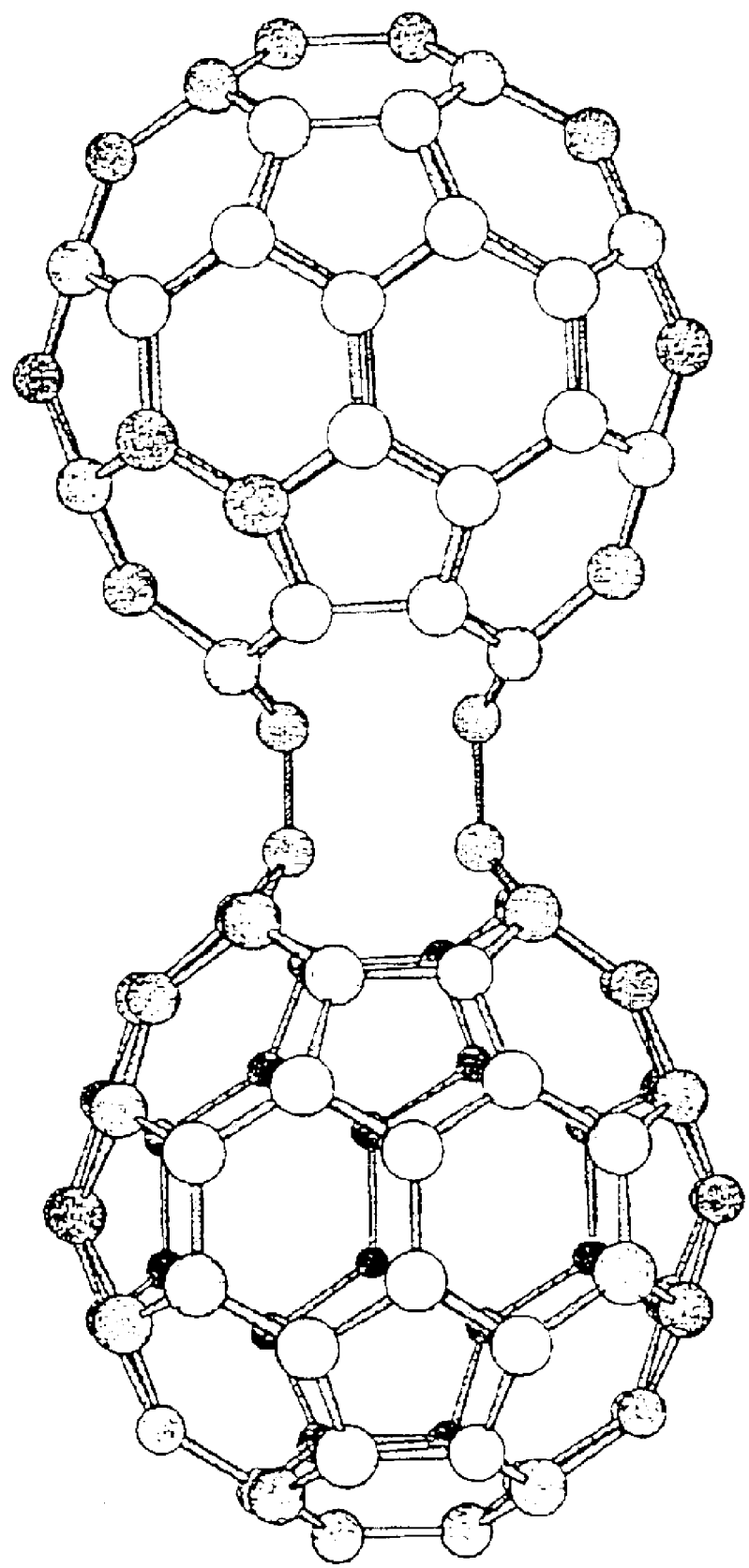
FIG. 7 shows another dimeric structure of another $C_{60}$ molecule [$C_{120}$(b)].
Figure 76:
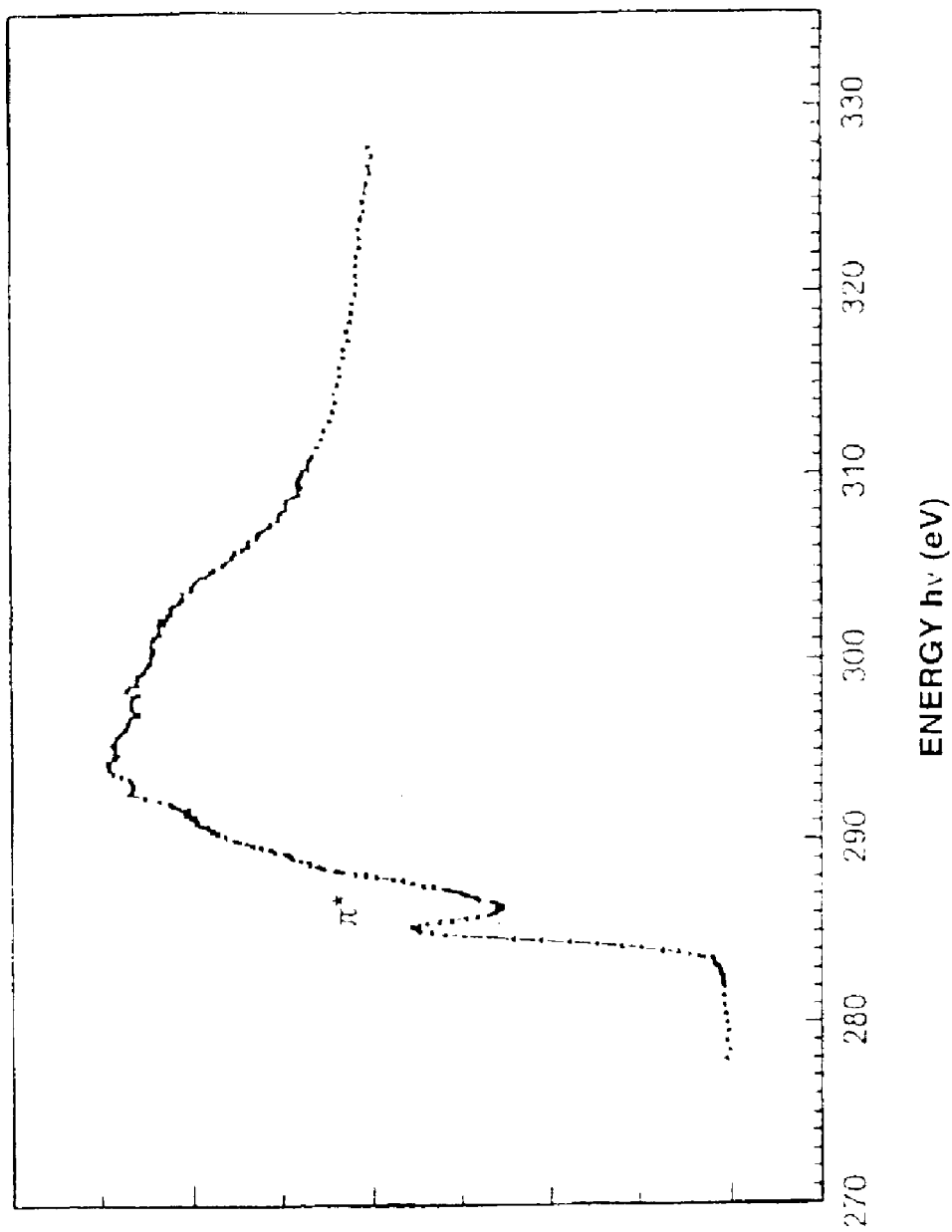
FIG. 76 shows the Nexafs spectrum of a C60 polymer film of a sample of FIG. 61.

Nexafs measurement was conducted on the thin carbon film shown in FIG. 6. The results are shown in FIG. 76, showing a pattern totally different from that shown in Examples 11 and 12, thus supporting the progress of amorphization.

EXAMPLE 15

Figure 77:
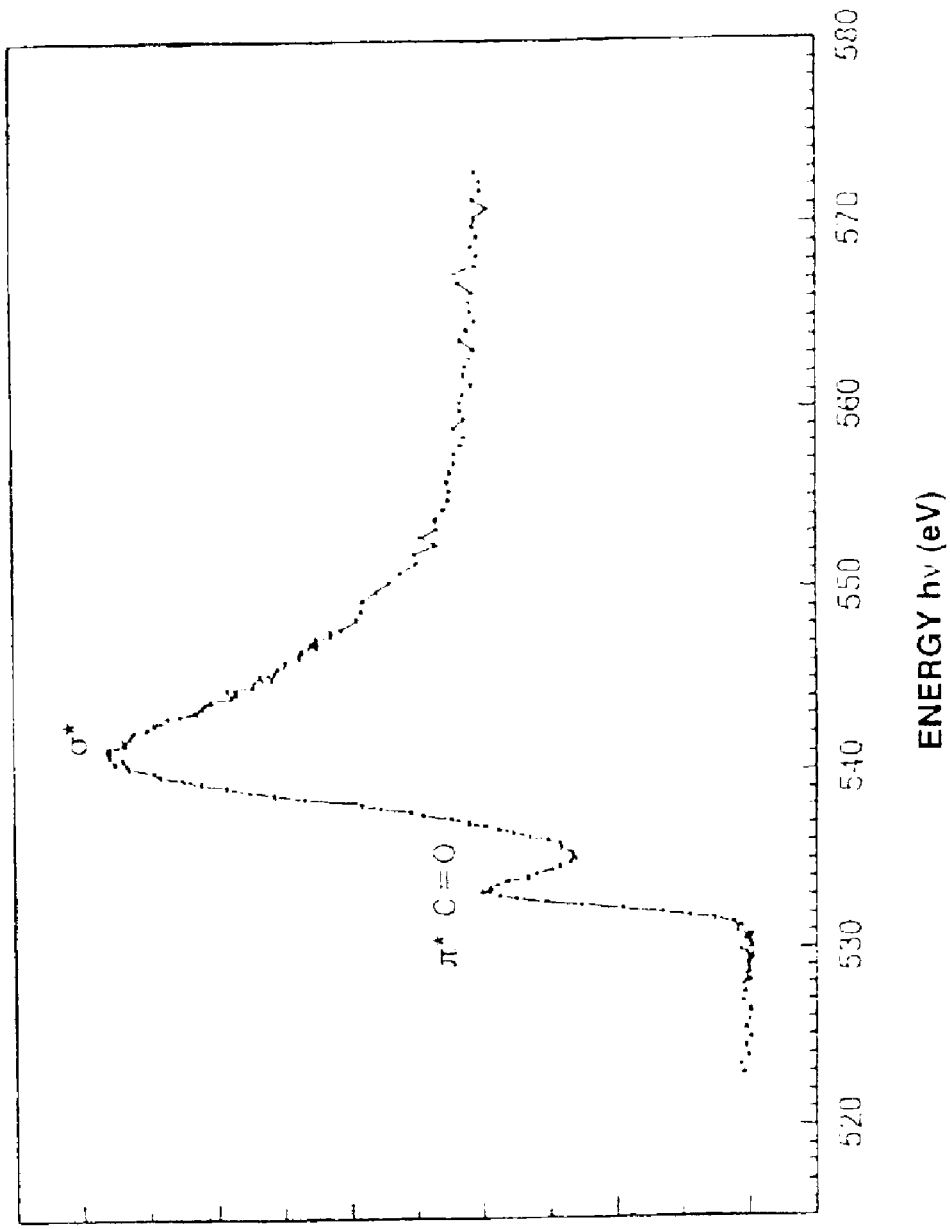
FIG. 77 shows the Nexafs spectrum of oxygen K edge of a thin carbon film of the sample of FIG. 76.

The surface of the sample of Example 13 was processed for five minutes with 50 W plasma and Nexafs measurement was conducted of the oxygen K-edge. The results are shown in FIG. 77. Since inherently the peak of this sort is not observed on a non-oxidized surface, it may be surmised that strong plasma illumination has induced amorphization, whilst oxidation has proceeded in atmosphere.

The above-described results of Nexafs measurement were compared on the valence band level. The results are shown in the following table 4.

TABLE 4

| film-forming condition (polymerization condition) | | valence band edge level (eV) |
|---|---|---|
| $C_{60}$ vapor-deposited film | | 6.25 |
| 50 W | 0.01 Torr | 5.22 |
| plasma polymerization | 0.1 Torr | 5.57 |
| | 0.3 Torr | 5.34 |

Figure 78:
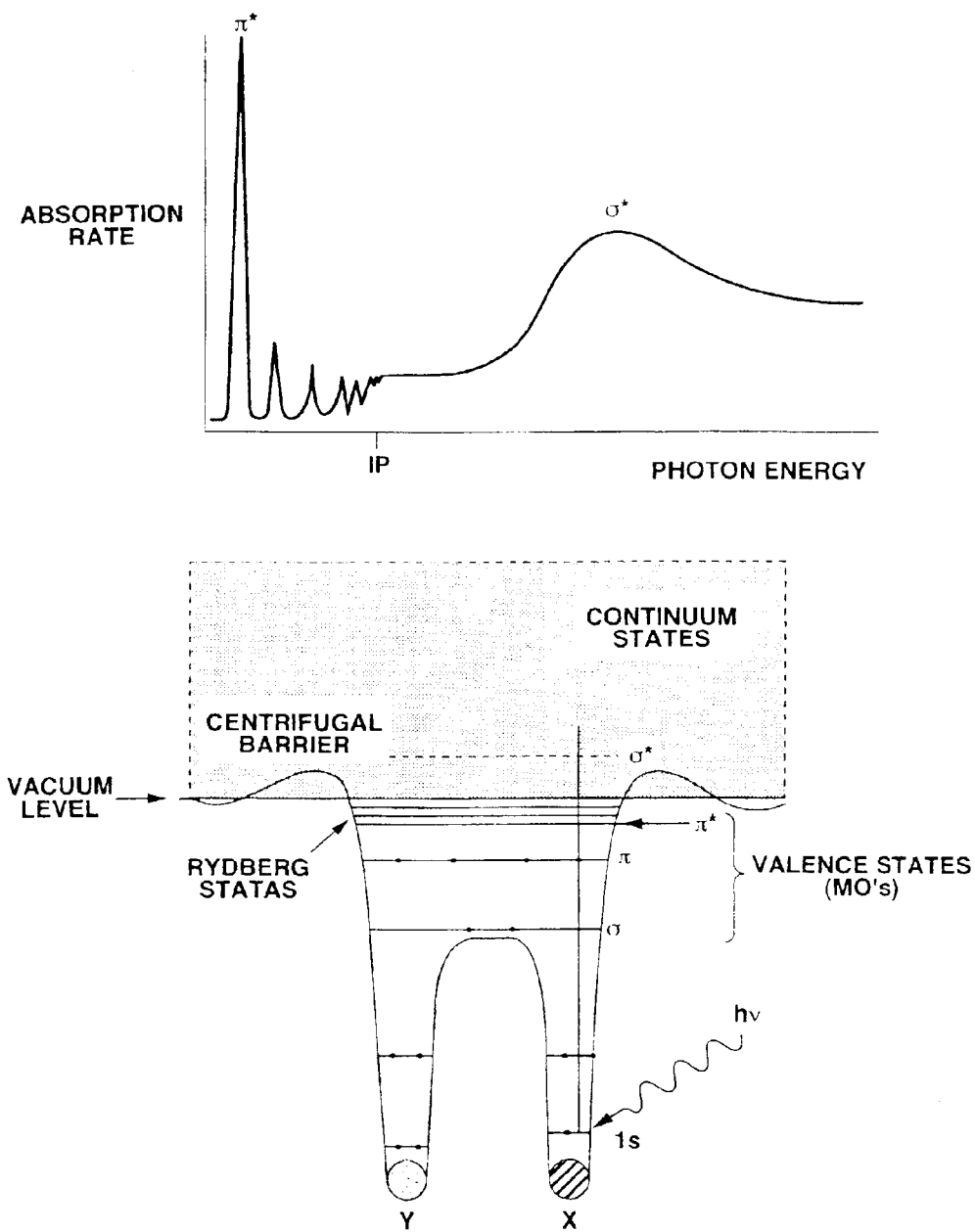
FIG. 78 shows the relationship between the spectrum of Nexafs method and electronic transitions.

FIG. 78 shows the relationship between the spectrum by the Nexafs method described above and the orbit transition of electrons and holes due to light induction associated therewith.

EXAMPLE 15

A heterojunction structure comprising an ITO electrode, manufactured in Example 4, a polythiophene film, a $C_{60}$ polymer film and an aluminum electrode (counter-electrode), in which a phthalocyanine film (active layer) is interposed between the polythiophene film and the $C_{60}$ polymer film and gold was used for the counter-electrode, was prepared by the method shown in Example 4.

Figure 79:
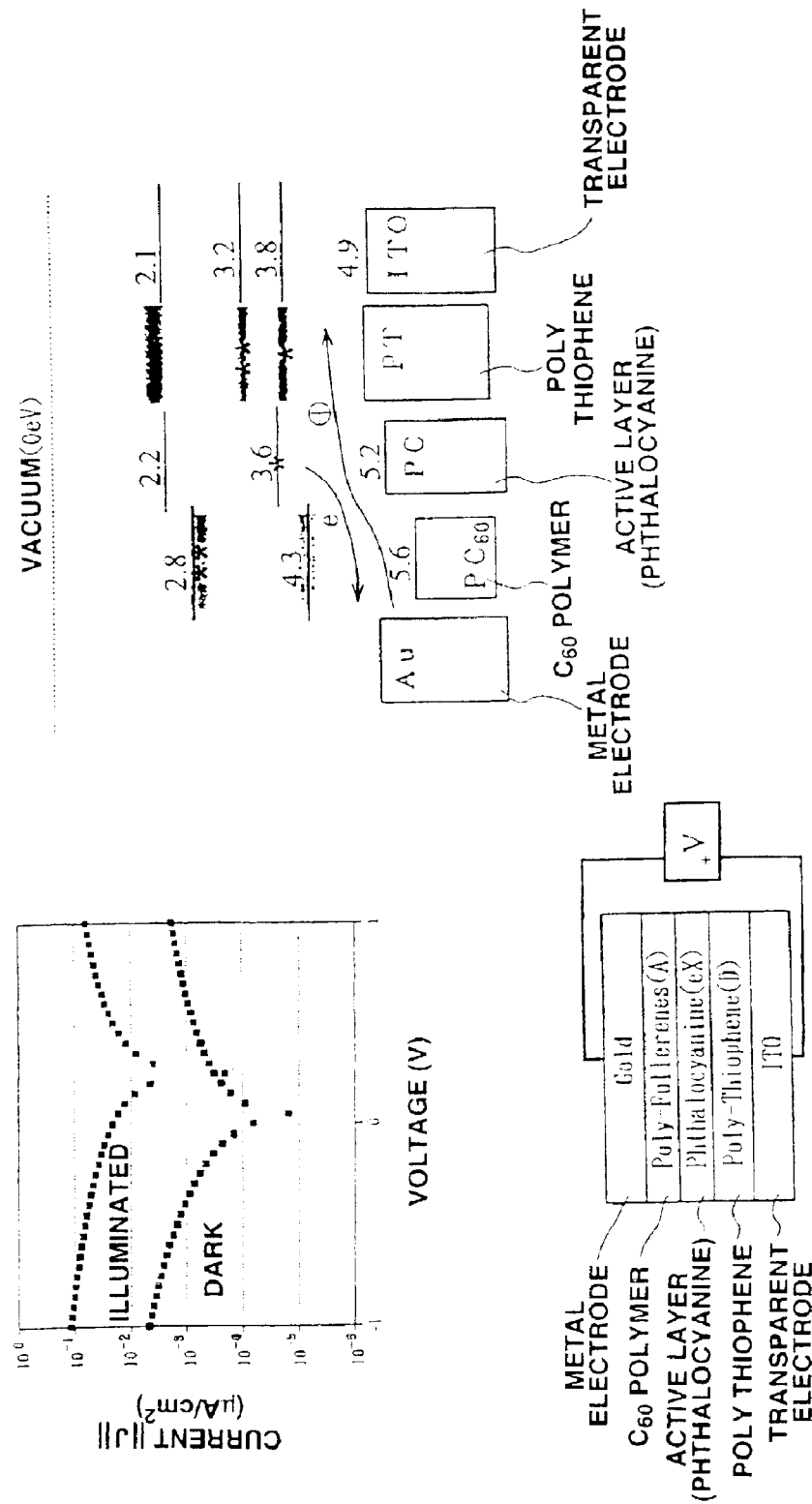
FIG. 79 shows V-I characteristics of a heterojunction structure having an active layer interposed between the electrically conductive high polymer film and a fullerene polymer film, according to the present invention.
Figure 80:
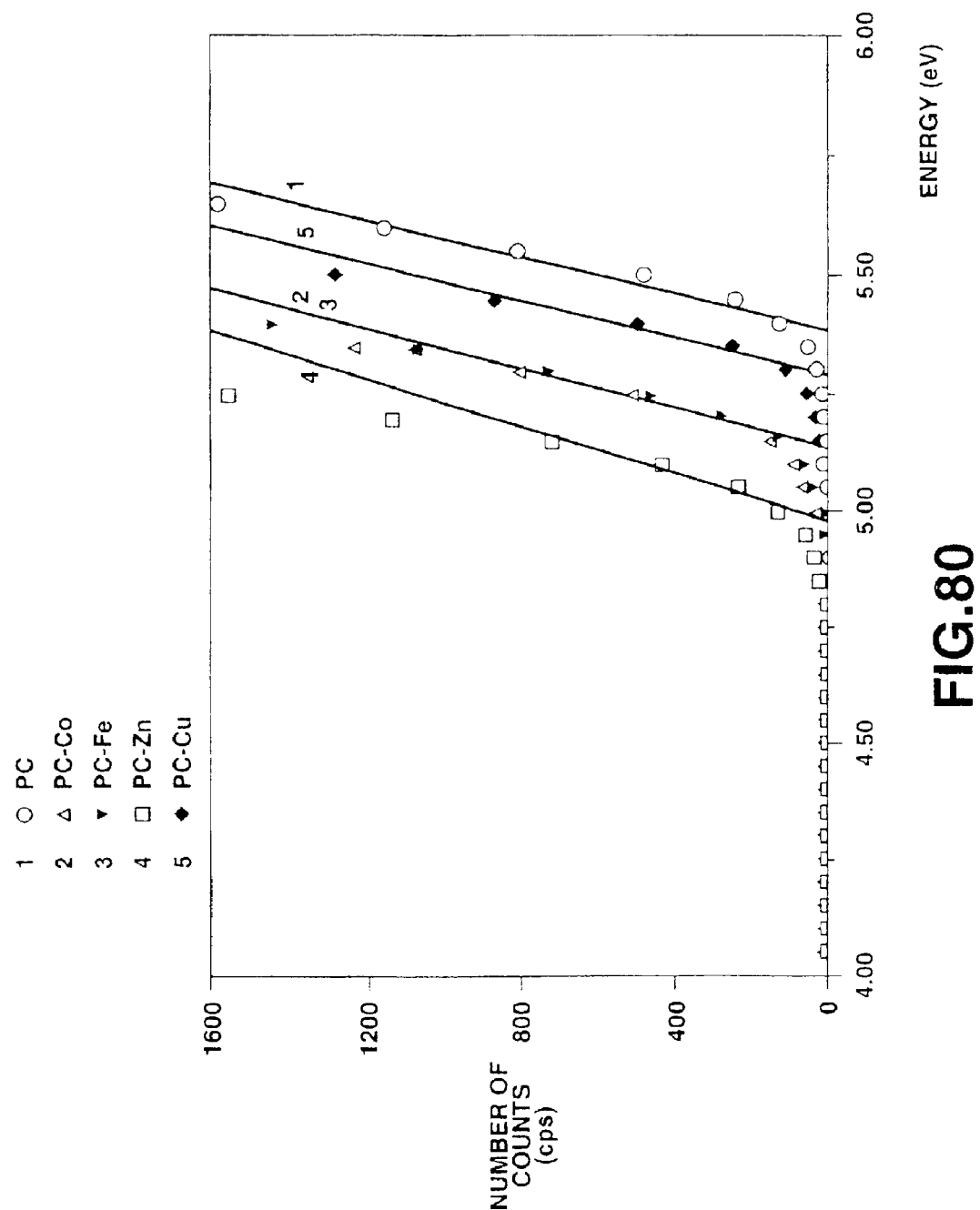
FIG. 80 shows photoelectron emitting spectra of phthalocyanine film.
Figure 81:
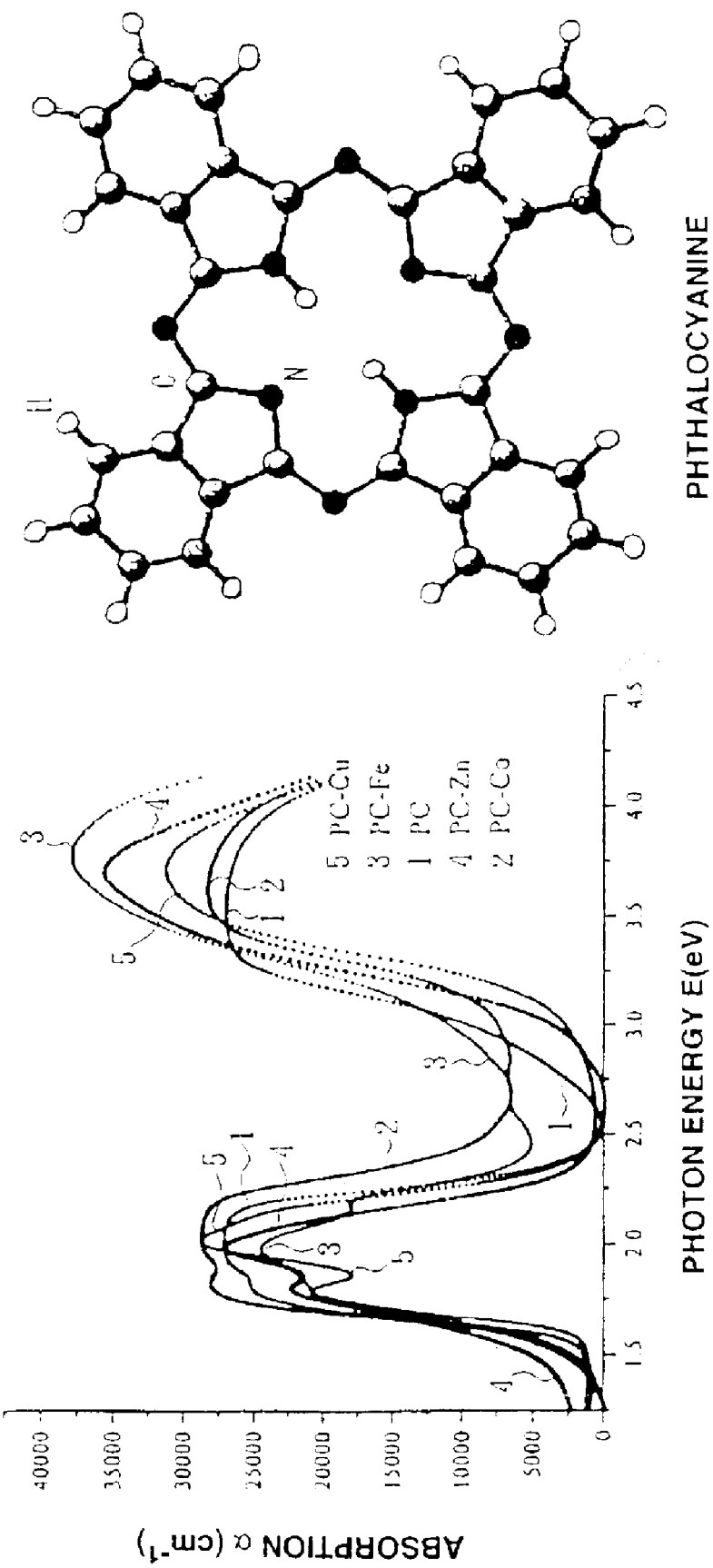
FIG. 81 shows the relationship between the photoelectron energy and absorption coefficients of the phthalocyanine film.

The V-I characteristics of the heterojunction structure are shown in FIG. 79, from which it is seen that the structure exhibits optimum photocell characteristics. The results of the photoelectron emission spectrum of the phthalocyanine film and the relationship between the photon energy and the absorption coefficient are shown in FIGS. 80 and 81, respectively.

EXAMPLE 16

A heterojunction structure comprising an ITO electrode, manufactured in Example 4, a polythiophene film, a $C_{60}$ polymer film and an aluminum electrode (counter-electrode), in which a glass substrate is layered on an outer surface of the ITO electrode (surface exposed to atmosphere) in FIG. 34C, was prepared by a method shown in Example 6.

This heterojunction structure failed to operate satisfactorily as a photocell. However, the structure is usable for measuring e.g., the light volume because it permits charge separation and displays linear V-I characteristics.

EXAMPLE 17

Figure 82:
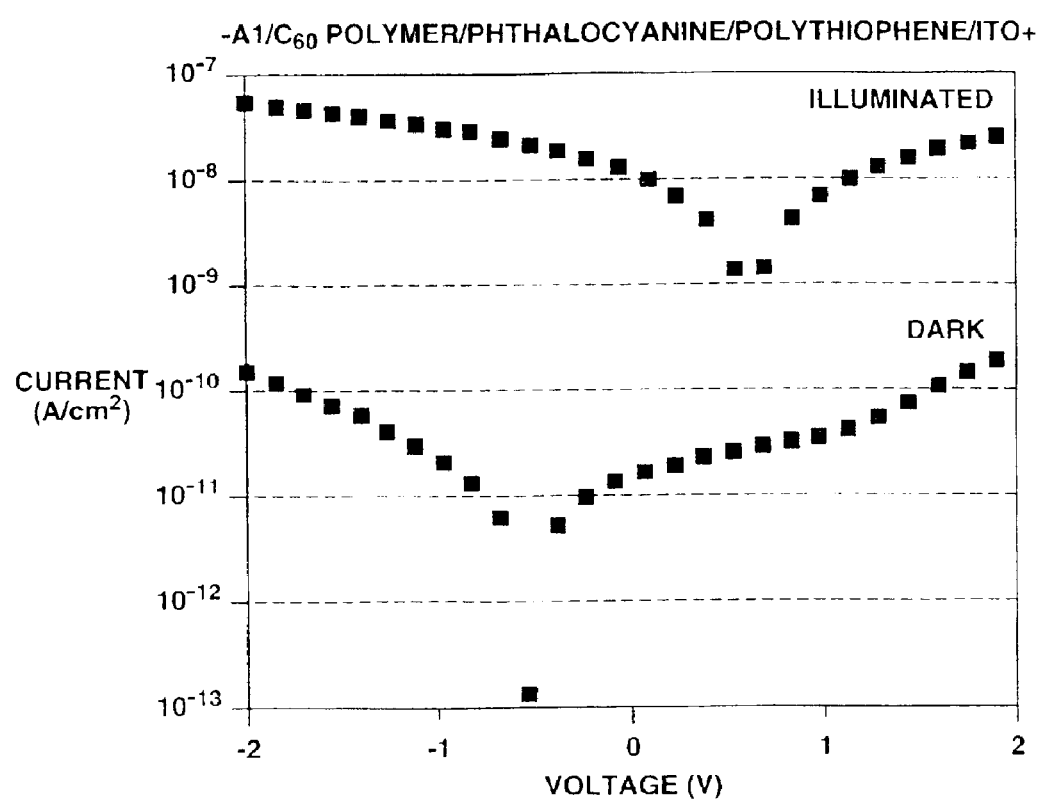
FIG. 82 shows V-I characteristics when the counter-electrode in the heterojunction structure of FIG. 79 has been changed.

A heterojunction structure of Example 15, in which aluminum was used as the counter-electrode in place of gold, was prepared by the method shown in Example 6, and its VI characteristics were measured. The results are shown in FIG. 82, from which it is seen that this heterojunction structure exhibits the function as the photocell.

EXAMPLE 18

First, tetrathiafulvalene molecules were deposited as a film on an ITO film similar to that of Example 1, by illuminating an argon plasma of a low plasma power of 20 W, as the molecules were vaporized by a molybdenum resistance heater. In the same process, a thin film was also formed on a glass substrate to measure the photoelectron emission and the band gap. As a result, the band gap was evaluated to be 2.4 eV, whilst the valence edge substantially coincided with the Fermi level of ITO.

The measured results of Raman and IR of the produced tetrathiafullvalene suggested that the tetrathiafulvalene molecules are of a dehydrogenated and polymerized structure. The electrically conductivity was of the order of $10^{-4}$ to $10^{-2}$ S/cm, depending on delicate conditions of the plasma.

On this tetrathiafulvalene thin film was then formed a fullerene polymer film. First, fullerene molecules, as a starting material, were prepared as follows: In the device shown in FIG. 35, arc discharge was carried out by DC current of 150 A, under the atmosphere of 100 Torr of helium, using a graphite rod 10 cm in diameter and 35 cm in length as a positive electrode. After the graphite rod was substantially vaporized to give a fullerene containing soot, the two electrodes were reversed in polarity and products deposited and heaped on the inherent negative electrode, such as carbon nanotubes, were further vaporized to produce the soot. The soot heaped in a water-cooled reaction vessel was recovered by a sweeper to produce crude fullerene by extraction with toluene. This crude fullerene was washed with hexane, passed through a flush column charged with the activated charcoal to yield only C60, which then was purified by sublimation in vacuum.

Next, a fullerene polymer film was formed. The fullerene molecules, as a starting material, were prepared as in the above-described Example. The fullerene molecules were charged into a molybdenum boat and set on a site of a reaction tube of a micro-wave polymerization device. After evacuating the interior of the reaction chamber by a molecular turbo-pump, the argon gas started to be introduced. When the inside of the reaction chamber was constant at 0.05 Torr, a micro-wave oscillation device was actuated to set a micro-wave power of 50 W by making adjustment by a tuner. When the micro-wave output was constant, current was supplied to the molybdenum boat and the current value was gradually raised to raise the temperature. Fullerene vaporization and heaping was monitored by a quartz film thickness sensor provided laterally of a substrate. For confirmation, the film thickness of the polymer film was measured using a contact type film thickness meter. For measuring the current, a nanoammeter was used. The band gap of the fullerene polymer film was determined from the temperature dependency of the current value.

During film formation, a glass substrate and a silicon substrate etc were set simultaneously in a bell jar to measure the physical properties. The mass spectrography of the fullerene polymer film was effected by ionization and ablation by a pulsed nitrogen laser using a time-of-flight mass spectrometer. The dangling spins were measured using an x-band electronic spin resonation device in a nitrogen atmosphere. The number of dangling spins per unit weight of the fullerene polymer thin film was found by the relative comparison method of the third and fourth absorption lines from the low magnetic field of a digital manganese marker, using a solution in toluene of d-tert-butyl nitroxide as a standard spin. Meanwhile, the value of the band gap was found from the results of measurement of the transmittance by the forbidden-indirect method.

Figure 47:
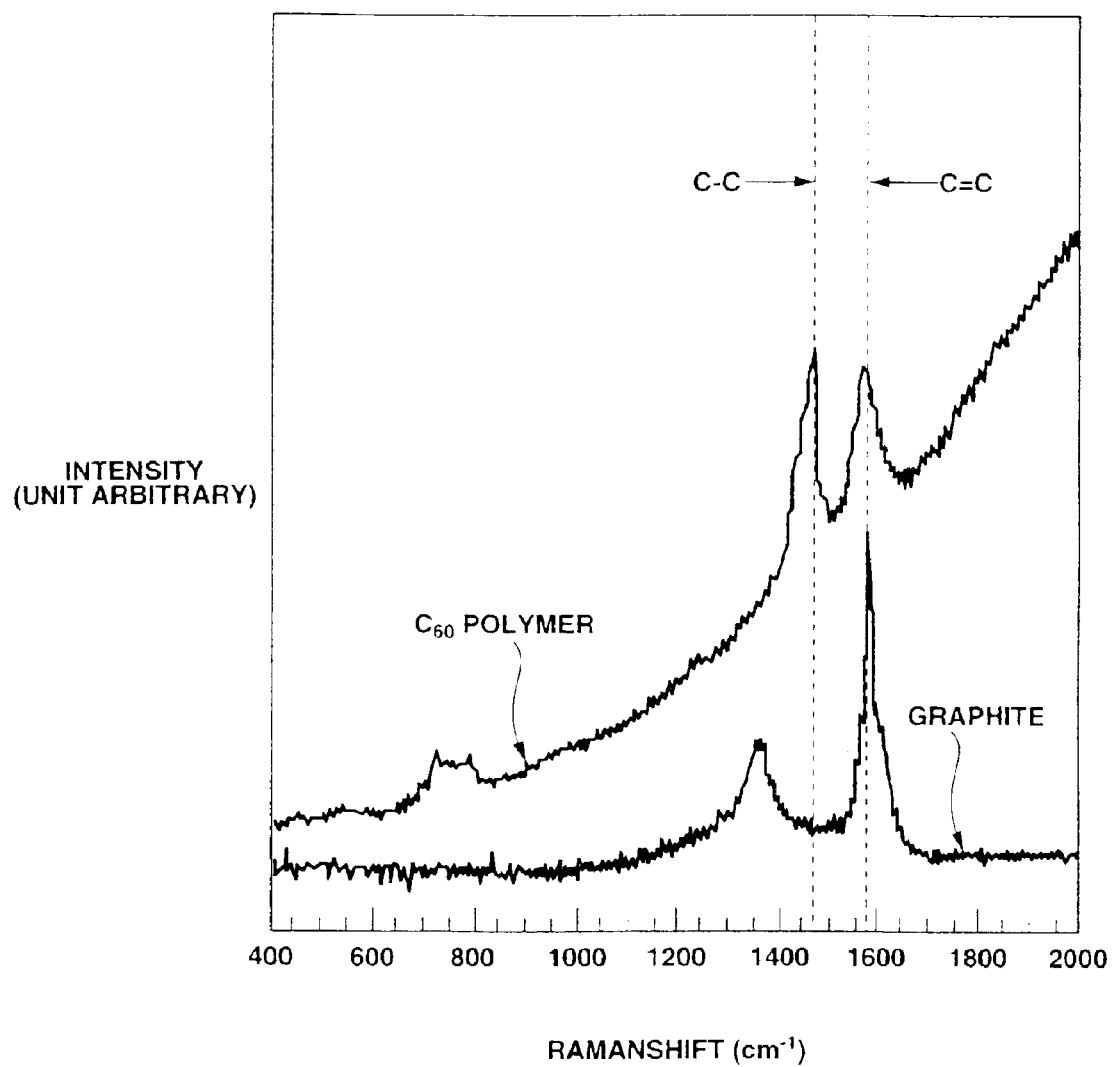
FIG. 47 shows the results of Raman spectroscopic measurement of a C60 polymer film in comparison with those of the graphitic carbon.
Figure 83:
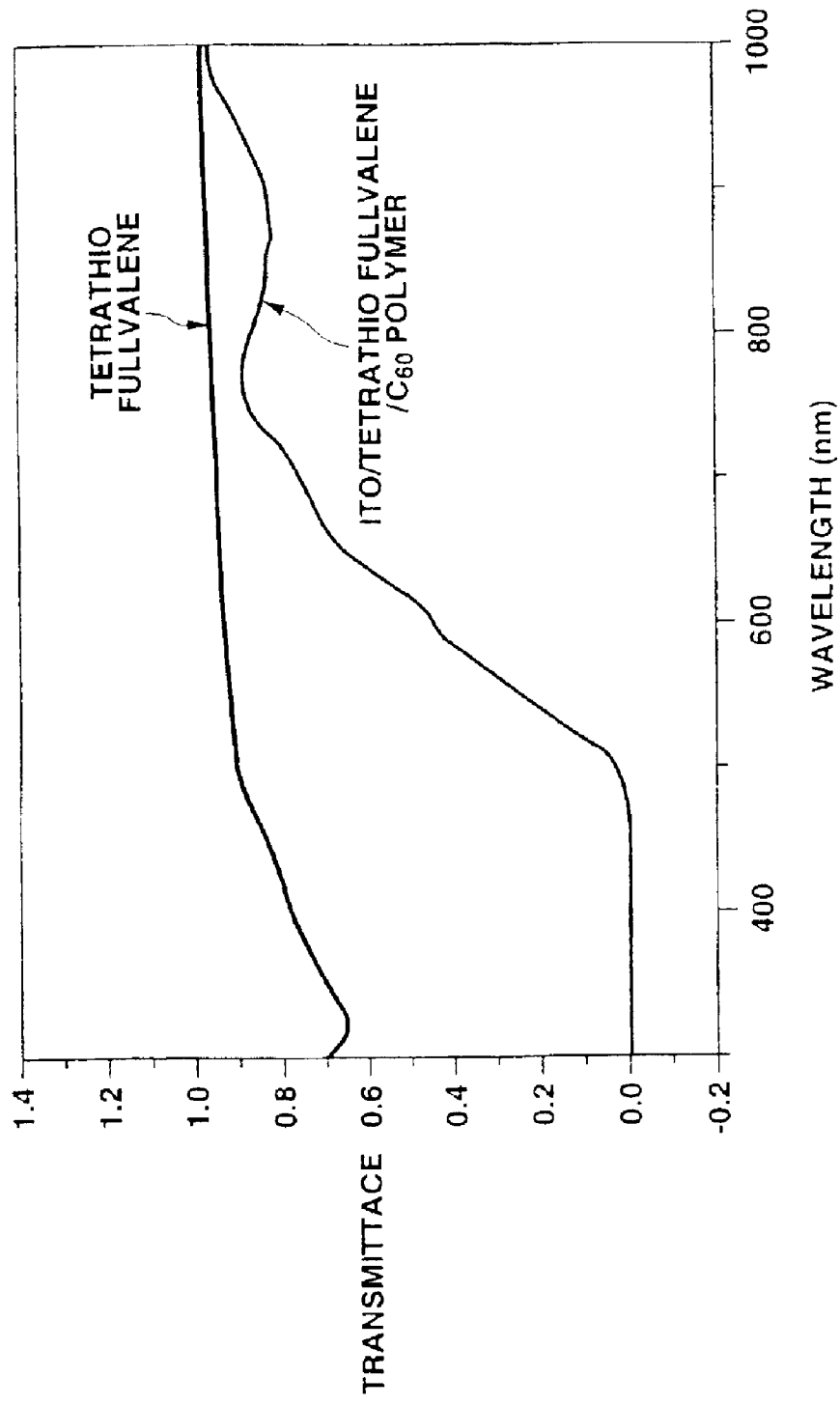
FIG. 83 shows absorption spectrum of ITO-tetrathiafulvalene-C60 polymer structure.

These measured results were the same as those of the Example 3. Moreover, the results of Raman spectroscopic measurement of the $C_{60}$ polymer film and evaluation of the edge level of the valence band were the same as those in FIGS. 47 and 48. Measurements were also made of transmittance characteristics of the layered structure of the ITO-tetrafulvalene-$C_{60}$ polymer. The results are shown in FIG. 83.

An indium electrode was set as a counter-electrode on a layered structure comprising a $C_{60}$ polymer deposited by plasma polymerization on the tetrathiafullvalene film (electrically conductive polymer). First, the inside of a vapor deposition device was evacuated to vacuum of $10^{-8}$ Torr by a turbo-pump and subsequently back-filled with a high purity hydrogen gas. An indium film was formed on a hetero thin film in a hydrogen atmosphere of 10–5 Torr. From the evaluation of the valence electron band edge by the photoelectron emission method, Fermi level by the contact potential difference method and the band gap by the optical technique, the band structure of the produced heterojunction structure is similar to that shown in FIG. 55.

The V-I characteristics of the heterojunction structure were evaluated. Using a 500 W xenon lamp, it was checked whether or not the structure has characteristics as a photocell. As a result, a marked photocell function could be ascertained when the light is illuminated from the ITO side.

EXAMPLE 19

Figure 84:
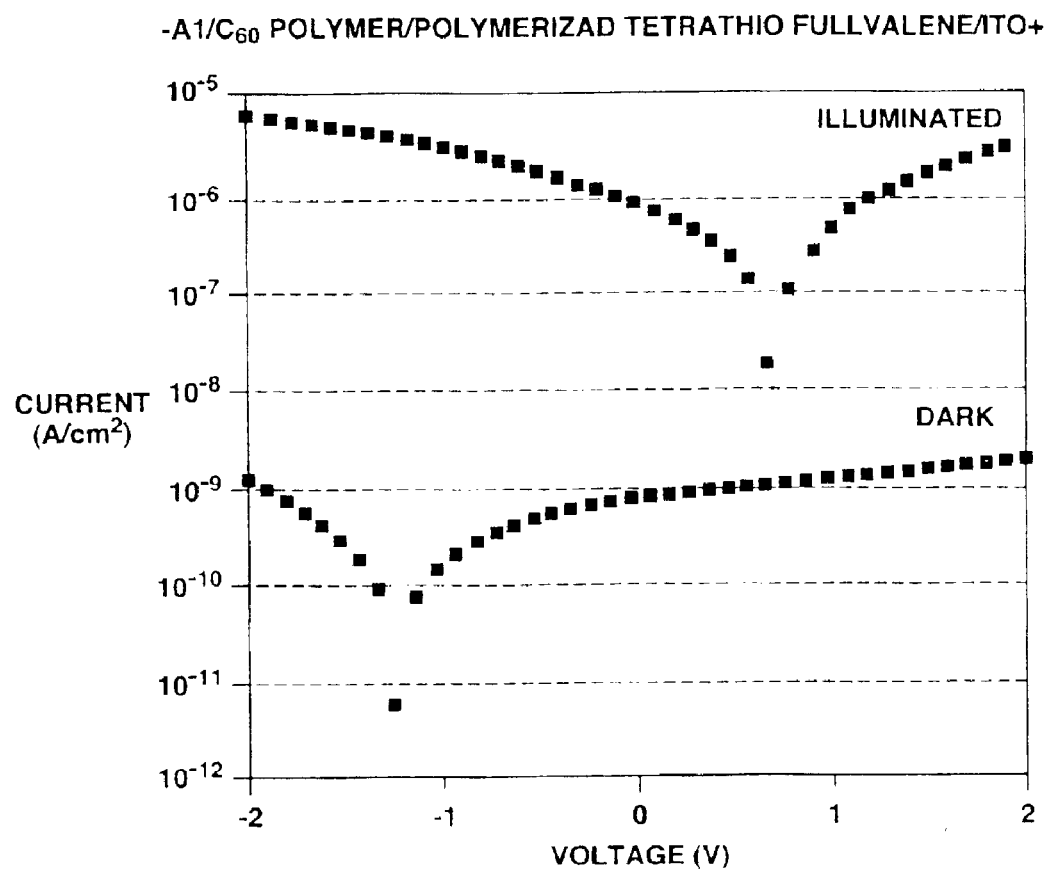
FIG. 84 shows V-I characteristics of another heterojunction structure according to the present invention.

Another heterojunction structure, which is the same as that described above except using aluminum in place of indium, was prepared, and its V-I characteristics were measured. The results are shown in FIG. 84, from which it is seen that this heterojunction structure displayed a function as the photocell.

EXAMPLE 20

A heterojunction structure comprising an ITO electrode, a tetrafullvalene layer, a C60 polymer layer and an indium electrode, manufactured in Example 18, in which the tetrafullvalene layer and the C60 polymer layer were interchanged, was prepared. This heterojunction structure, displaying linear VI characteristics, failed to operate satisfactorily as a photocell, however, it allowed for charge separation.

EXAMPLE 21

Figure 85:
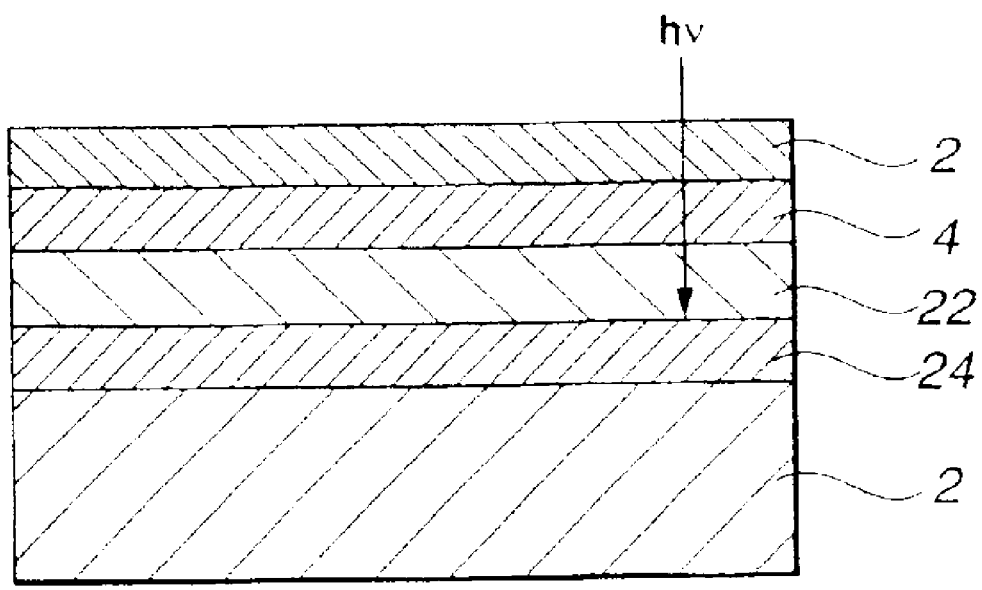
FIG. 85 shows an illustrative cross-sectional structure of a heterojunction structure according to the present invention and particularly shows a five-layer structure.
Figure 86:
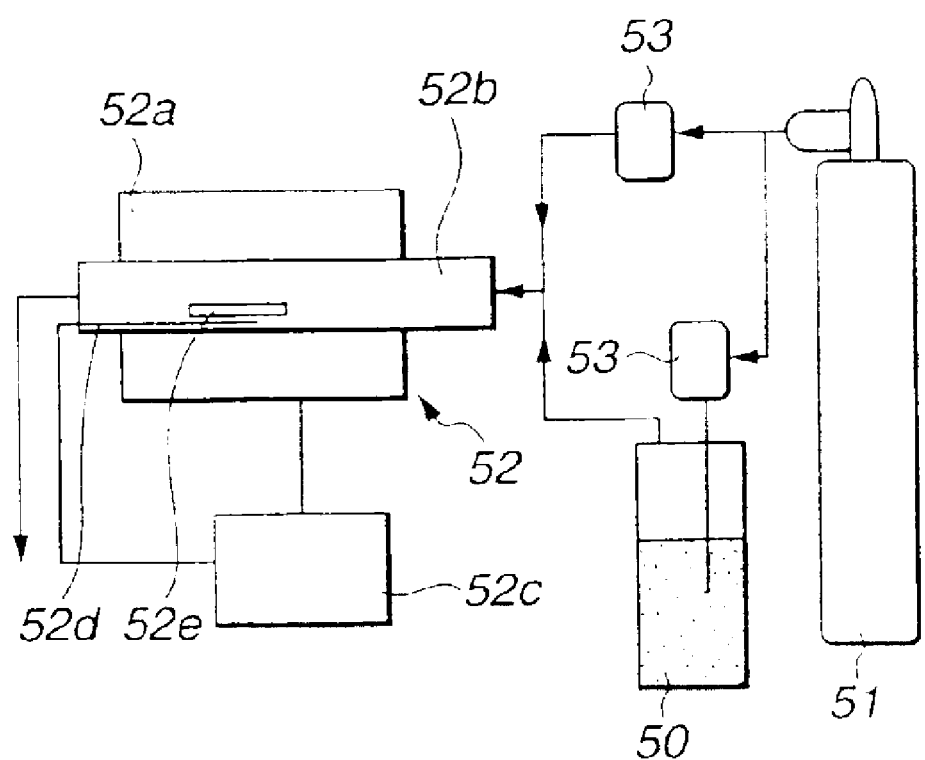
FIG. 86 is a schematic view showing the structure of a film-forming apparatus for a heterojunction structure.

Vapor Deposition Film Electromagnetic Wave Illumination Method, Preparation of a Solar Cell and its Physical Properties For preparing the structure shown in FIG. 85, and for first depositing a carbonaceous thin film, a film forming device shown in FIG. 86 was prepared. This film forming device is made up of a simple type organic solvent gas bubbler 50, a gas bomb 51 for supplying a carrier gas thereto, and a simple type electrical furnace 52 for thermal decomposition of the organic solvent gas. A needle valve 53 for flow duct adjustment is provided in each of the flow duct between the gas bomb 51 and the organic solvent gas bubbler 50 and the flow duct between the gas bomb 51 and the electrical furnace 52.

The electrical furnace 52 has a furnace core 30 mm in diameter and a heater 52b within which a thermocouple 52d for connection to an external heater temperature controller 52 and a quartz substrate (glass substrate) 52, corresponding to the substrate 1, directly above the controller 52c, for assuring correct film-forming temperature of the quartz substrate 50e. Meanwhile, a relay circuit for PID control was operated in unison for temperature control of the quartz substrate 50e. With the film-forming device, constructed as described above, is able to deposit a carbonaceous thin film with a temperature error less than 1° C.

The temperature of the electrical furnace 52 was set to 800° C. After introducing the quartz substrate 52e into the quartz tube 52b, an argon gas, with a purity of 99.999%, was introduced from a gas bomb 51 into the quartz tube 52b to fill the inside of the tube with the argon gas.

When the inside of the quartz tube 52b is completely the argon gas atmosphere, and the temperature has reached 800° C., the toluene gas was started to flow into the inside of the quartz tube 52b through the organic solvent gas bubbler 50. The flow velocity of the toluene gas, introduced into the organic solvent gas bubbler 50, was maintained at 50 ml/min.

After continuing gas bubbling for 30 minutes, only the argon gas was allowed to flow into the quartz tube 52b, and the electrical furnace 52 was cooled gradually. After confirming that the electrical furnace 52 was cooled substantially to room temperature, the quartz substrate 52e was taken out of the quartz tube 52b. On the surface of the quartz substrate 50e was formed a thin carbon film presenting a mirror surface.

Figure 87:
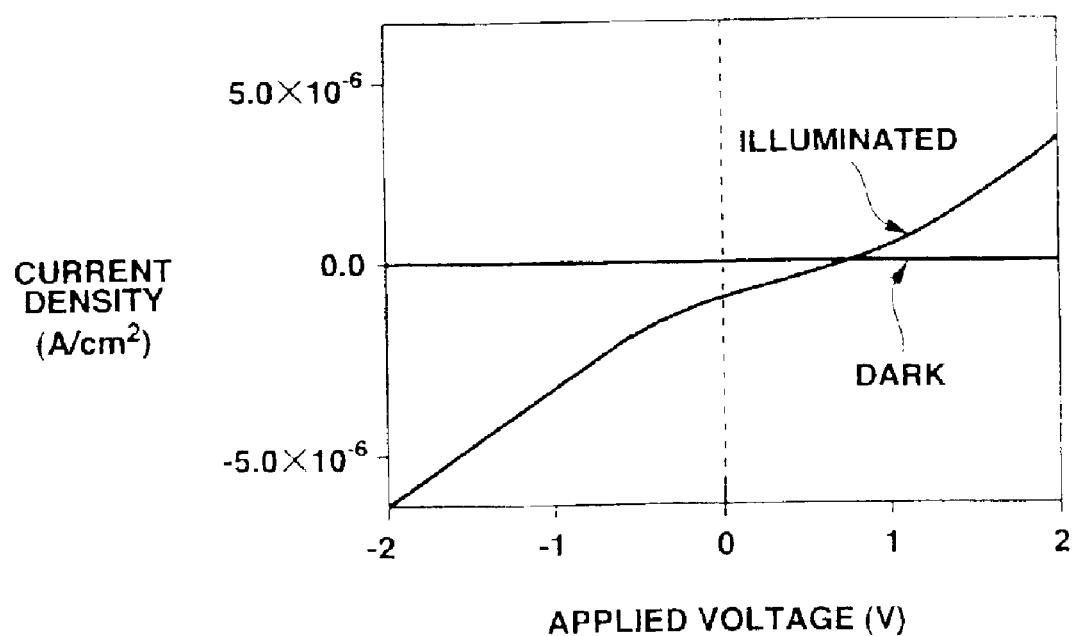
FIG. 87 shows V-I characteristics on light illumination of the heterojunction structure.

On the carbon thin film, a $C_{60}$ polymer film was formed, as explained in connection with Example 1. The junction structure of the carbon thin film and the fullerene polymer film, thus fabricated, is a structure useful for isolating the carrier generated on light illumination, such that, if the structure is used in a compound structure of, for example, a glass substrate—ITO electrode—carbon thin film—fullerene thin film—aluminum electrode, it is particularly useful for a solar cell. This structure has desirable properties, as may be seen from FIG. 87 showing V-I characteristics on light illumination thereon.

What is detrimental in this case is that the electrically conductivity of the light-transmitting electrode is impaired when forming a carbon thin film on a light-transmitting electrode formed e.g., of ITO.

For avoiding this problem, a compound structure such as a glass substrate—thin gold electrode—thin carbon film—fullerene polymer film—aluminum electrode is preferably used. This compound structure operates as a solar cell, as may be seen from the I-V characteristics before and after light illumination. In order to provide a compound structure optimum for this application, it is necessary to scrutinize into variable factors, such as band gap of the carbon thin film, thickness of the fullerene thin film or the Fermi surface level of the electrode material.

As may be seen from the foregoing, the heterojunction structure of the present invention permits charge separation by light induction and finds application as a solar cell or as a light emitting diode.

Moreover, as for identification of the fullerene polymer, positive results can be achieved by the combined use of the Raman and Nexafs methods. Since it is possible to check that the fullerene polymer film has positively been formed before proceeding to the subsequent step of forming the next upper layer film forming step, the targeted heterojunction can be prepared reliably. Moreover, if the polymerization degree of the fullerene polymer film is found to be insufficient, the information may be fed back to the polymerization step to control the fullerene polymerization conditions.

Meanwhile, the heterojunction structure of the present invention may be variably designed as to its layered structure, insofar as the above-described basic structure is kept, such that, depending on the application, the respective layers can be divided into plural layers, or the film thicknesses of the respective layers can be designed optionally.

In the heterojunction structure of the present invention, in which the electron-donating electrically conductive organic film and the electron-accepting fullerene polymer film are layered between a pair of electrodes, at least one of which is light transmitting, such that the heterojunction structure permits charge separation by light induction and finds application in a solar cell or a light emitting diode.

If the heterojunction structure of the present invention is used in a solar cell, the resulting solar cell is more economical than a conventional silicon pn junction solar cell and is superior in lightness and flexibility. Moreover, the solar cell employing the heterojunction structure compares favorably with the conventional solar cell in energy conversion efficiency. In addition, with the solar cell employing the heterojunction structure, an excellent photoelectric conversion efficiency can be achieved without employing a sensitizer in contradistinction from a titania-based solar cell.

With the manufacturing method of the present invention, respective constituent layers of the heterojunction structure can be formed without difficulties, while the fullerene polymer film can be identified reliably by combined use of the Raman and Nexafs methods. In addition, the evaluation of variable items, such as structures of the fullerene polymer films, polymerization degree, amorphization degree, oxidation or dielectric breakdown due to application of high voltages, can be executed reliably non-destructively, while the results of the evaluation can be utilized for controlling the conditions for fabricating the heterojunction structure and hence the physical properties of the heterojunction structure.

According to the present invention, the vapor-deposited film of fullerene molecules is first formed and subsequently polymerized by illumination of the electromagnetic waves, desired vapor-deposited films can be formed at all times by measuring the thickness of the vapor-deposited film by a film thickness meter and by controlling the conditions for vapor deposition, such as vapor-deposited temperature, with the result that the film thickness of the fullerene polymer film by illumination of the electromagnetic waves can be easily and accurately controlled to realize the desired film thickness.

Moreover, since the fullerene polymer film is polymerized by irradiation of the electromagnetic waves as the structure of the fullerene molecules is kept, so that a fullerene polymer film having a neat structure with the unimpaired fullerene molecule structure can be produced. In addition, even if an organic film is present on the underlying layer, there is no risk of the underlying layer being damaged by the vapor-deposited film formed thereon, while the underlying layer can be protected from illumination of the electromagnetic waves due to the presence of the vapor-deposited film.

What is claimed is:

1. A method for manufacturing a charge separation heterojunction structure comprising:

forming a vapor-depositing fullerene film;

polymerizing said fullerene film to form a polymerized fullerene film, using one of plasma polymerization, micro-wave polymerization, electrolytic polymerization, or polymerization on illumination of electron beam;

identifying the state of the polymerized fullerene film; and upon identifying the polymerized fullerene film, forming a light-transmitting electrode, an electrically conductive organic film, and a counter-electrode, wherein the light-transmitting electrode, the electrically conductive organic film, the polymerized fullerene film, and the counter-electrode are layered in this order on a substrate.

2. The method for manufacturing a charge separation heterojunction structure according to claim 1 further comprising interposing an active layer between the polymerized fullerene film and the electrically conductive organic film.

3. The method for manufacturing a charge separation heterojunction structure according to claim 1 wherein the electrically conductive organic film comprises a conjugated electron system.

4. The method for manufacturing a charge separation heterojunction structure according to claim 3, wherein said electrically conductive organic film is at least one high molecular film of high molecular materials selected from the group consisting of polyvinyl carbazole, poly(p-phenylene)-vinylene, polyaniline, polyethylene oxide, polyvinyl pyridine, polyvinyl alcohol, polythiophene, polyfluorene and polyparaphenylene, or a high molecular film obtained on polymerizing a derivative of at least one of monomer starting materials of the high molecular materials.

5. The method for manufacturing a charge separation heterojunction structure according to claim 1, wherein the electrically conductive organic film comprises a dopant for controlling electrical conductivity.

6. The method for manufacturing a charge separation heterojunction structure according to claim 1, wherein said polymerized fullerene film is formed of a $C_{60}$ polymer and/or a $C_{70}$ polymer.

7. The method for manufacturing a charge separation heterojunction structure according to claim 1, wherein said polymerized fullerene film is formed by photopolymerization, polymerization on illumination of electron beam, plasma polymerization, micro-wave polymerization or electrolytic polymerization of fullerene molecules.

8. The method for manufacturing a charge separation heterojunction structure according to claim 1 comprising:

vapor-depositing fullerene molecules to form a vapor-deposited film;

illuminating electromagnetic waves on said vapor-deposited film to polymerize said fullerene molecules to produce a polymerized fullerene film; and employing said polymerized fullerene film as a charge separation heterojunction structure.

9. The method for manufacturing a charge separation heterojunction structure according to claim 8, wherein a film thickness of a vapor-deposited film of said fullerene molecules is measured to control said film thickness to effect said vapor deposition to form a vapor-deposited film of a specified thickness, and wherein said electromagnetic waves are then illuminated to polymerize said vapor-deposited film.

10. The method for manufacturing a charge separation heterojunction structure according to claim 9, wherein said film thickness is measured by a film thickness meter arranged in a vacuum chamber.

11. The method for manufacturing a charge separation heterojunction structure according to claim 8, wherein an RF plasma, UV rays or an electron beam is illuminated as said electromagnetic waves.

12. The method for manufacturing a charge separation heterojunction structure according to claim 1, wherein said light-transmitting electrode and said counter-electrode are formed of metal oxides or metals.

13. The method for manufacturing a charge separation heterojunction structure according to claim 12, wherein said light-transmitting electrode is formed of a metal oxide obtained on doping an indium oxide with tin, or as a thin film of gold, silver, platinum or nickel, and wherein said counter-electrode is formed of said metal oxide, aluminum, magnesium or indium.

14. The method for manufacturing a charge separation heterojunction structure according to claim 1, wherein said polymerized fullerene film is identified by the Raman method and/or the Nexafs (Near-Edge X-ray Fine Structure) method.

15. A method for manufacturing a charge separation heterojunction structure comprising the steps of:

forming a polymerized fullerene film;

identifying the polymerized fullerene film; and upon identifying the polymerized fullerene film, forming a light-transmitting electrode, an electrically conductive organic film, and a counter-electrode, wherein the counter-electrode is in contact with the polymerized fullerene film, and wherein the light-transmitting electrode, the polymerized fullerene film, the electrically conductive organic film, and the counter-electrode are layered in this order on a substrate.

16. A method for manufacturing a charge separation heterojunction structure comprising:
- forming a light-transmitting electrode;
- forming an electrically conductive organic film;
- forming a polymerized fullerene film; and
- forming a counter electrode;
- wherein the light-transmitting electrode, the electrically conductive organic film, the polymerized fullerene film and the counter-electrode are layered in this order on a substrate.

17. The method for manufacturing a charge separation heterojunction structure according to claim 16, wherein after forming said polymerized fullerene film, identifying the polymerized fullerene film Raman method and/or the Nexafs (Neard-Edge X-ray Fine Structure) method.

18. A method for manufacturing a charge separation heterojunction structure comprising:
- forming a light-transmitting electrode;
- forming an electrically conductive organic film;
- forming a polymerized fullerene film; and
- forming a counter electrode;
- wherein the light-transmitting electrode, the polymerized fullerene film the electrically conductive organic film, and the counter-electrode are layered in this order on a substrate.

19. The method for manufacturing a charge separation heterojunction structure according to claim 18, wherein after forming said polymerized fullerene film, identifying the said polymerized fullerene film by the Raman method and/or the Nexafs (Near-Edge X-ray Fine Structure) method.

20. A method for manufacturing a charge separation heterojunction structure comprising:
- forming a vapor-depositing fullerene film;
- polymerizing said fullerene film to form a polymerized fullerene film, using one of plasma polymerization, micro-wave polymerization, electrolytic polymerization, or polymerization on illumination of electron beam; and
- forming a light-transmitting electrode, an electrically conductive organic film, and a counter-electrode,
- wherein the light-transmitting electrode, the electrically conductive organic film, the polymerized fullerene film, and the counter-electrode are layered in this order on a substrate.

* * * * *

UNITED STATES PATENT AND TRADEMARK OFFICE
CERTIFICATE OF CORRECTION

PATENT NO. : 6,998,285 B2
APPLICATION NO. : 10/439359
DATED : February 14, 2006
INVENTOR(S) : Matthias Ramm and Masaumi Ata It is certified that error appears in the above-identified patent and that said Letters Patent is hereby corrected as shown below:

ON THE TITLE PAGE

Item [73]
(73) Assignee: Sony Corporation, Tokyo (JP) should be

Please Insert:
 --Sony Corporation, Tokyo (JP) and Research Institute of Innovative Technology for the Earth, Kyoto (JP)--

Signed and Sealed this

Twenty-sixth Day of December, 2006

JON W. DUDAS
*Director of the United States Patent and Trademark Office*